United States Patent
Isobe et al.

(10) Patent No.: US 8,426,231 B2
(45) Date of Patent: Apr. 23, 2013

(54) METHOD FOR MANUFACTURING SEMICONDUCTOR DEVICE INCLUDING A PHOTOELECTRIC CONVERSION ELEMENT

(75) Inventors: Atsuo Isobe, Kanagawa (JP); Noriko Harima, Kanagawa (JP); Noriko Matsumoto, Kanagawa (JP); Akihisa Shimomura, Kanagawa (JP); Kosei Noda, Kanagawa (JP); Kazuko Yamawaki, Kanagawa (JP); Yoshiyuki Kurokawa, Kanagawa (JP); Takayuki Ikeda, Kanagawa (JP); Takashi Hamada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 158 days.

(21) Appl. No.: 12/857,820

(22) Filed: Aug. 17, 2010

(65) Prior Publication Data

US 2011/0049588 A1 Mar. 3, 2011

(30) Foreign Application Priority Data

Aug. 25, 2009 (JP) ................................. 2009-194223

(51) Int. Cl.
*H01L 31/18* (2006.01)
(52) U.S. Cl.
USPC ..................................... 438/48; 257/E21.598
(58) Field of Classification Search ............ 257/59, 257/72, 290, 292, E21.598; 438/48, 128, 438/458, 162, 70
See application file for complete search history.

(56) References Cited

U.S. PATENT DOCUMENTS

| | | | |
|---|---|---|---|
| 6,110,845 A | 8/2000 | Seguchi et al. | |
| 6,243,155 B1 | 6/2001 | Zhang et al. | |
| 6,534,380 B1 | 3/2003 | Yamauchi et al. | |
| 6,927,148 B2 | 8/2005 | Ito | |
| 6,977,394 B2 | 12/2005 | Yamazaki et al. | |
| 7,405,132 B2 * | 7/2008 | Arao et al. | 438/393 |
| 7,537,979 B2 * | 5/2009 | Isobe et al. | 438/151 |

(Continued)

FOREIGN PATENT DOCUMENTS

| | | |
|---|---|---|
| JP | 10-79522 | 3/1998 |
| JP | 11-340496 | 12/1999 |
| WO | WO 2009/014155 A1 | 1/2009 |

OTHER PUBLICATIONS

International Search Report re application No. PCT/JP2010/063436, dated Nov. 16, 2010.

(Continued)

*Primary Examiner* — Nathan Ha
(74) *Attorney, Agent, or Firm* — Husch Blackwell LLP

(57) ABSTRACT

An object of an embodiment of the disclosed invention is to provide a semiconductor device including a photoelectric conversion element with excellent characteristics. An object of an embodiment of the disclosed invention is to provide a semiconductor device including a photoelectric conversion device with excellent characteristic through a simple process. A semiconductor device is provided, which includes a light-transmitting substrate; an insulating layer over the light-transmitting substrate; and a photoelectric conversion element over the insulating layer. The photoelectric conversion element includes a single crystal semiconductor layer including a semiconductor region having an effect of photoelectric conversion, a semiconductor region having a first conductivity type, and a semiconductor region having a second conductivity type; a first electrode electrically connected to the semiconductor region having the first conductivity type; and a second electrode electrically connected to the semiconductor region having the second conductivity type.

8 Claims, 28 Drawing Sheets

U.S. PATENT DOCUMENTS

| | | | |
|---|---|---|---|
| 7,863,660 | B2 | 1/2011 | Katoh |
| 7,867,873 | B2 * | 1/2011 | Murakami et al. ............ 438/455 |
| 2001/0000676 | A1 | 5/2001 | Zhang et al. |
| 2003/0025136 | A1 | 2/2003 | Zhang et al. |
| 2004/0038465 | A1 * | 2/2004 | Shimomura et al. .......... 438/166 |
| 2005/0202609 | A1 | 9/2005 | Zhang et al. |
| 2006/0025212 | A1 | 2/2006 | Griswold et al. |
| 2006/0203139 | A1 | 9/2006 | Zhang et al. |
| 2006/0267508 | A1 | 11/2006 | Sun |
| 2007/0109286 | A1 | 5/2007 | Nakamura et al. |
| 2007/0141803 | A1 | 6/2007 | Boussagol et al. |
| 2007/0238312 | A1 | 10/2007 | Murakami et al. |
| 2008/0006828 | A1 | 1/2008 | Zhang et al. |
| 2008/0246109 | A1 | 10/2008 | Ohnuma et al. |
| 2008/0261376 | A1 | 10/2008 | Yamazaki et al. |
| 2008/0283916 | A1 | 11/2008 | Yamazaki |
| 2009/0004822 | A1 * | 1/2009 | Murakami et al. ............ 438/458 |
| 2009/0014799 | A1 * | 1/2009 | Isobe ............................ 257/351 |
| 2009/0027372 | A1 | 1/2009 | Shishido et al. |
| 2009/0078970 | A1 * | 3/2009 | Yamazaki et al. ............. 257/255 |
| 2009/0079000 | A1 * | 3/2009 | Yamazaki et al. ............. 257/351 |
| 2009/0111236 | A1 | 4/2009 | Kakehata et al. |
| 2009/0207332 | A1 | 8/2009 | Zhang et al. |
| 2010/0007632 | A1 | 1/2010 | Yamazaki |

OTHER PUBLICATIONS

Written Opinion re application No. PCT/JP2010/063436, dated Nov. 16, 2010.

* cited by examiner plan view sectional view

FIG. 2A
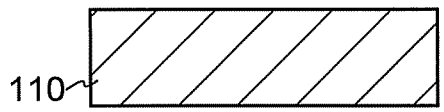
FIG. 2B
FIG. 2C
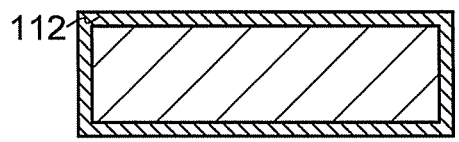
FIG. 2D
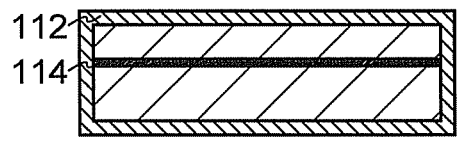
FIG. 2E
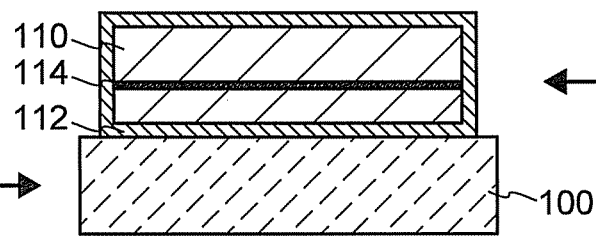
FIG. 2F
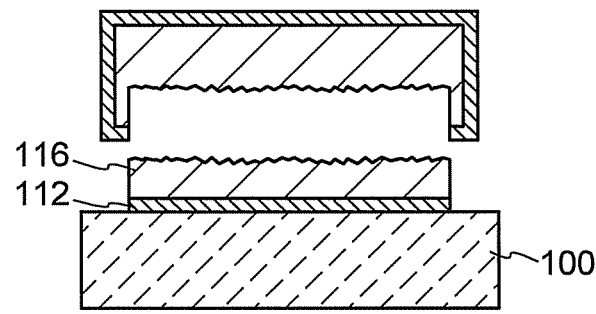

plan view sectional view plan view sectional view plan view sectional view plan view sectional view

METHOD FOR MANUFACTURING SEMICONDUCTOR DEVICE INCLUDING A PHOTOELECTRIC CONVERSION ELEMENT

TECHNICAL FIELD

The present invention relates to a semiconductor device including an SOI (silicon on insulator) substrate and a manufacturing method of the semiconductor device.

BACKGROUND ART

When a photoelectric conversion element (for example, an optical sensor) is formed over a glass substrate, polycrystalline silicon is used for a semiconductor layer having an effect of photoelectric conversion in some cases (for example, see Patent Document 1). Polycrystalline silicon has an advantage that it is easily formed over a substrate with low heat resistance such as a glass substrate since it can be formed through a process at a low temperature.

REFERENCE

Patent Document

[Patent Document 1] Japanese Published Patent Application No. H10-79522

DISCLOSURE OF INVENTION

However, the amount of dark current tends to be larger in the case of polycrystalline silicon as compared to the case of single crystal silicon. In addition, there is a problem in that carriers are trapped due to defects and that current at the time of light irradiation is reduced. Therefore, it is difficult to manufacture a photoelectric conversion element having sufficient photosensitivity in the case of using polycrystalline silicon.

In view of the above problems, an object of an embodiment of the disclosed invention is to provide a semiconductor device including a photoelectric conversion element with excellent characteristics. An object of an embodiment of the disclosed invention is to provide a semiconductor device including a photoelectric conversion device with excellent characteristic through a simple process.

In an embodiment of the disclosed invention, a photoelectric conversion element is formed using a single crystal semiconductor layer over a light-transmitting substrate. Details thereof will be described below.

An embodiment of the disclosed invention is a semiconductor device which includes a light-transmitting substrate; an insulating layer over the light-transmitting substrate; and a photoelectric conversion element over the insulating layer. The photoelectric conversion element includes a single crystal semiconductor layer including a semiconductor region having an effect of photoelectric conversion, a semiconductor region having a first conductivity type, and a semiconductor region having a second conductivity type; a first electrode electrically connected to the semiconductor region having the first conductivity type; and a second electrode electrically connected to the semiconductor region having the second conductivity type. In the above structure, a transistor can be provided over the insulating layer in addition to the photoelectric conversion element.

Another embodiment of the present invention disclosed is a method for manufacturing a semiconductor device, which includes the steps of forming a photoelectric conversion element. The photoelectric conversion element is formed by a method including the steps of irradiating a single crystal semiconductor substrate with an ion to form an embrittled region in the single crystal semiconductor substrate; bonding together the single crystal semiconductor substrate and a light-transmitting substrate with an insulating layer therebetween; separating the single crystal semiconductor substrate at the embrittled region to form a single crystal semiconductor layer over the light-transmitting substrate; processing the single crystal semiconductor layer to form an island-shaped semiconductor layer; selectively adding a first impurity element and a second impurity element to the island-shaped semiconductor layer to form a semiconductor region having an effect of photoelectric conversion, a semiconductor region having a first conductivity type, and a semiconductor region having a second conductivity type; forming a first electrode electrically connected to the semiconductor region having the first conductivity type; and forming a second electrode electrically connected to the semiconductor region having the second conductivity type. In the above method, a transistor can be formed over the insulating layer in addition to the photoelectric conversion element.

Another embodiment of the disclosed invention is a semiconductor device which includes a light-transmitting substrate; a first insulating layer over the light-transmitting substrate; a light-blocking layer selectively formed over the first insulating layer; a second insulating layer over the light-blocking layer; and a photoelectric conversion element over the second insulating layer. The photoelectric conversion element includes a single crystal semiconductor layer including a semiconductor region having an effect of photoelectric conversion, a semiconductor region having a first conductivity type, and a semiconductor region having a second conductivity type; a first electrode electrically connected to the semiconductor region having the first conductivity type; and a second electrode electrically connected to the semiconductor region having the second conductivity type. In the above structure, a transistor can be provided over the second insulating layer in addition to the photoelectric conversion element.

Another embodiment of the disclosed invention is a method for manufacturing a semiconductor device, including the steps of forming a photoelectric conversion element. The photoelectric conversion element is formed by a method including the steps of irradiating a single crystal semiconductor substrate with an ion to form an embrittled region in the single crystal semiconductor substrate; forming a first insulating layer over the light-transmitting substrate and forming a light-blocking layer over the first insulating layer; bonding together the single crystal semiconductor substrate and the light-transmitting substrate in which the light-blocking layer is formed with the second insulating layer therebetween; separating the single crystal semiconductor substrate at the embrittled region to form a single crystal semiconductor layer over the light-transmitting substrate; processing the single crystal semiconductor layer to form an island-shaped semiconductor layer; selectively adding a first impurity element and a second impurity element to the island-shaped semiconductor layer to form a semiconductor region having an effect of photoelectric conversion, a semiconductor region having a first conductivity type, and a semiconductor region having a second conductivity type; forming a first electrode electrically connected to the semiconductor region having the first conductivity type; and forming a second electrode electrically connected to the semiconductor region having the second conductivity type. In the above method, a transistor can be formed over the second insulating layer in addition to the photoelectric conversion element.

Another embodiment of the disclosed invention is a method for manufacturing a semiconductor device, including the steps of forming a photoelectric conversion element and a transistor. The photoelectric conversion element and the transistor are formed by a method including the steps of irradiating a single crystal semiconductor substrate with an ion to form an embrittled region in the single crystal semiconductor substrate; forming a first insulating layer over the light-transmitting substrate and forming a light-blocking layer over the first insulating layer; bonding together the single crystal semiconductor substrate and the light-transmitting substrate in which the light-blocking layer is formed with the second insulating layer therebetween; separating the single crystal semiconductor substrate at the embrittled region to form a single crystal semiconductor layer over the light-transmitting substrate; processing the single crystal semiconductor layer to form a first island-shaped semiconductor layer and a second island-shaped semiconductor layer; selectively adding a first impurity element and a second impurity element to the first island-shaped semiconductor layer to form a semiconductor region having an effect of photoelectric conversion, a semiconductor region having a first conductivity type, and a semiconductor region having a second conductivity type; forming a first electrode electrically connected to the semiconductor region having the first conductivity type; forming a second electrode electrically connected to the semiconductor region having the second conductivity type, so that the photoelectric conversion element is formed; selectively adding the first impurity element or the second impurity element to the second island-shaped semiconductor layer to form a channel formation region, a source region, and a drain region; forming a gate insulating film over the second island-shaped semiconductor layer; forming a gate electrode over the gate insulating film; and forming a source electrode electrically connected to the source region and a drain electrode electrically connected to the drain region, so that the transistor is formed.

Another embodiment of the disclosed invention is a method for manufacturing a semiconductor device, including the steps of forming a photoelectric conversion element and a transistor. The photoelectric conversion element the transistor are formed by a method including the steps of irradiating a single crystal semiconductor substrate with an ion to form an embrittled region in the single crystal semiconductor substrate; forming a first insulating layer over the light-transmitting substrate and forming a light-blocking layer over the first insulating layer; processing the light-blocking layer to form a plurality of island-shaped light-blocking layers including a first island-shaped light-blocking layer and a second island-shaped light-blocking layer; forming a second insulating layer having flatness to cover the plurality of island-shaped light-blocking layers; bonding together the single crystal semiconductor substrate and the light-transmitting substrate in which the second insulating layer is formed with a third insulating layer therebetween; separating the single crystal semiconductor substrate at the embrittled region to form island-shaped semiconductor layers which overlap with the plurality of island-shaped light-blocking layers over the light-transmitting substrate; selectively adding a first impurity element and a second impurity element to the island-shaped semiconductor layer overlapping with the first island-shaped light-blocking layer to form a semiconductor region having an effect of photoelectric conversion, a semiconductor region having a first conductivity type, and a semiconductor region having a second conductivity type; forming a first electrode electrically connected to the semiconductor region having the first conductivity type; forming a second electrode electrically connected to the semiconductor region having the second conductivity type, so that the photoelectric conversion element is formed; selectively adding the first impurity element or the second impurity element to the island-shaped semiconductor layer overlapping with the second island-shaped light-blocking layer to form a channel formation region, a source region, and a drain region; forming a gate insulating film over the island-shaped semiconductor layer overlapping with the second island-shaped light-blocking layer; forming a gate electrode over the gate insulating film; and forming a source electrode electrically connected to the source region and forming a drain electrode electrically connected to the drain region, so that the transistor is formed.

Another embodiment of the disclosed invention is a semiconductor device which includes a light-transmitting substrate, an insulating layer over the light-transmitting substrate, and a photoelectric conversion element and a transistor over the insulating layer. The photoelectric conversion element includes a first single crystal semiconductor layer including a semiconductor region having an effect of photoelectric conversion, a semiconductor region having a first conductivity type, and a semiconductor region having a second conductivity type; a first electrode electrically connected to the semiconductor region having the first conductivity type; and a second electrode electrically connected to the semiconductor region having the second conductivity type. The transistor includes a second single crystal semiconductor layer including a channel formation region, a source region, and a drain region; a gate insulating film over the second single crystal semiconductor layer; a gate electrode over the gate insulating film; a source electrode electrically connected to the source region; and a drain electrode electrically connected to the drain region. The first single crystal semiconductor layer and the second single crystal semiconductor layer are formed over the insulating layer. The thickness of the first single crystal semiconductor layer is larger than the thickness of the second single crystal semiconductor layer.

Another embodiment of the present invention disclosed is a method for manufacturing a semiconductor device, including the steps of: forming a photoelectric conversion element and a transistor. The photoelectric conversion element the transistor are formed by a method including the steps of irradiating a single crystal semiconductor substrate with an ion to form an embrittled region in the single crystal semiconductor substrate; bonding together the single crystal semiconductor substrate and a light-transmitting substrate with an insulating layer therebetween; separating the single crystal semiconductor substrate at the embrittled region to form a single crystal semiconductor layer over the light-transmitting substrate; thinning part of the single crystal semiconductor layer to form a first single crystal semiconductor region and a second single crystal semiconductor region having a smaller thickness than the first single crystal semiconductor region; processing the first single crystal semiconductor region to form a first island-shaped semiconductor layer; processing the second single crystal semiconductor region to form a second island-shaped semiconductor layer; selectively adding a first impurity element and a second impurity element to the first island-shaped semiconductor layer to form a semiconductor region having an effect of photoelectric conversion, a semiconductor region having a first conductivity type, and a semiconductor region having a second conductivity type; forming a first electrode electrically connected to the semiconductor region having the first conductivity type; forming a second electrode electrically connected to the semiconductor region having the second conductivity type, so that the photoelectric conversion element is formed; selectively adding the first impurity element and the second impurity element to the second island-shaped semiconductor layer to form a channel formation region, a source region, and a drain region; forming a gate insulating film over the second island-shaped semiconductor layer; forming a gate electrode over the gate insulating film; and forming a source electrode electrically connected to the source region and forming a drain electrode electrically connected to the drain region, so that the transistor is formed.

Another embodiment of the disclosed invention is a method for manufacturing a semiconductor device, including the steps of forming a photoelectric conversion element and a transistor. The photoelectric conversion element the transistor are formed by a method including the steps of irradiating a single crystal semiconductor substrate with an ion to form an embrittled region in the single crystal semiconductor substrate; bonding together the single crystal semiconductor substrate and a light-transmitting substrate with an insulating layer therebetween; separating the single crystal semiconductor substrate at the embrittled region to form a single crystal semiconductor layer over the light-transmitting substrate; thickening part of the single crystal semiconductor layer to form a first single crystal semiconductor region and a second single crystal semiconductor region having a smaller thickness than the first single crystal semiconductor region; processing the first single crystal semiconductor region to form a first island-shaped semiconductor layer; processing the second single crystal semiconductor region to form a second island-shaped semiconductor layer; selectively adding a first impurity element and a second impurity element to the first island-shaped semiconductor layer to form a semiconductor region having an effect of photoelectric conversion, a semiconductor region having a first conductivity type, and a semiconductor region having a second conductivity type; and forming a first electrode electrically connected to the semiconductor region having the first conductivity type and forming a second electrode electrically connected to the semiconductor region having the second conductivity type, so that the photoelectric conversion element is formed; selectively adding the first impurity element and the second impurity element to the second island-shaped semiconductor layer to form a channel formation region, a source region, and a drain region; forming a gate insulating film over the second island-shaped semiconductor layer; forming a gate electrode over the gate insulating film; and forming a source electrode electrically connected to the source region and forming a drain electrode electrically connected to the drain region, so that the transistor is formed.

In general, the term "SOI substrate" means a semiconductor substrate in which a silicon semiconductor layer is provided over an insulating surface. In this specification and the like, the term "SOI substrate" also includes a semiconductor substrate in which a semiconductor layer formed using a material other than silicon is provided over an insulating surface in its category. That is, a semiconductor layer included in the "SOI substrate" is not limited to a silicon semiconductor layer. In addition, in this specification and the like, a semiconductor substrate means not only a substrate formed using only a semiconductor material but also all substrates including a semiconductor material. Namely, in this specification and the like, the "SOI substrate" is also included in the category of a semiconductor substrate.

Note that in this specification and the like, the term "single crystal" means a crystal in which, when a certain crystal axis is focused, the direction of the crystal axis is oriented in a similar direction in any portion of a sample. That is, the single crystal includes a crystal in which the direction of crystal axes is uniform as described above even when it includes a crystal defect or a dangling bond.

Further, in this specification and the like, the term "semiconductor device" means all devices which can operate by utilizing semiconductor characteristics. For example, a display device and an integrated circuit are included in the category of the semiconductor device. Furthermore, in this specification and the like, the display device includes a light emitting display device, a liquid crystal display device, and a display device including an electrophoretic element. A light emitting device includes a light emitting element, and a liquid crystal display device includes a liquid crystal element. A light emitting element includes, in its scope, an element whose luminance is controlled by a current or a voltage, and specifically includes an inorganic electroluminescent (EL) element, an organic EL element, and the like.

In an embodiment of the disclosed invention, a photoelectric conversion element is formed using a single crystal semiconductor layer over a light-transmitting substrate. Therefore, a semiconductor device in which a photoelectric conversion element with high photosensitivity is provided over a light-transmitting substrate can be provided.

In an embodiment of the disclosed invention, a photoelectric conversion element is formed using a single layer of a single crystal semiconductor. Therefore, the manufacturing steps of a semiconductor device can be simplified as compared to the case where a photoelectric conversion element is formed with a stacked-layer structure of semiconductor layers.

BRIEF DESCRIPTION OF DRAWINGS

FIGS. 2A to 2F are cross-sectional views illustrating an example of a method for manufacturing an SOI substrate used for a semiconductor device;

BEST MODE FOR CARRYING OUT THE INVENTION

Figure 1A:
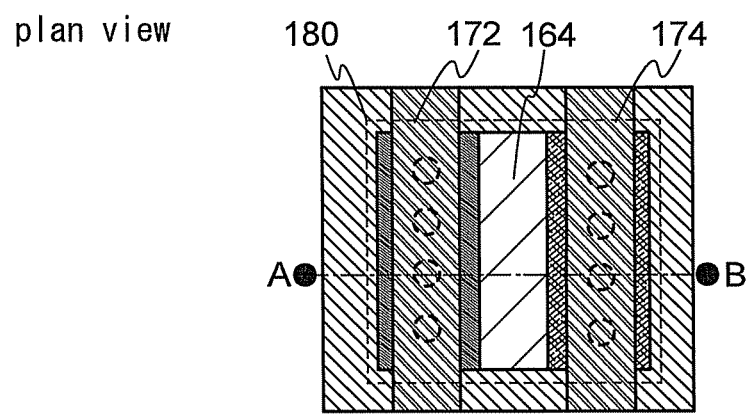
FIG. 1A is a plan view and FIG. 1B is a cross-sectional view illustrating an example of a semiconductor device.

Hereinafter, Embodiments are described in detail using the drawings. Note that the present invention is not limited to the description of the embodiments, and it is apparent to those skilled in the art that modes and details can be modified in various ways without departing from the spirit of the disclosed invention in this specification and the like. A structure of the different embodiment can be implemented by combination appropriately. On the description of the invention with reference to the drawings, a reference numeral indicating the same part is used in common throughout different drawings, and the repeated description is omitted.

Embodiment 1

In this embodiment, examples of a semiconductor device and a manufacturing method thereof will be described with reference to drawings. In particular, a semiconductor device provided with a photoelectric conversion element and a manufacturing method thereof will be described.
[Structure]

Figure 1B:
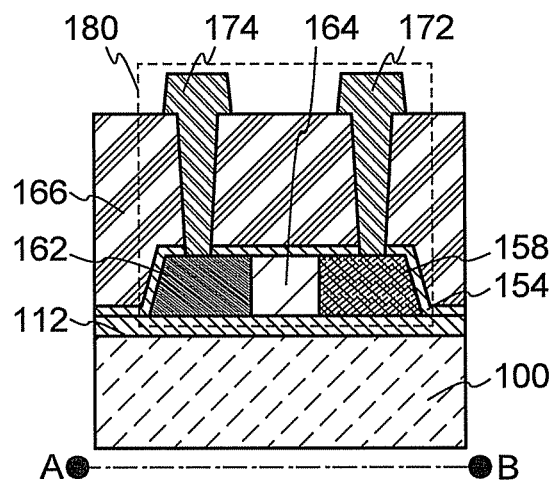

A photoelectric conversion element 180 relating to an embodiment of the disclosed invention is provided over a light-transmitting base substrate 100 (see FIGS. 1A and 1B). Here, FIG. 1B corresponds to a cross section taken along line A-B of FIG. 1A.

The photoelectric conversion element 180 includes an island-shaped single crystal semiconductor layer including a semiconductor region 164 having an effect of photoelectric conversion, a semiconductor region 158 having a first conductivity type (p-type conductivity, here), and a semiconductor region 162 having a second conductivity type (n-type conductivity, here); an insulating layer 154 and an insulating layer 166 which are formed so as to cover the island-shaped single crystal semiconductor layer; a first electrode 172 electrically connected to the semiconductor region 158 having the first conductivity type; and a second electrode 174 electrically connected to the semiconductor region 162 having the second conductivity type. Here, the semiconductor region 158 having the first conductivity type and the semiconductor region 162 having the second conductivity type are adjacent to the semiconductor region 164 having an effect of photoelectric conversion and separated to each other by the semiconductor region 164 having an effect of photoelectric conversion. Note that the first conductivity type and the second conductivity type can be interchangeable with each other.

In addition, an insulating layer 112 is provided between the base substrate 100 and the photoelectric conversion element 180. The insulating layer 112 has a function of fixing the photoelectric conversion element 180 to the base substrate 100.

The operation of the photoelectric conversion element 180 is as follows. In the photoelectric conversion element 180, when light enter the semiconductor region 164 having an effect of photoelectric conversion, electrons and holes are generated in the semiconductor region. In the case where voltage is not applied from the outside to a region between the semiconductor region 158 having the first conductivity type and the semiconductor region 162 having the second conductivity type (in the case of non-bias), the electrons generated flow in a direction toward an n-type semiconductor region because of the influence of a self-aligned electric field. In a similar manner, the holes generated flow in a direction toward a p-type semiconductor region. In the case where voltage is applied from the outside (for example, in the case where reverse bias is applied), electrons and holes flow because of the influence of a self-aligned electric field and the voltage from the outside.

An optical sensor can be formed by utilizing the dependence of the resulting current upon the intensity of light. In addition, an electric generating system can be obtained by extracting electromotive force due to light to the outside of the photoelectric conversion element.

Here, the crystallinity of the island-shaped semiconductor layer included in the photoelectric conversion element is preferably a single crystal. In particular, the crystallinity of the semiconductor region 164 having an effect of photoelectric conversion is a single crystal. As a semiconductor material of the single crystal, for example, single crystal silicon can be used. When a single crystal semiconductor is used in a photoelectric conversion element, the amount of dark current (current when light irradiation is not performed) can be reduced as compared to the case of using an amorphous semiconductor or a polycrystalline semiconductor. Further, when a single crystal semiconductor is used in a photoelectric conversion element, the amount of current when light irradiation is performed can be increased as compared to the case of using a polycrystalline semiconductor. Accordingly, sensitivity as an optical sensor is improved. In addition, with the use of a single crystal semiconductor, photoelectric conversion efficiency is improved. These effects can be obtained since a trap of photogenerated carriers due to defects and the like can be sufficiently suppressed.

In addition, as illustrated here, because of a light-transmitting property of the base substrate, a structure in which light from an object (reflection light from the object, or the like) enters from the base substrate side (a structure in which light is detected from the base substrate side) can be employed. In this case, the degree of freedom of element layout is improved as compared to the case where light of the object enters from an electrode (or a wiring) side. In this manner, when the base substrate has a light-transmitting property, there is an advantage that integration can be performed easily as compared to the case where a base substrate which does not have a light-transmitting property.

[Manufacturing Steps]

Next, manufacturing steps of the photoelectric conversion element are described. First, manufacturing steps of an SOI substrate which can be used for manufacturing the photoelectric conversion element are described with reference to FIGS. 2A to 2F and FIGS. 3A to 3C. Then, manufacturing steps of the photoelectric conversion element in which the SOI substrate is used are described with reference to FIG. 4A to 4H.

[Manufacturing Steps of the SOI Substrate: Processing of the Base Substrate]

First, the light-transmitting base substrate 100 is prepared (see FIG. 2A).

As the light-transmitting base substrate 100, a substrate formed of an insulator can be used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Note that when the glass substrate contains a larger amount of barium oxide than boric acid, more-practical heat-resistant glass can be obtained. Therefore, in the case where a glass substrate needs to have heat resistance, it is preferable to use a glass substrate containing barium oxide and boric acid so that the amount of barium oxide is larger than that of boric acid. Note that in this embodiment, a description is given of the case where a glass substrate is used as the base substrate 100. When a glass substrate which can have a larger size and is inexpensive is used as the base substrate 100, cost reduction can be achieved.

A surface of the base substrate 100 is preferably cleaned in advance. Specifically, ultrasonic cleaning is performed on the base substrate 100 by using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. Through such cleaning treatment, for example, the surface flatness of the base substrate 100 can be improved and abrasive particles left on the surface of the base substrate 100 can be removed.

Note that an insulating layer containing nitrogen (for example, an insulating layer containing silicon nitride ($SiN_x$), silicon nitride oxide ($SiN_xO_y$) (x>y), or the like) may be formed over the surface of the base substrate 100. In this manner, when the insulating layer containing nitrogen is formed, diffusion of an impurity element such as sodium (Na) contained in the base substrate into the semiconductor can be suppressed.

Note that in this specification and the like, an oxynitride refers to a substance that contains more oxygen (atoms) than nitrogen (atoms). For example, a silicon oxynitride is a substance containing oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, the term nitride oxide means a substance in which the nitrogen content (atoms) exceeds the oxygen content (atoms). For example, silicon nitride oxide is a substance containing oxygen, nitrogen, silicon, and hydrogen at concentrations ranging from 5 to 30 at. %, 20 to 55 at. %, 25 to 35 at. %, and 10 to 30 at. %, respectively. Note that the above ranges are ranges in the case where measurement is performed using Rutherford backscattering spectrometry (RBS) or hydrogen forward scattering spectrometry (HFS). Moreover, the total for the content ratio of the constituent elements is maximum at 100 at. %.

[Manufacturing Steps of the SOI Substrate: Processing of a Single Crystal Semiconductor Substrate]

Next, a single crystal semiconductor substrate 110 is prepared as a bonding substrate (see FIG. 2B). Note that in this embodiment, after the base substrate 100 is processed, the single crystal semiconductor substrate 110 is processed as a bonding substrate; however, an embodiment of the disclosed invention is not construed as being limited thereto. Processing of the single crystal semiconductor substrate may be performed before processing of the base substrate. Alternatively, the base substrate and the bonding substrate may be processed concurrently.

As the single crystal semiconductor substrate 110, a single crystal semiconductor substrate formed with an element belonging to Group 14 of the periodic table, such as a single crystal silicon substrate, a single crystal germanium substrate, or a single crystal silicon germanium substrate, can be used. Alternatively, a single crystal semiconductor substrate of a compound such as a gallium arsenide substrate, an indium phosphide substrate, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 110 is not limited to circular, and the single crystal semiconductor substrate 110 may be a substrate which has been processed into, for example, a rectangular shape or the like. Alternatively, the single crystal semiconductor substrate 110 can be manufactured using a CZ method or a floating zone (FZ) method.

Note that in this embodiment, the case of using a single crystal silicon substrate for an integrated circuit as a bonding substrate is described; however, an embodiment of the invention disclosed is not construed as being limited to this structure. For example, a solar-grade single crystal silicon substrate may be used. Alternatively, a polycrystalline semiconductor substrate including a polycrystalline silicon substrate can be used. Note that, in considering characteristics of the photoelectric conversion element to be formed, it is preferable that a single crystal semiconductor substrate be used.

The insulating layer 112 is formed on a surface of the single crystal semiconductor substrate 110 (see FIG. 2C). In view of removal of contamination, it is preferable that the surface of the single crystal substrate 110 be cleaned with a sulfuric acid/hydrogen peroxide mixture (SPM), an ammonium hydrogen peroxide mixture (APM), a hydrochloric acid/hydrogen peroxide mixture (HPM), diluted hydrofluoric acid (DHF), FPM (a mixed solution of hydrofluoric acid, hydrogen peroxide, and pure water), or the like before formation of the insulating layer 112. Alternatively, dilute hydrofluoric acid and ozone water may be discharged alternately for cleaning.

The insulating layer 112 can be formed with a single layer of a silicon oxide film, a silicon oxynitride film, or the like, or a stacked layer of these films. A thermal oxidation method, a CVD method, a sputtering method, or the like can be employed to manufacture the insulating layer 112. When the insulating layer 112 is formed by a CVD method, a silicon oxide film is preferably formed using organosilane such as tetraethoxysilane (abbreviation: TEOS, chemical formula: $Si(OC_2H_5)_4$).

In this embodiment, by subjecting the single crystal semiconductor substrate 110 to thermal oxidation treatment, the insulating layer 112 (here, a silicon oxide film) is formed.

The thermal oxidation treatment is preferably performed in an oxidation atmosphere to which a halogen is added. For example, the single crystal semiconductor substrate 110 is subjected to the thermal oxidation treatment in an oxidation atmosphere to which chlorine (Cl) is added, whereby the insulating layer 112 is formed through chlorine oxidation. In this case, the insulating layer 112 is an insulating layer containing chlorine atoms.

The chlorine atoms contained in the insulating layer 112 form distortion in the insulating layer 112. As a result, the water absorptance of the insulating layer 112 is increased, and the water diffusion rate is increased. In other words, when water exists at a surface of the insulating layer 112, the water existing at the surface can be quickly absorbed into the insulating layer 112 and diffused thereto. Accordingly, defective bonding caused by water can be suppressed.

Further, with the chlorine atoms contained in the insulating layer 112, heavy metal (such as Fe, Cr, Ni, or Mo) that is an extrinsic impurity can be captured, so that contamination of the single crystal semiconductor substrate 110 can be prevented. Moreover, after the bonding to the base substrate 100, impurities from the base substrate 100, such as sodium (Na), can be fixed, so that contamination of the single crystal semiconductor substrate 110 can be prevented.

Note that the halogen atoms contained in the insulating layer 112 are not limited to chlorine atoms. Fluorine atoms may be contained in the insulating layer 112. For example, a method by which the surface of the single crystal semiconductor substrate 110 is oxidized with fluorine can be used. As examples of fluorine oxidation, a method in which the single crystal semiconductor substrate 110 is soaked in an HF solution and then thermal oxidation treatment is performed in an oxidizing atmosphere, a method in which $NF_3$ is added to an oxidizing atmosphere to perform thermal oxidation treatment, and the like are given.

Next, ions accelerated by an electrical field are added to the single crystal semiconductor substrate 110, whereby an embrittled region 114 in which a crystal structure is damaged is formed at a predetermined depth in the single crystal semiconductor substrate 110 (see FIG. 2D). Note that the surface of the single crystal semiconductor substrate 110 and the surface of the insulating layer 112 are preferably cleaned before the treatment for addition of ions.

The depth at which the embrittled region 114 is formed can be adjusted by the kinetic energy, mass, charge, or incidence angle of the ions, or the like. The embrittled region 114 is formed at approximately the same depth as the average penetration depth of the ions. Therefore, the thickness of a single crystal semiconductor layer to be separated from the single crystal semiconductor substrate 110 can be adjusted with the depth at which the ions are added. For example, the average penetration depth may be adjusted so that the thickness of the single crystal semiconductor layer is approximately 10 nm to 1 μm. Note that characteristics of a photoelectrical conversion device tend to be drastically improved when the thickness of the single crystal semiconductor layer is larger than or equal to a predetermined thickness. Therefore, for example, it is preferable that the single crystal semiconductor layer be formed to a thickness of 100 nm or more.

The above ion irradiation treatment can be performed with an ion-doping apparatus or an ion-implantation apparatus. As a typical example of the ion-doping apparatus, there is a non-mass-separation-type apparatus in which plasma excitation of a process gas is performed and an object to be processed is irradiated with all kinds of ion species generated. In this apparatus, the object to be processed is irradiated with ion species of plasma without mass separation. In contrast, an ion-implantation apparatus is a mass-separation apparatus. In the ion-implantation apparatus, mass separation of ion species of plasma is performed and the object to be processed is irradiated with ion species having predetermined masses.

In this embodiment, an example is described in which an ion-doping apparatus is used to add hydrogen to the single crystal semiconductor substrate 110. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, the ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation of hydrogen and helium in separate steps, and increase in surface roughness of a single crystal semiconductor layer to be formed later can be suppressed.

Note that heavy metal may also be added when the embrittled region 114 is formed using the ion-doping apparatus; however, the ion irradiation is performed through the insulating layer 112 containing halogen atoms, whereby contamination of the single crystal semiconductor substrate 110 due to the heavy metal can be prevented.

[Manufacturing Steps of the SOI Substrate: Bonding of the Substrates]

Next, the surface of the base substrate 100 and the surface of the single crystal semiconductor substrate 110 are disposed to face each other and the surface of the base substrate 100 and the surface of the insulating layer 112 are disposed in close contact with each other. Thus, the base substrate 100 and the single crystal semiconductor substrate 110 can be bonded together (see FIG. 2E).

When bonding is performed, it is preferable that a pressure of 0.001 $N/cm^2$ to 100 $N/cm^2$ inclusive be applied to part of the base substrate 100 or part of the single crystal semiconductor substrate 110. In particular, it is preferable that a pressure of 1 $N/cm^2$ to 20 $N/cm^2$ inclusive be applied thereto. A bonding between the base substrate 100 and the insulating layer 112 is generated at the portion to which the pressure is applied and spontaneous bonding proceeds throughout the entire surface from the portion. This bonding is performed under the action of the Van der Waals force or hydrogen bonding and can be performed at room temperature.

Note that before the single crystal semiconductor substrate 110 and the base substrate 100 are bonded together, surfaces to be bonded together are preferably subjected to surface treatment. By the surface treatment, bonding strength at an interface between the surfaces to be bonded together can be improved.

As the surface treatment, wet treatment, dry treatment, or a combination of wet treatment and dry treatment can be used. Alternatively, wet treatment may be used in combination with different wet treatment or dry treatment may be used in combination with different dry treatment.

As examples of the wet treatment, ozone treatment using ozone water (ozone water cleaning), megasonic cleaning, two-fluid cleaning (method in which functional water such as pure water or hydrogenated water and a carrier gas such as nitrogen are sprayed together), and the like can be given. As examples of the dry treatment, ultraviolet treatment, ozone treatment, plasma treatment, plasma treatment with bias application, radical treatment, and the like can be given. The above-described surface treatment on an object (a single crystal semiconductor substrate, an insulating layer formed on a single crystal semiconductor substrate, a support substrate, or an insulating layer formed on a support substrate) has an effect on the surface of the object to improve the hydrophilicity and cleanliness. As a result, the boning strength between the substrates can be improved.

The wet treatment is effective for the removal of macro dust and the like adhering to a surface of the object to be processed. The dry treatment is effective for the removal or decomposition of micro dust such as an organic substance which adheres to a surface of the object to be processed. The case in which the dry treatment such as ultraviolet treatment is performed and then the wet treatment such as cleaning is performed is preferable because the surface of the object can be made clean and hydrophilic and generation of watermarks in the surface of the object can be suppressed.

As the dry treatment, it is preferable to perform surface treatment using ozone or oxygen in an active state such as singlet oxygen. Ozone or oxygen in an active state such as singlet oxygen enables organic substances bonded on the surface of the object to be removed or decomposed effectively. Further, the treatment using ozone or oxygen in an active state such as singlet oxygen may be combined with treatment using ultraviolet light having wavelengths less than 200 nm, so that the organic substances bonded on the surface of the object can be removed more effectively. Specific description thereof will be made below.

For example, irradiation with ultraviolet light under the atmosphere containing oxygen is performed to perform the surface treatment of the object. Irradiation with ultraviolet light having wavelengths less than 200 nm and ultraviolet light having wavelengths greater than or equal to 200 nm under the atmosphere containing oxygen may be performed, so that ozone and singlet oxygen can be generated. Alternatively, irradiation with ultraviolet light having wavelengths less than 180 nm may be performed, so that ozone and singlet oxygen can be generated.

Examples of reactions which occur by performing irradiation with light including a wavelength of less than 200 nm and light including a wavelength of greater than or equal to 200 nm in an atmosphere containing oxygen are described.

$$O_2 + h\nu_1(\lambda_1 \text{ nm}) \rightarrow O(^3P) + O(^3P) \quad (1)$$

$$O(^3P) + O_2 \rightarrow O_3 \quad (2)$$

$$O_3 + h\nu_2(\lambda_2 \text{ nm}) \rightarrow O(^1D) + O_2 \quad (3)$$

In the above reaction formula (1), irradiation with light ($h\nu_1$) including a wavelength ($\lambda_1$ nm) of less than 200 nm in an atmosphere containing oxygen ($O_2$) is performed to generate oxygen atoms ($O(^3P)$) in a ground state. Next, in the reaction formula (2), an oxygen atom ($O(^3P)$) in a ground state and oxygen ($O_2$) are reacted with each other to generate ozone ($O_3$). Then, in the reaction formula (3), irradiation with light ($h\nu_2$) having wavelengths ($\lambda_2$ nm) greater than or equal to 200 nm in the atmosphere containing generated ozone ($O_3$) is performed to generate singlet oxygen in an excited state ($O(^1D)$). In an atmosphere containing oxygen, irradiation with light including a wavelength of less than 200 nm among ultraviolet is performed to generate ozone while irradiation with light including a wavelength of greater than or equal to 200 nm among ultraviolet is performed to generate singlet oxygen by decomposing ozone. The above-described surface treatment can be performed by, for example, irradiation with a low-pressure mercury lamp ($\lambda_1$=185 nm, $\lambda_2$=254 nm) under the atmosphere containing oxygen.

An example of the reaction which is caused by the irradiation with ultraviolet light having wavelengths less than 180 nm under the atmosphere containing oxygen is described below.

$$O_2 + h\nu_3(\lambda_3 \text{ nm}) \rightarrow O(^1D) + O(^3P) \quad (4)$$

$$O(^3P) + O_2 \rightarrow O_3 \quad (5)$$

$$O_3 + h\nu_3(\lambda_3 \text{ nm}) \rightarrow O(^1D) + O_2 \quad (6)$$

In the above reaction formula (4), irradiation with ultraviolet light ($h\nu_3$) having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), an oxygen atom ($O(^3P)$) in a ground state and oxygen ($O_2$) are reacted with each other to generate ozone ($O_3$). In the reaction formula (6), irradiation with light including a wavelength ($\lambda_3$ nm) of less than 180 nm in an atmosphere containing generated ozone ($O_3$) is performed to generate singlet oxygen in an excited state and oxygen. In an atmosphere containing oxygen, irradiation with light including a wavelength of less than 180 nm among ultraviolet is performed to generate ozone and to generate singlet oxygen by decomposing ozone or oxygen. The above-described surface treatment can be performed by, for example, irradiation with a Xe excimer UV lamp under the atmosphere containing oxygen.

Chemical bond of an organic substance bonded on the surface of an object is cut by the ultraviolet light having wavelengths less than 200 nm, and an organic substance or an organic substance in which the chemical bond is cut which is bonded on the surface of the object can be oxidative-decomposed by ozone or singlet oxygen to be removed. The surface treatment as described above can enhance the hydrophilicity and cleanliness of the surface of the object to be processed, making the bond more preferable.

Note that heat treatment for improving the bonding strength may be performed after the bonding is performed. This heat treatment is performed at a temperature at which separation at the embrittled region 114 does not occur (for example, a temperature of a room temperature or more and less than 400° C.). The base substrate 100 and the insulating layer 112 may be bonded together while being heated at a temperature in this temperature range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

[Manufacturing Steps of the SOI Substrate: Formation of a Single Crystal Semiconductor Layer]

Figure 3A:
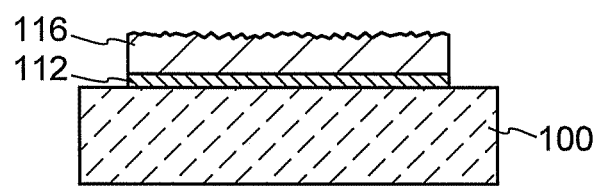
FIGS. 3A to 3C are cross-sectional views illustrating an example of a method for manufacturing an SOI substrate used for the semiconductor device.
Figure 3A:

Next, heat treatment is performed at a temperature of, for example, 400° C. or higher and equal to or lower than the upper temperature limit of the base substrate 100 to cause separation of the single crystal semiconductor substrate 110 at the embrittled region 114, whereby a single crystal semiconductor layer 116 is aimed over the base substrate 100 with the insulating layer 112 therebetween (see FIG. 2F and FIG. 3A).

When the heat treatment is performed, the element added is separated out, as a molecule, in microvoids which are formed in the embrittled region 114, and the internal pressure of the microvoids is increased. The increased pressure causes a crack in the embrittled region 114, so that the single crystal semiconductor substrate 110 is separated along the embrittled region 114. Because the insulating layer 112 is bonded to the base substrate 100, the single crystal semiconductor layer 116 which is separated from the single crystal semiconductor substrate 110 remains over the base substrate 100.

Figure 3B:
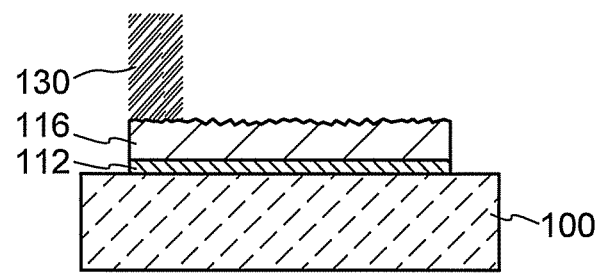
Figure 3B:
Figure 3C:
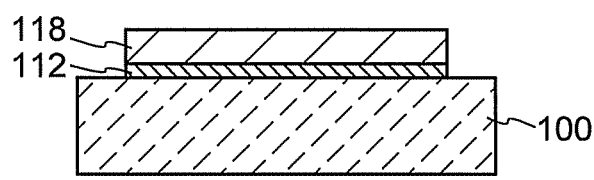

Next, a surface of the single crystal semiconductor layer 116 is irradiated with laser light 130, whereby a single crystal semiconductor layer 118 in which a surface of flatness is improved and the number of defects is reduced is formed (see FIGS. 3B and 3C).

Note that it is preferable that the single crystal semiconductor layer 116 be partially melted by the irradiation with the laser light 130. This is because, if the single crystal semiconductor layer 116 is completely melted, it is microcrystallized due to disordered nucleation after being in a liquid phase, so that the crystallinity thereof decreases. On the other hand, by partial melting, crystal growth proceeds based on a non-melted solid phase portion. Therefore, crystal quality can be improved as compared to the case where the single crystal semiconductor layer 116 is completely melted. In addition, incorporation of oxygen, nitrogen, or the like from the insulating layer 112 can be suppressed. Note that "partial melting" in the above description means melting of the single crystal semiconductor layer 116 with laser light irradiation from a top surface of the single crystal semiconductor layer 116 to an upper side of an interface of the insulating layer 112 (that is, smaller than the thickness of the single crystal semiconductor layer 116). In other words, it refers to a state in which the upper portion of the single crystal semiconductor layer 116 is melted to be in a liquid phase whereas the lower portion is not melted and remains in a solid phase. Further, the term "complete melting" means that the single crystal semiconductor layer 116 is melted to an interface between the single crystal semiconductor layer 116 and the insulating layer 112 and is in a liquid state.

For the above-described laser light irradiation, a pulsed laser is preferably used. This is because high-energy pulsed laser light can easily produce a partially melted state. The oscillation frequency is preferably, but not limited to, from 1 Hz to 10 MHz inclusive. Examples of the pulsed laser include an Ar laser, a Kr, laser, an excimer laser (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like. Note that a continuous-wave laser may be used if it can cause partial melting. Example of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like.

The wavelength of the laser light 130 needs to be selected so that the laser light 130 is absorbed by the single crystal semiconductor layer 116. The wavelength may be determined in consideration of the skin depth of the laser light and the like. For example, the wavelength can be set in the range of 250 nm to 700 nm inclusive. In addition, the energy density of the laser light 130 can be determined in consideration of the wavelength of the laser light 130, the skin depth of the laser light 130, the thickness of the single crystal semiconductor layer 116, or the like. The energy density of the laser light 130 may be set, for example, in the range of 300 $mJ/cm^2$ to 800 $mJ/cm^2$ inclusive. Note that the above range of the energy density is an example when a XeCl excimer laser (wavelength: 308 nm) is used as the pulsed laser.

The irradiation with the laser light 130 can be performed in an atmosphere containing oxygen such as an air atmosphere or in an inert atmosphere such as a nitrogen atmosphere or an argon atmosphere. In order to perform irradiation with the laser light 130 in an inert atmosphere, the irradiation with the laser beam 130 may be performed in an airtight chamber while the atmosphere in the chamber may be controlled. In the case where a chamber is not used, an inert atmosphere can be obtained by blowing an inert gas such as a nitrogen gas to the surface which is irradiated with the laser light 130.

Note that the irradiation in an inert atmosphere such as a nitrogen atmosphere is more effective in improving flatness of the single crystal semiconductor layer 116 than the irradiation in an air atmosphere. In addition, the inert atmosphere has higher effect of suppressing generation of cracks and ridges than the air atmosphere, and the energy density range applicable for the laser light 130 is widened. Note that the irradiation with the laser light 130 may be performed in a reduced-pressure atmosphere. When irradiation with the laser light 130 is performed in a reduced-pressure atmosphere, the same effects as those obtained by the irradiation in an inert atmosphere can be obtained.

Although the irradiation treatment with the laser beam 130 is performed after the heat treatment for separation of the single crystal semiconductor layer 116 in this embodiment, an embodiment of the disclosed invention is not construed as being limited to this. After the heat treatment for separation of the single crystal semiconductor layer 116, etching treatment may be performed to remove a region including many defects at the surface of the single crystal semiconductor layer 116. Then, the irradiation treatment with the laser light 130 may be performed. Alternatively, after the flatness of the surface of the single crystal semiconductor layer 116 is improved, the irradiation treatment with the laser light 130 may be performed. Note that the etching treatment may be either wet etching or dry etching.

In addition, it is preferable that the surface of the single crystal semiconductor layer 116 be cleaned before the irradiation treatment with the laser light 130.

After the irradiation with the laser light 130 is performed as described above, a step of thinning the single crystal semiconductor layer 116 may be performed. In order to thin the single crystal semiconductor layer 116, one or a combination of dry etching and wet etching may be employed.

Through the above steps, an SOI substrate having the single crystal semiconductor layer 118 with reduced surface roughness can be obtained (see FIG. 3C).

[Manufacturing Steps of the Photoelectric Conversion Element]

Next, manufacturing steps of the photoelectric conversion element 180 with the use of the SOI substrate will be described. First, the SOI substrate having the structure in which the insulating layer 112 and the single crystal semiconductor layer 118 are provided over the base substrate 100 is prepared according to the above steps (see FIG. 4A).

A small quantity of a p-type impurity element such as boron, aluminum, or gallium, or a small quantity of an n-type impurity element such as phosphorus or arsenic may be added to the single crystal semiconductor layer 118. A region to which the impurity element is added and the kind of the impurity element to be added can be changed as appropriate.

Then, a mask 150 is formed over the single crystal semiconductor layer 118. The single crystal semiconductor layer 118 is patterned using the mask 150, so that an island-shaped semiconductor layer 152 used for the photoelectric conversion element is formed (see FIG. 4B). The mask 150 can be formed by photolithography or the like using a resist material. Further, as etching treatment in the patterning, either wet etching or dry etching can be employed.

Figure 4A:
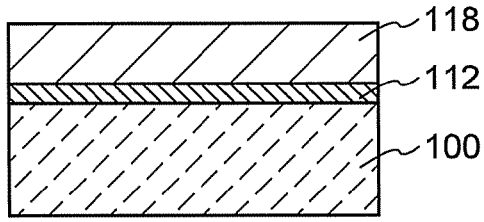
FIGS. 4A to 4H are cross-sectional views illustrating an example of a method for manufacturing a semiconductor device.
Figure 4B:
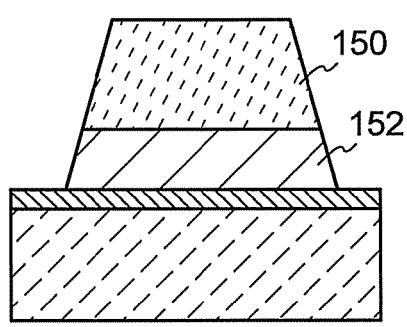
Figure 4C:
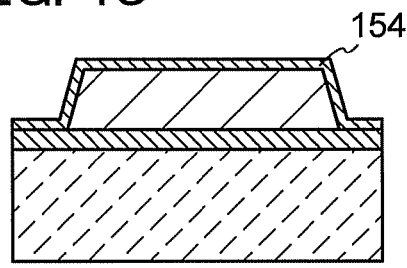
Figure 4D:
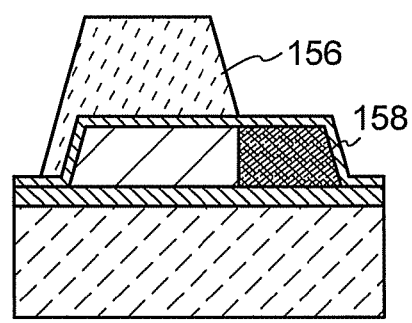
Figure 4E:
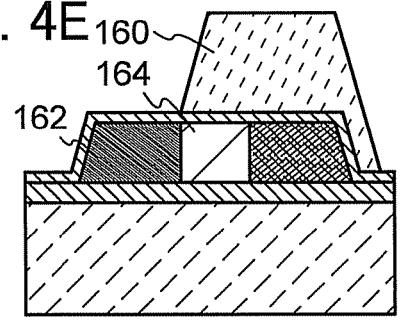

Next, the insulating layer 154 is formed so as to cover the semiconductor layer 152 (see FIG. 4C). The insulating layer 154 is not necessarily formed, but when the insulating layer 154 is provided, it can suppress damage to the semiconductor layer 152 at the time of addition of an impurity element performed later. Note that in this embodiment, a single-layer silicon oxide film is formed by a plasma CVD method. Alternatively, a film containing silicon oxynitride, silicon nitride oxide, silicon nitride, hafnium oxide, aluminum oxide, tantalum oxide, or the like can be formed to have a single-layer structure or a stacked-layer structure.

As a manufacturing method other than a plasma CVD method, a sputtering method or a method using oxidation or nitridation by high density plasma treatment can be given. A high-density plasma treatment is performed, for example, using a mixed gas of a rare gas such as helium, argon, krypton, or xenon; an oxygen gas; a nitrogen oxide gas; an ammonia gas; a nitrogen gas; a hydrogen gas; or the like. In this case, by exciting plasma by introduction of microwaves, plasma with a low electron temperature and high density can be generated. When a surface of the semiconductor layer 152 is oxidized or nitrided by oxygen radicals (OH radicals may be included) or nitrogen radicals (NH radicals may be included) which are produced by such high-density plasma, the insulating layer 154 with a thickness of 1 nm to 20 nm inclusive, preferably 2 nm to 10 nm inclusive can be formed.

Since oxidation or nitridation of the semiconductor layer by the high-density plasma treatment is a solid-phase reaction, an interface state density between the insulating layer 154 and the semiconductor layer 152 can be decreased sufficiently. In particular, in the case where the semiconductor layer is a single crystal, even when the surface of the semiconductor layer is oxidized by a solid-phase reaction by using the high-density plasma treatment, the insulating layer 154 with high uniformity and sufficiently-low interface state density can be formed.

Alternatively, the insulating layer 154 may be formed by thermally oxidizing the semiconductor layer 152. In the case of such thermal oxidation, it is necessary to use the base substrate 100 having a certain degree of heat resistance.

Note that hydrogen contained in the insulating layer 154 may be diffused into the semiconductor layer 152 by performing heat treatment at a temperature of 350° C. to 450° C. inclusive after formation of the insulating layer 154 containing hydrogen. In this case, the insulating layer 154 can be formed using silicon nitride or silicon nitride oxide by a plasma CVD method. Further, a process temperature is preferably set to 350° C. or lower. In this manner, by supplying the semiconductor layer 152 with hydrogen, defects in the semiconductor layer 152 and defects at the interface between the insulating layer 154 and the semiconductor layer 152 can be reduced effectively.

Next, a mask 156 is selectively formed over the insulating layer 154, and an impurity element imparting the first conductivity type is added to part of the semiconductor layer 152. Thus, the semiconductor region 158 having the first conductivity type is formed (see FIG. 4D). In this description here, boron is used for the impurity element imparting the first conductivity type and the first conductivity type is p-type conductivity: however, an embodiment of the disclosed invention is not limited thereto. Aluminum or the like may be used as the impurity element imparting the first conductivity type. Further, in the case where the first conductivity type is n-type conductivity, phosphorus, arsenic, or the like can be used. The mask 156 may be formed in a manner similar to that of the mask 150.

Specifically, for example, boron may be added using $B_2H_6$ as a source gas at an accelerating voltage of 10 kV to 40 kV with a dosage of approximately $3.0 \times 10^{14}$ cm$^{-2}$ to $1.0 \times 10^{17}$ cm$^{-2}$. The conditions of the addition of the impurity element can be changed as appropriate depending on required characteristics. Dark current tends to be reduced when the dosage is reduced. This is because damage to the semiconductor layer 152 is small when an impurity element is added under a low-dosage condition, so that current due to defects is not generated while damage of the semiconductor layer 152 is large when an impurity element is added with a high-dosage condition, so that a carrier trap due to defects is generated. Note that the mask 156 is removed after formation of the semiconductor region 158 having the first conductivity type.

After that, a mask 160 is selectively formed over the insulating layer 154 and an impurity element imparting the second conductivity type is added to part of the semiconductor layer 152. Accordingly, the semiconductor region 162 having the second conductivity type is formed, and the semiconductor region 164 having an effect of photoelectric conversion, to which the impurity element imparting the first conductivity type and the impurity element imparting the second conductivity type are not added (see FIG. 4E) is formed. The second conductivity type is different from the first conductivity type. That is, when the first conductivity type is p-type, the second conductivity is n-type; whereas the first conductivity type is n-type, the second conductivity type is p-type. In the description here, phosphorus is used as the impurity element imparting the second conductivity type and the second conductivity type is n-type. Alternatively, arsenic or the like can be used as the impurity element imparting n-type conductivity. The mask 160 is formed in a manner similar to that of the mask 150 or the mask 156.

Specifically, for example, phosphorus may be added using $PH_3$ as a source gas at an accelerating voltage of 10 kV to 40 kV with a dosage of approximately $1.0 \times 10^{14}$ cm$^{-2}$ to $5.0 \times 10^{16}$ cm$^{-2}$. The conditions of the addition of the impurity element can be changed as appropriate depending on required characteristics. In a manner similar to the case of addition of the impurity element imparting the first conductivity type, dark current can be suppressed when the dosage is reduced. The mask 160 is removed after formation of the semiconductor region 162 having the second conductivity type.

Note that addition of the impurity element imparting the first conductivity type and the impurity element imparting the second conductivity type are performed so that the width of the semiconductor region 164 having an effect of photoelectric conversion is 0.1 μm to 20 μm, preferably 3 μm to 10 μm. Needless to say, if processing accuracy of the mask 156 and the mask 160 permits, the width of the semiconductor region 164 can be 0.1 μm or smaller.

Figure 5:
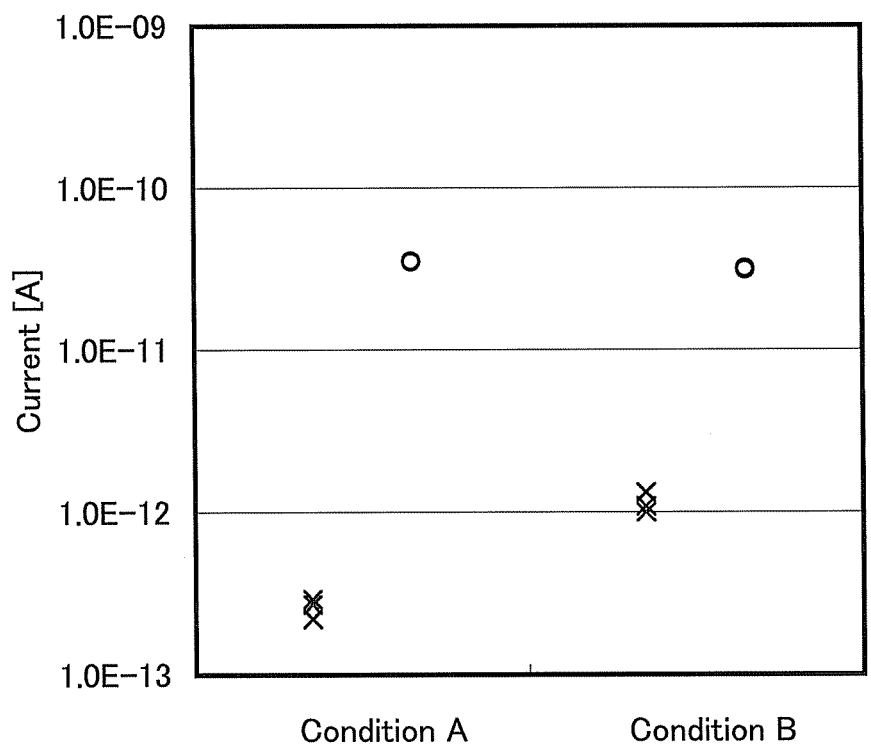
FIG. 5 shows a relation between a dosage and current of a photoelectric conversion element.

Here, the characteristics of the photoelectric conversion element in the case where the dosage are changed are illustrated in FIG. 5. In FIG. 5, a vertical axis represents current (A). A circle represents current (photocurrent) at the time of light irradiation of 1000 cd/m², and an X mark represents current (dark current) when light irradiation is not performed. In the left side of FIG. 5 (Condition A), the dosage of the impurity element imparting the first conductivity type (boron here) is $3.0\times10^{15}$ cm$^{-2}$, and the dosage of the impurity element imparting the second conductivity type (phosphorus here) is $1.0\times10^{15}$ cm$^{-2}$. In the right side of FIG. 5 (Condition B), the dosage of the impurity element imparting the first conductivity type is $1.0\times10^{16}$ cm$^{-2}$, and the dosage of the impurity element imparting the second conductivity type is $5.0\times10^{15}$ cm$^{-2}$. Note that in both the conditions, the accelerating voltage is 20 kV. In addition, the other parameters are the same in both of the Conditions A and B.

From FIG. 5, it can be found that the amount of dark current is suppressed in the case where the dosages of the impurity elements added are small to some extent (Condition A) as compared to the case of the large dosage (Condition B).

Figure 4F:
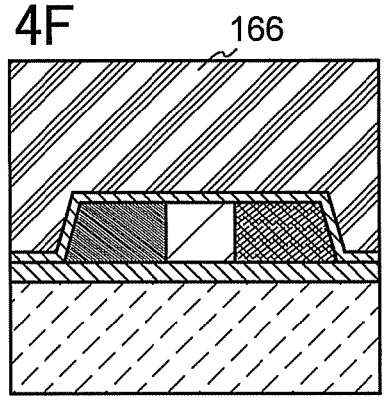

Then, the insulating layer 166 is formed so as to cover the semiconductor layer 152 and the insulating layer 154 (see FIG. 4F). Although the insulating layer 166 is not necessarily provided, when the insulating layer 166 is formed, an impurity such as an alkali metal or an alkaline earth metal can be prevented from entering the semiconductor layer 152. In addition, a surface of the photoelectric conversion element to be formed can be planarized.

The insulating layer 166 can be formed using, for example, a material such as silicon oxide, silicon nitride, silicon oxynitride, silicon nitride oxide, aluminum nitride, or aluminum oxide. In this embodiment, the insulating layer 166 is formed with a stacked-layer structure of a silicon oxynitride film with a thickness of approximately 300 nm and a silicon oxide film with a thickness of approximately 600 nm, which are formed by a CVD method. Needless to say, an embodiment of the disclosed invention is not limited thereto. A single-layer structure or a stacked-layer structure with three layers or more can be employed.

Other than the above materials, the insulating layer 166 can be formed using an organic material having heat resistance, such as polyimide, acrylic, benzocyclobutene, polyamide, or epoxy. Other than such organic materials, for example, it is also possible to use a low-dielectric constant material (a low-k material), a siloxane-based resin, PSG (phosphosilicate glass), BPSG (borophosphosilicate glass), or the like. Here, a siloxane-based resin corresponds to a resin containing a Si—O—Si bond which is formed using a siloxane-based material as a starting material. The following method can be employed depending on the material: a method such as a CVD method, a sputtering method, an SOG method, spin coating, dip coating, spray coating, or a droplet discharging method (e.g., ink jetting, screen printing, or offset printing), or with a tool (equipment) such as a doctor knife, a roll coater, a curtain coater, or a knife coater.

Figure 4G:
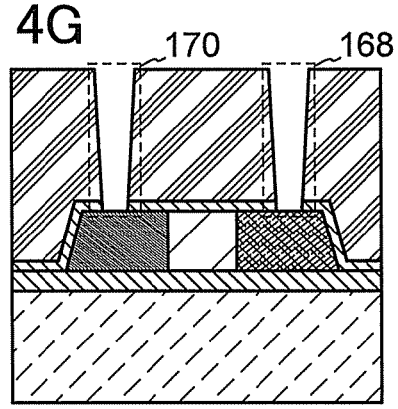

Next, a contact hole 168 and a contact hole 170 are formed in the insulating layer 154 and the insulating layer 166 so that the semiconductor layer 152 is partly exposed (see FIG. 4G). Here, specifically, the contact hole 168 and the contact hole 170 are formed so that the semiconductor region 158 having the first conductivity type and the semiconductor region 162 having the second conductivity type are partly exposed. The contact hole 168 and the contact hole 170 can be formed by etching treatment or the like after selective formation of the mask. As the etching treatment, dry etching using a mixed gas of CHF$_3$ and He as an etching gas can be employed; however, an embodiment of the disclosed invention is not limited thereto.

Figure 4H:
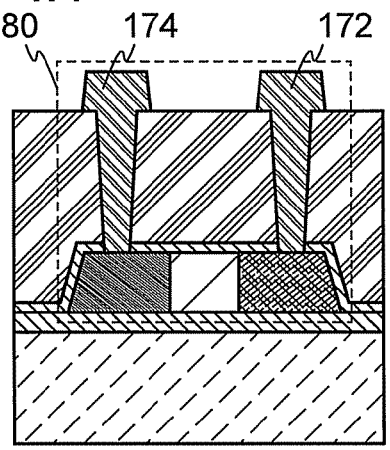

A conductive layer which is in contact with the semiconductor layer 152 through the contact holes is formed and then patterned so that the first electrode 172 and the second electrode 174 are formed (see FIG. 4H). The conductive layer, from which the first electrode 172 and the second electrode 174 are formed, can be formed by a CVD method, a sputtering method, an evaporation method, or the like. Specifically, as a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing the above-described material as its main component or a compound containing the above-described material may be used. Note that the conductive layer may have a single-layer structure or a stacked-layer structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the first electrode 172 and the second electrode 174. In particular, aluminum silicon is preferable because a hillock can be prevented from generating due to resist baking at the time of patterning. Further, a material in which, instead of silicon, Cu is mixed into aluminum at approximately 0.5% may be used.

In the case where the conductive layer is formed with a stacked-layer structure so that each of the first electrode 172 and the second electrode 174 has a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming the conductive film such that an aluminum silicon film is interposed between barrier films, generation of hillocks of aluminum or aluminum silicon can be further prevented. When a barrier film is formed using titanium, which is an element having a high reducing property, even if a thin oxide film is formed over the semiconductor region 158 having the first conductivity type and the semiconductor region 162 having the second conductivity type, the oxide film is reduced by titanium contained in the barrier film, so that favorable contacts between the semiconductor region 158 having the first conductivity type and the first electrode 172 and between the semiconductor region 162 having the second conductivity type and the second electrode 174 can be obtained. Alternatively, it is also possible to stack a plurality of barrier films. In that case, for example, a five-layer structure of titanium, titanium nitride, aluminum silicon, titanium, and titanium nitride which are stacked from the bottom, or a stacked-layer structure of more than five layers can be employed.

As the conductive layer, tungsten silicide formed by a chemical vapor deposition method using a WF$_6$ gas and a SiH$_4$ gas may be used. Alternatively, tungsten formed by hydrogen reduction of WF$_6$ may be used for the conductive layer.

In this manner, the photoelectric conversion element 180 is formed over the light-transmitting base substrate 100.

[Characteristics of the Photoelectric Conversion Element]

Figure 6:
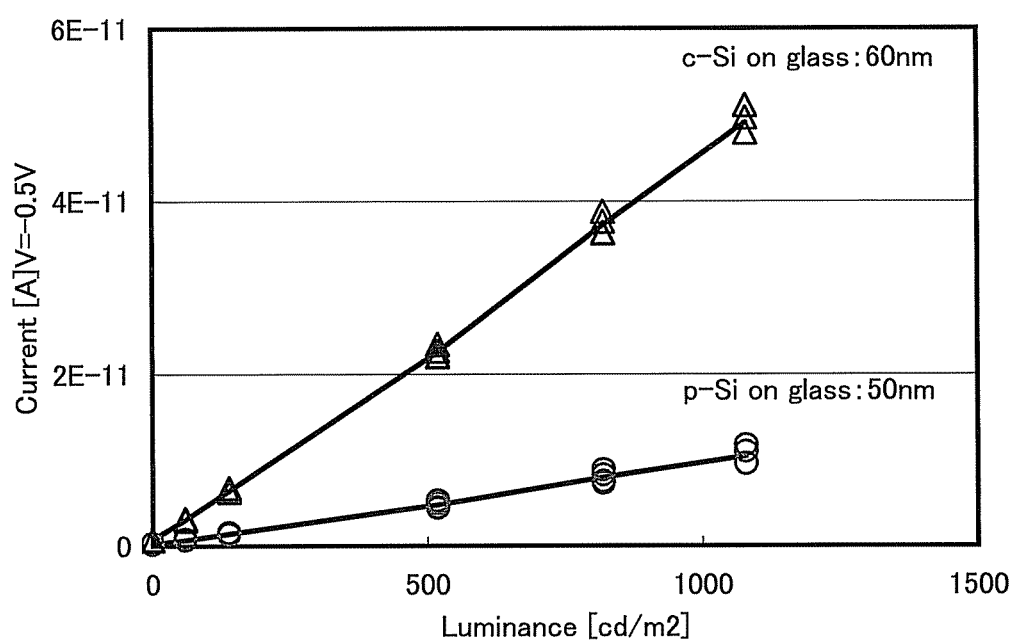
FIG. 6 is a graph showing luminance-current characteristics of a photoelectric conversion element.

Next, an example of the characteristics (luminance-current characteristics) of the photoelectric conversion element obtained in accordance with the above method will be described (see FIG. 6). In FIG. 6, the vertical axis represents current (A) and the horizontal axis represents luminance (cd/m$^2$) of light with which the element is irradiated.

Here, the following two kinds of photoelectric conversion elements are investigation objects: a photoelectric conversion element formed by the method described in this embodiment (in particular, the photoelectric conversion element in which a glass substrate is used as a base substrate: c-Si on glass) and a photoelectric conversion element formed using a polycrystalline silicon over a glass substrate (p-Si on glass). The thicknesses of semiconductor layers in the photoelectric conversion elements slightly differ from each other, which are 60 nm (c-Si on glass) and 50 nm (p-Si on glass), and the other conditions are the same. Further, measurement is performed while a reverse bias voltage of 0.5 V is applied.

From FIG. 6, it is found that current obtained with the photoelectric conversion element formed in accordance with this embodiment is approximately five times as large as that obtained with the photoelectric conversion element formed using polycrystalline silicon over the glass substrate.

In this manner, when a photoelectric conversion element is formed using a single crystal semiconductor layer formed over a light-transmitting base substrate, element characteristics can be improved as compared to the case where a photoelectric conversion element is formed using polycrystalline silicon. Further, when the single crystal semiconductor layer formed over the light-transmitting base substrate is used, light can enter from the substrate side, so that the photoelectric conversion element with excellent characteristics can be formed.

Note that the structure described in this embodiment can be implemented by being combined as appropriate with any of the other structures described in the other embodiments.

Embodiment 2

In this embodiment, an example of a semiconductor device and a manufacturing method thereof will be described with reference to drawings. Specifically, a semiconductor device provided with a light-blocking layer which is provided below and overlaps with a photoelectric conversion element and a manufacturing method of the semiconductor device will be described.

Figure 7A:
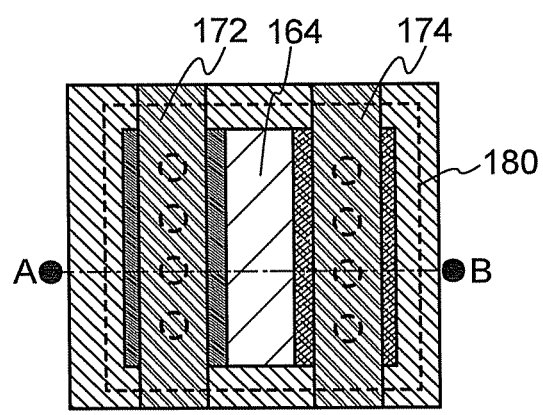
FIG. 7A is a plan view and FIG. 7B is a cross-sectional view illustrating an example of a semiconductor device.
Figure 7B:
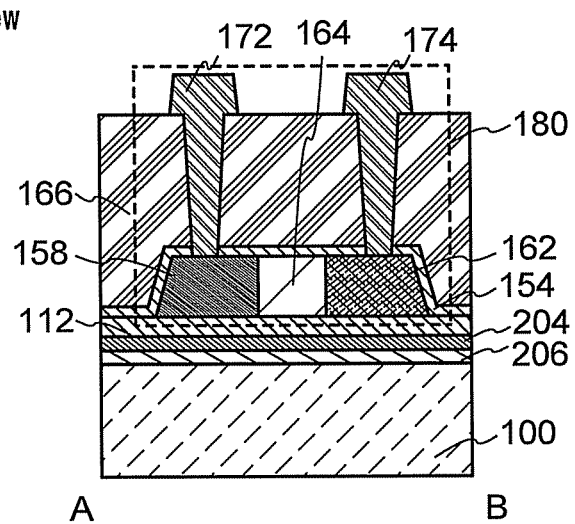

A photoelectric conversion element 180 relating to an embodiment of the disclosed invention is formed over a light-blocking layer 204 provided over a light-transmitting substrate 100 (see FIGS. 7A and 7B). Here, FIG. 7B corresponds to a cross section along line A-B of FIG. 7A.

The photoelectric conversion element 180 is a lateral junction pin diode and includes an island-shaped single crystal semiconductor layer including a semiconductor region 164 having an effect of photoelectric conversion, a semiconductor region 158 having a first conductivity type, and a semiconductor region 162 having a second conductivity type; a first electrode 172 electrically connected to the semiconductor region 158 having the first conductivity type; and a second electrode 174 electrically connected to the semiconductor region 162 having the second conductivity type. The first electrode 172 and the second electrode 174 are electrically connected to the semiconductor region 158 having the first conductivity type and the semiconductor region 162 having the second conductivity type respectively, through contact holes. The contact holes are formed in the insulating layer 154 and the insulating layer 166 which are formed so as to cover the island-shaped oxide semiconductor layer. The previous embodiment can be referred to for the specific structures of the photoelectric conversion element, the insulating layer, the substrate and the manufacturing process thereof. In this embodiment of the disclosed invention, the light-blocking layer 204 which can block light is provided over the light-transmitting substrate 100 with an insulating layer 206 therebetween, and the photoelectric conversion element 180 is provided over and overlaps with the light-blocking layer 204 with an insulating layer 112 therebetween.

By providing the light-blocking layer 204 so as to overlap with the photoelectric conversion element 180, light from a light source provided for the light-transmitting substrate 100 can be prevented from directly striking the photoelectric conversion element 180, which functions as a photo sensor. When the light-blocking layer 204 is formed having a width larger than that of the island-shaped single crystal semiconductor layer included in the photoelectric conversion element 180, light can be prevented from directly striking the photoelectric conversion element 180 more surely.

Figure 8:
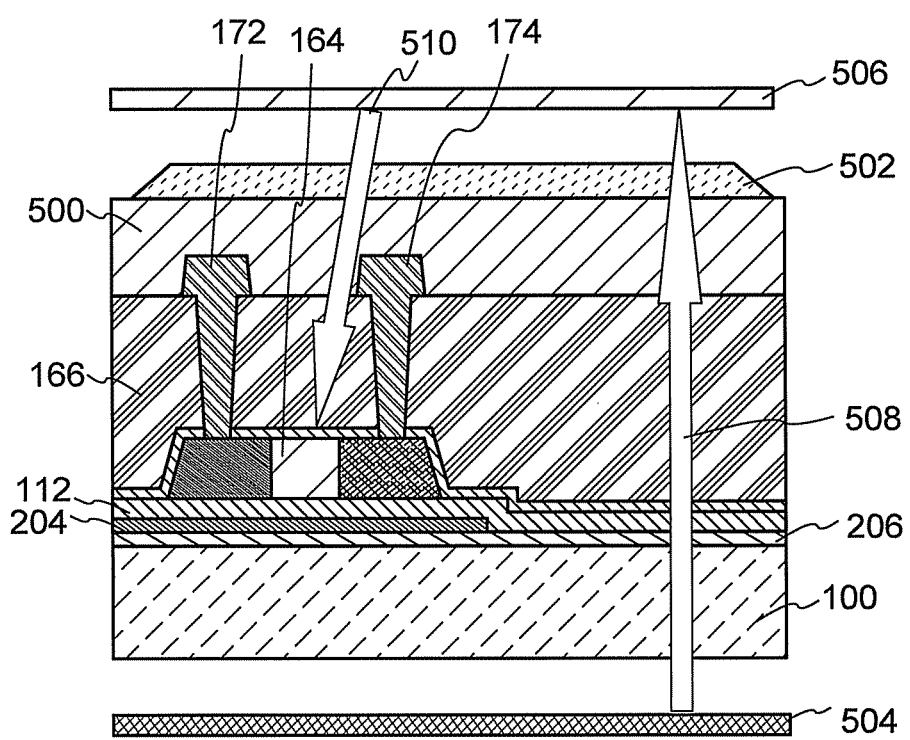
FIG. 8 is a cross-sectional view illustrating an example of a semiconductor device.

FIG. 8 illustrates a relation between the photoelectric conversion element 180 and a direction of incident light. A color filter 502 is provided over the insulating layer 166 and the insulating layer 500. When a light source 504 is provided on the light-transmitting substrate 100 side and an object 506 is arranged in a counter substrate (not illustrated) side, the object 506 on the counter substrate side is irradiated with light 508 from the light source 504. Then, the photoelectric conversion element (photo sensor) receives reflection light 510 from the object 506. In this case, it is possible to reduce a distance for which the light is delivered between the color filter and the photoelectric conversion element as compared to that in the case where the light source 504, the color filter 502, and the light-blocking layer 204 are provided on the counter substrate side and the object is provided on the light-transmitting substrate 100 side. Therefore, color mixing can be suppressed.

The structure in which the light-blocking layer 204 is provided on the light-transmitting substrate 100 side is more effective when further miniaturized pixels with small pitches are needed in order to improve resolution of image capture in a display device in which contact area sensors that capture images are arranged in the whole display screen of a touch panel.

In addition, the first electrode 172 and second electrode 174 are electrically connected to the semiconductor region 158 having the first conductivity type and the semiconductor region 162 having the second conductivity type, respectively, through the contact holes formed in the insulating layer 154 and the insulating layer 166. That is, the first electrode 172 and second electrode 174 are provided on a side opposite to the light-blocking layer 204 with the semiconductor region 164 having an effect of photoelectric conversion interposed therebetween, so as to be light blocking walls. Accordingly, light from an oblique direction which is transmitted through an adjacent color filter with a different color can be prevented, so that color separation can be favorably performed and color mixing can be further suppressed.

In addition, a structure in which voltage is applied to the light-blocking layer 204 may be employed. By controlling voltage which is supplied to the light-blocking layer 204, the light-blocking layer 204 can be used as an electrode of the photoelectric conversion element 180. Accordingly, generation and flow of electrons and holes can be controlled.

Next, manufacturing steps of the photoelectric conversion element and a transistor over the substrate will be described with reference to FIGS. 9A to 9G and FIGS. 10A to 10H.

Figure 9A:
FIGS. 9A to 9G are cross-sectional views illustrating an example of a method for manufacturing an SOI substrate used for a semiconductor device.
Figure 9B:
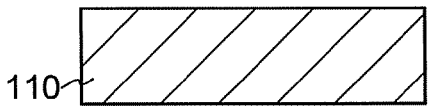

First, the light-transmitting base substrate 100 and the single crystal semiconductor substrate 110 serving as a bonding substrate are prepared (see FIGS. 9A and 9B). The details of the base substrate 100 and the single crystal semiconductor substrate 110, for which the above embodiment can be referred to, are omitted here.

Figure 9C:
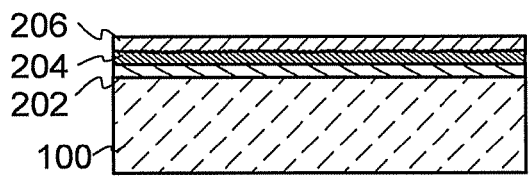

Next, an insulating layer 202, the light-blocking layer 204, and the insulating layer 206 are stacked in this order over a surface of the base substrate 100 (see FIG. 9C).

The insulating layer 202 can be formed with a single layer or a stacked layer using, for example, a silicon oxide film, a silicon nitride film, a silicon nitride oxide film, a silicon oxynitride film, an aluminum nitride film, an aluminum oxide film, and/or the like. When an insulating layer containing nitrogen is formed as the insulating layer 202, diffusion of an impurity element such as sodium (Na) contained in the base substrate into the semiconductor can be suppressed. A thermal oxidation method, a CVD method, a sputtering method, or the like can be employed to manufacture the insulating layer 202.

The light-blocking layer 204 is preferably formed using a film formed of a metal having heat resistance, such as tungsten, molybdenum, tantalum, titanium, niobium, nickel, cobalt, zirconium, or zinc. In particular, molybdenum or tungsten is preferably used. Alternatively, an organic resin containing black colorant such as carbon black or titanium lower oxide can be used. Alternatively, a film using chromium can be used as the light-blocking layer 204. Further, it is preferable that a material which has oxidation resistance in addition to heat resistance be used as the light-blocking layer 204. The light-blocking layer 204 can be formed using a sputtering method, an evaporation method, or the like.

The insulating layer 206 provided over the light-blocking layer 204 can be formed with a single layer or a stacked layer using, for example, a silicon oxide film, a silicon nitride film, a silicon nitride oxide film, a silicon oxynitride film, an aluminum nitride film, an aluminum oxide film, and/or the like. In particular, aluminum oxide is preferably used for the insulating layer 206. This is because aluminum oxide has favorable adhesion with the light-blocking layer 204. Further, aluminum oxide has favorable flatness and can moderate unevenness of a surface of the light-blocking layer 204. Therefore, the use of aluminum oxide enables favorable bonding between the base substrate 100 and the single crystal semiconductor substrate 110. A thermal oxidation method, a CVD method, a sputtering method, or the like can be employed to manufacture the insulating layer 206.

Figure 9D:
Figure 9E:
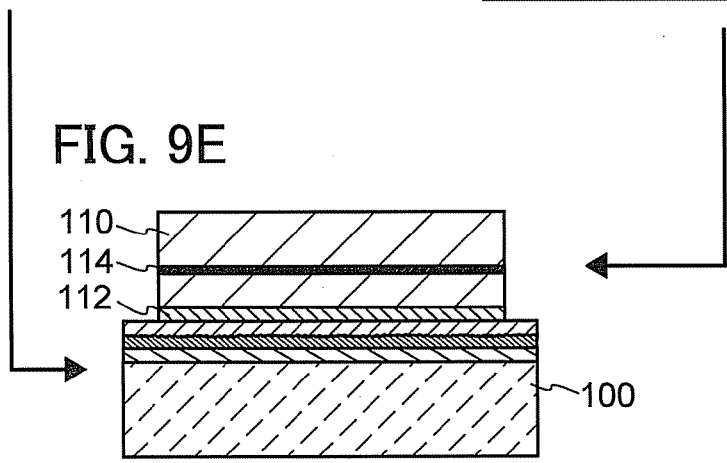

The embrittled region 114 is formed at a predetermined depth from the surface of the single crystal semiconductor substrate 110, and the base substrate 100 and the single crystal semiconductor substrate 110 are bonded together with the insulating layer 202, the light-blocking layer 204, the insulating layer 206, and the insulating layer 112 therebetween (see FIGS. 9D and 9E).

The insulating layer 112 can be formed with a single layer or a stacked layer of a silicon oxide film, a silicon oxynitride film, and/or the like, for example. The aforementioned embodiment can be referred to for a detailed description thereof. Although the insulating layer 112 is formed over the single crystal semiconductor substrate 110 here, the insulating layer 112 may be formed by a thermal oxidation method so as to cover the single crystal semiconductor substrate.

The embrittled region 114 can be formed by adding ions of hydrogen or the like having kinetic energy to the single crystal semiconductor substrate 110. The aforementioned embodiment can be referred to for a detailed description thereof.

Bonding is performed as follows: the base substrate 100 and the single crystal semiconductor substrate 110 are disposed in close contact with each other with the insulating layer 202, the light-blocking layer 204, the insulating layer 206, and the insulating layer 112 therebetween, and then a pressure of from 1 N/cm$^2$ to 500 N/cm$^2$ inclusive is applied to a portion of the base substrate 100 or the single crystal semiconductor substrate 110. Then, the insulating layer 206 and the insulating layer 112 start to be bonded together from the pressure-applied portion, and the bonding spontaneously spreads to the entire area. This bonding is performed under the action of the Van der Waals force or hydrogen bonding and can be performed at room temperature.

Note that before the single crystal semiconductor substrate 110 and the base substrate 100 are bonded together, surfaces to be bonded together are preferably subjected to surface treatment. Surface treatment can improve the bonding strength at the bonding interface between the single crystal semiconductor substrate 110 and the base substrate 100. The above embodiment can be referred to for details of the surface treatment.

Note that heat treatment for improving the bonding strength may be performed after the bonding is performed. This heat treatment is performed at a temperature at which separation at the embrittled region 114 does not occur (for example, higher than or equal to room temperature and lower than 400° C.). Alternatively, the insulating layer 206 over the base substrate 100 and the insulating layer 112 may be bonded together while being heated at a temperature in this temperature range. The heat treatment can be performed using a diffusion furnace, a heating furnace such as a resistance heating furnace, a rapid thermal annealing (RTA) apparatus, a microwave heating apparatus, or the like.

Figure 9F:
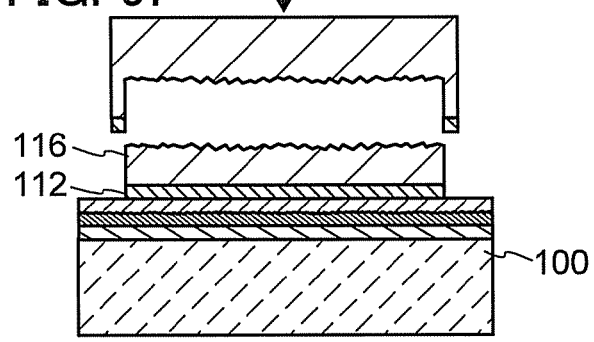
Figure 9G:
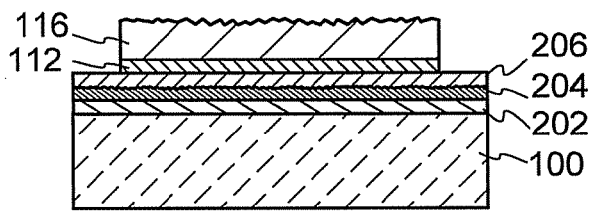

Next, the single crystal semiconductor substrate 110 is separated at the embrittled region 114 by heat treatment, whereby the single crystal semiconductor layer 116 is formed over the base substrate 100 provided with the light-blocking layer 204 with the insulating layer 112 therebetween (see FIGS. 9F and 9G). Note that an edge portion of the surface of the single crystal semiconductor substrate 110 is not bonded to the light-transmitting substrate because of its carved surface shape (called edge roll-off) resulting from surface polishing treatment.

When the heat treatment is performed, the element added is separated out in microvoids which are formed in the embrittlement region 114 as a molecule, and the internal pressure of the microvoids is increased. The increased pressure causes a crack in the embrittled region 114, so that the single crystal semiconductor substrate 110 is separated along the embrittled region 114. Because the insulating layer 112 is bonded to the insulating layer 206, the single crystal semiconductor layer 116 which is separated from the single crystal semiconductor substrate 110 remains over the base substrate 100.

Figure 10A:
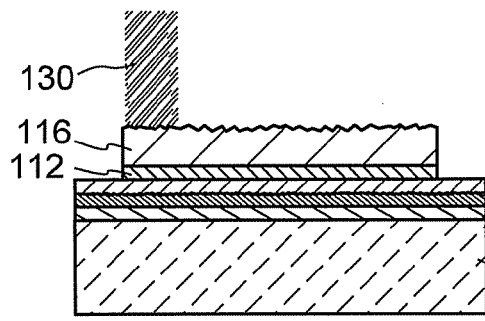
FIGS. 10A to 10H are cross-sectional views illustrating an example of a method for manufacturing an SOI substrate and a semiconductor device.
Figure 10E:
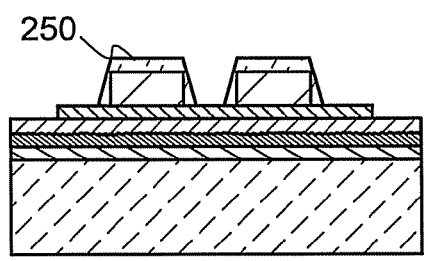
Figure 10B:
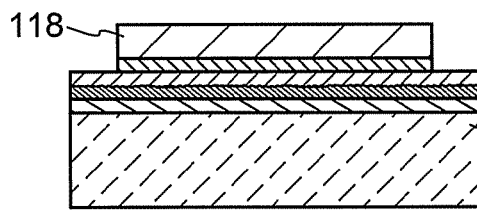

Next, the surface of the single crystal semiconductor layer 116 is irradiated with the laser light 130, whereby a single crystal semiconductor layer 118 in which the flatness of the surface is improved and the number of defects is reduced is formed (see FIGS. 10A and 10B). The above embodiment can be referred to for details of the irradiation with the laser light 130.

Figure 10F:
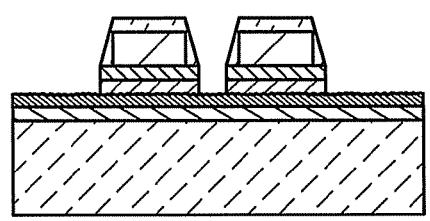
Figure 10C:
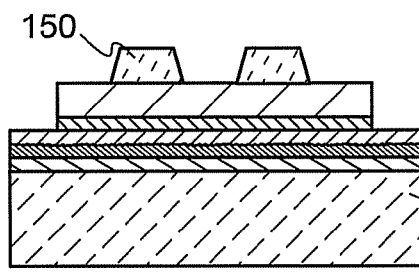
Figure 10G:
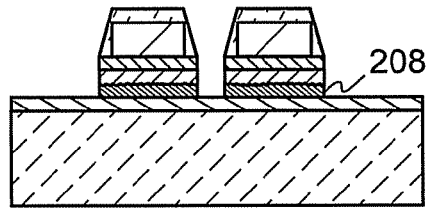
Figure 10D:
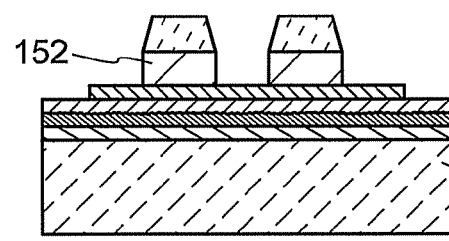
Figure 10H:
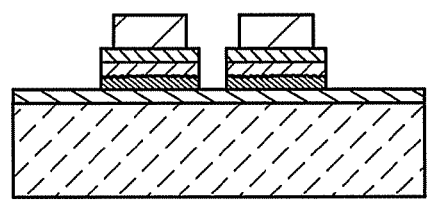

Then, a mask 150 is formed over the single crystal semiconductor layer 118, and the single crystal semiconductor layer 118 is patterned (processed) using the mask 150, so that island-shaped semiconductor layers 152 for the photoelectric conversion element are formed (see FIGS. 10C and 10D). The mask 150 can be formed by photolithography with the use of a resist material or the like. In addition, as the etching treatment in the patterning, either wet etching or dry etching can be employed. Here, the single crystal semiconductor layer 118 is patterned to form the island-shaped semiconductor layers 152 by dry etching using a mixed gas of $BCl_3$, $CF_4$, and $O_2$ as a reactive gas. Note that the drawings are schematic views. Therefore, needless to say, a scale such as the size of the island-shaped semiconductor layers 152 with respect to the whole single crystal semiconductor layer 118 in the drawings is different from an actual scale in some cases.

The mask 150 is removed and then a mask 250 is formed so as to cover each of the island-shaped semiconductor layers 152 (see FIG. 10E). The mask 250 can be formed by photolithography with the use of a resist material or the like.

Then, the insulating layer 112 and the insulating layer 206 are etched using the mask 250 (see FIG. 10F). As the etching treatment, either wet etching or dry etching can be employed. Here, although dry etching using a mixed gas of $CHF_3$ and He as a reactive gas is employed, this embodiment is not limited thereto.

Next, the light-blocking layer 204 is patterned using the mask 250 so that island-shaped light-blocking layers 208 are formed (see FIG. 10G). As the etching treatment in the patterning, either wet etching or dry etching can be employed. Here, the light-blocking layer 204 is patterned by dry etching using a mixed gas of $Cl_2$, $CF_4$, and $O_2$ as a reactive gas to form the island-shaped light-blocking layers 208. Then, the mask 250 is removed (see FIG. 10H). Thus, the island-shaped semiconductor layers 152 which overlap with the island-shaped light-blocking layers 208 and each have a smaller width than the respective island-shaped light-blocking layers 208 can be obtained. Next, as described in other embodiments, the photoelectric conversion element is formed using the island-shaped semiconductor layer 152.

In the semiconductor device formed in accordance with the above method, since the island-shaped light-blocking layer 208 is selectively formed over a region overlapping with the island-shaped semiconductor layer 152, direct irradiation of the photoelectric conversion element 180 with light which is transmitted through the light-transmitting substrate can be prevented. Note that a transistor can be formed with the use of the island-shaped semiconductor layer 152 at the same time as formation of the photoelectric conversion element, using some manufacturing steps in common with those of the photoelectric conversion element. Also in this case, by providing the light-blocking layer so as to overlap with an active layer of a transistor, generation of channel leakage current due to light can be suppressed.

Note that the steps by which the island-shaped semiconductor layer 152 having a smaller width than the island-shaped light-blocking layer 208 is obtained are described here. However, alternatively, after the step of FIG. 10D, the light-blocking layer 204 may be patterned using the mask 150 so that the island-shaped light-blocking layer 208 having almost the same shape as the island-shaped semiconductor layer 152 may be formed as long as a sufficient light blocking effect can be obtained.

Next, a manufacturing method in which arrangement of the light-blocking layer is different from that of FIGS. 10A to 10H will be described with reference to drawings. In particular, a manufacturing method of a semiconductor device in which only part of the light-blocking layer in a region serving as a display portion of a touch panel is removed so that an opening portion is formed will be described with reference to FIGS. 11A to 11H.

Figure 11A:
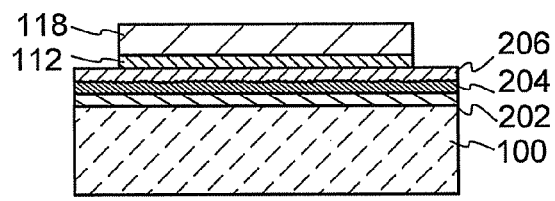
FIGS. 11A to 11H are cross-sectional views illustrating an example of a method for manufacturing a semiconductor device.
Figure 11E:
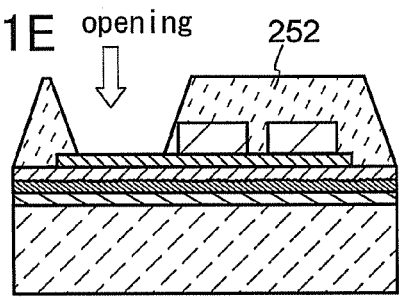
Figure 11B:
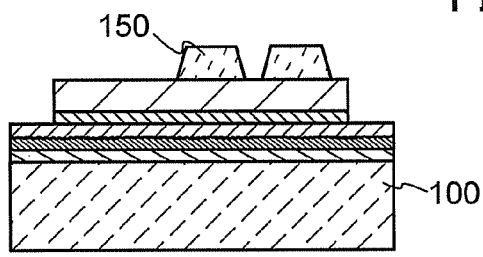
Figure 11F:
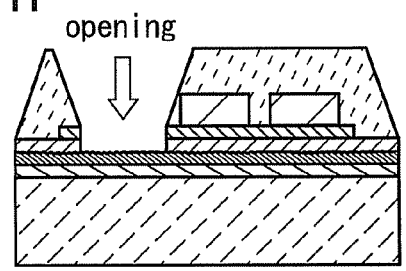
Figure 11C:
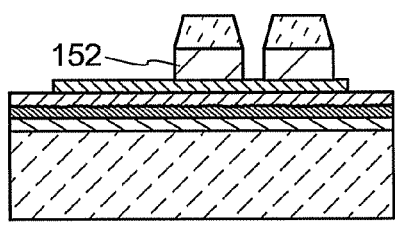

FIG. 11A corresponds to FIG. 10B. FIGS. 9A to 9G, FIGS. 10A to 10D, and the description thereof can be referred to for steps from formation of the single crystal semiconductor layer 118 over the light-blocking layer 204 up to formation of the island-shaped semiconductor layers 152 with the use of the mask 150. Accordingly, the island-shaped semiconductor layers 152 are formed over the base substrate 100 provided with the light-blocking layer 204 (see FIG. 11D). Note that the drawings are schematic views. Therefore, needless to say, a scale such as the size of the island-shaped semiconductor layers 152 with respect to the whole single crystal semiconductor layer 118 in the drawings is different from an actual scale in some cases.

Next, a mask 252 is formed in a region (the opening portion) other than the region serving as the display portion of the touch panel so as to cover the island-shaped semiconductor layers 152. Etching is performed using the mask 252 to remove the insulating layer 112 and the insulating layer 206 in the opening portion (see FIGS. 11E and 11F). As the etching treatment, either wet etching or dry etching can be employed. Here, although dry etching using a mixed gas of $CHF_3$ and He as a reactive gas is employed, this embodiment is not limited thereto.

Figure 11G:
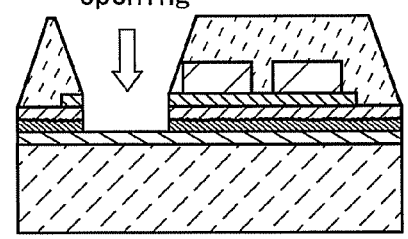
Figure 11D:
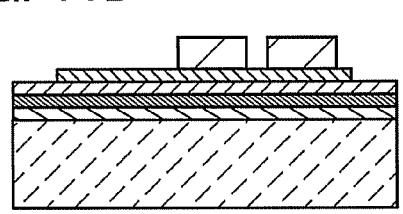
Figure 11H:
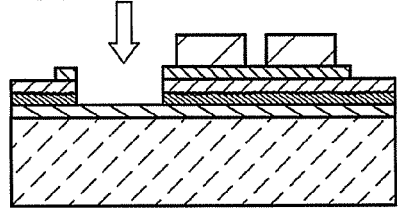

Next, the light-blocking layer 204 is etched using the mask 250 (see FIG. 11G). As etching treatment in the patterning, either wet etching or dry etching can be employed. Here, dry etching is performed using a mixed gas of $Cl_2$, $CF_4$, and $O_2$ as a reactive gas. Then, the mask 252 is removed (see FIG. 10H). Thus, the light-blocking layer in only the region serving as the display portion is removed, whereby the semiconductor device in which the light-blocking layer is provided in a region overlapping with the island-shaped semiconductor layer 152 can be obtained.

Figure 12A:
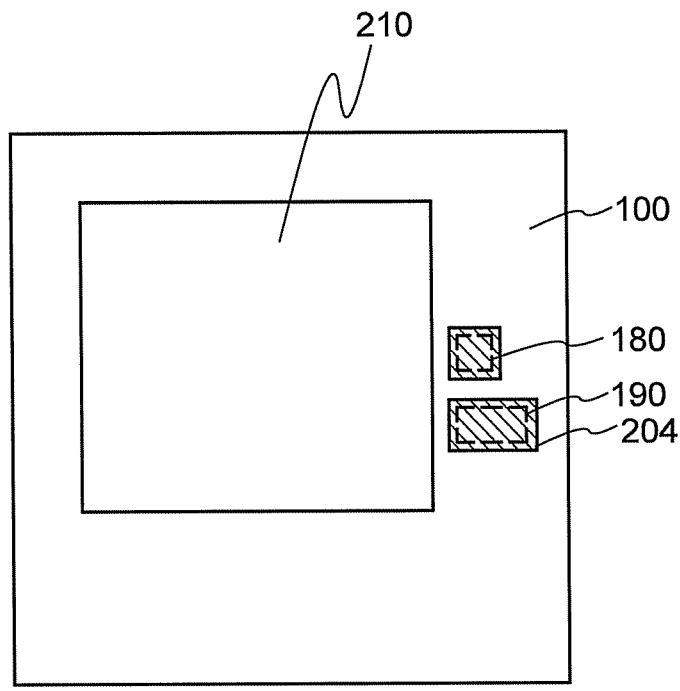
FIGS. 12A and 12B are plan views illustrating examples of a semiconductor device.
Figure 12B:
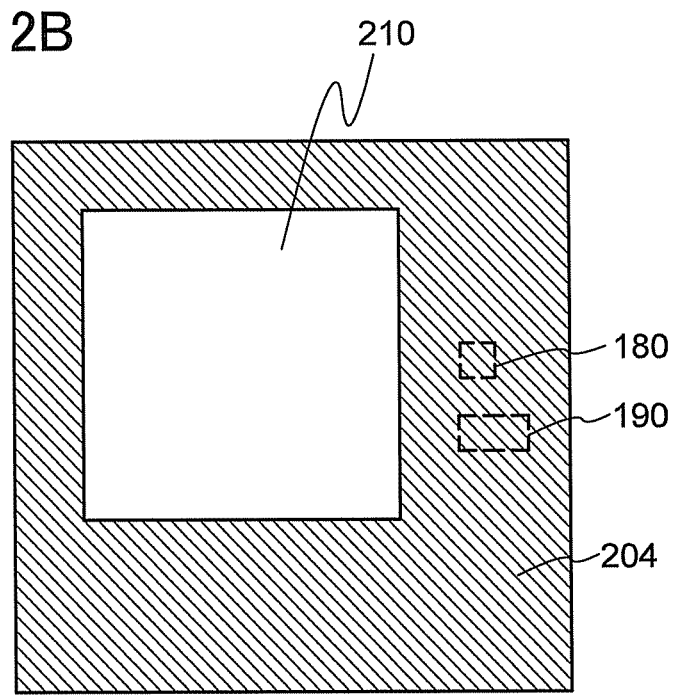

FIGS. 12A and 12B are examples of a plan view in which a structure of one pixel of a semiconductor device provided with the photoelectric conversion element and the transistor which are relate to an embodiment of the present invention is illustrated from the light-transmitting substrate side.

FIG. 12A illustrates a structure in which a light-blocking layer is provided in every element such as the photoelectric conversion element 180 and a transistor 190. It is preferable that a light-blocking layer 240 be provided to have almost the same shape as an island-shaped single crystal semiconductor layer or have a larger width than the island-shaped single crystal semiconductor layer so that at least a semiconductor region having an effect of photoelectric conversion in the photoelectric conversion element 180 is not irradiated with light. When the light-blocking layer 240 has a larger width than the semiconductor layer of the photoelectric conversion element 180, incidence of light in a perpendicular or an oblique direction from the light-transmitting substrate 100 side can be prevented.

FIG. 12B illustrates a structure in which the light-blocking layer 204 is provided over the entire region other than a pixel display region 210 in a touch panel. Since the photoelectric conversion element 180 and the transistor 190 are formed over the light-blocking layer 204 provided over the light-transmitting substrate, light from the light-transmitting substrate side can be prevented from directly striking the photoelectric conversion element 180 and the transistor 190. As a result, reliability of a function of a photo sensor can be improved.

In this embodiment, the light-blocking layer is formed on the light-transmitting base substrate side. Therefore, for example, in the case where a plurality of single crystal semiconductor substrates serving as bonding substrates is bonded to one base substrate having a larger size than the single crystal semiconductor substrate, the light-blocking layer is not necessarily formed in every single crystal semiconductor substrate, so that burden on a film formation apparatus can be reduced and the manufacturing steps can be reduced.

The structure described in this embodiment can be used in appropriate combination with any of the structures described in the other embodiments.

Embodiment 3

In this embodiment, a manufacturing method of a semiconductor device provided with a photoelectric conversion element overlapping with a light-blocking layer, which is different from that in the above embodiment will be described with reference to FIGS. 13A to 13G and FIGS. 14A to 14F. Note that the drawings are schematic views. Therefore, needless to say, a scale in the drawings is different from an actual scale in some cases.

First, a light-transmitting base substrate 100 and a single crystal semiconductor substrate 110 serving as a bonding substrate are prepared. An insulating layer 202, a light-blocking layer 204, an insulating layer 206 are stacked in this order over a surface of the base substrate 100 (see FIGS. 13A and 13B). The details of the base substrate 100, the single crystal semiconductor substrate 110, the insulating layer 202, the light-blocking layer 204, and the insulating layer 206, for which the above embodiment can be referred to, are omitted here.

Then, a mask 250 is formed over the insulating layer 206. The insulating layer 206 and the light-blocking layer 204 are etched in this order using the mask 250, so that island-shaped light-blocking layers 208 are formed (see FIG. 13C). The mask 250 can be formed by photolithography with the use of a resist material or the like. As the etching treatment, either wet etching or dry etching can be employed. Here, the insulating layer 206 is etched by dry etching using a mixed gas of $CHF_3$ and He as a reactive gas, and the light-blocking layer 204 is etched by dry etching using a mixed gas of $Cl_2$, $CF_4$, and $O_2$ as a reactive gas; however, this embodiment is not limited thereto.

Figure 13A:
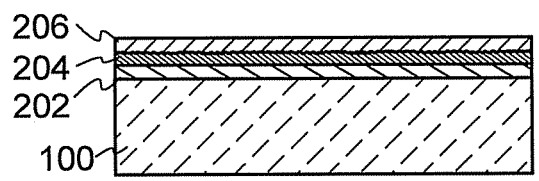
FIGS. 13A to 13G are cross-sectional views illustrating an example of a method for manufacturing an SOI substrate used for a semiconductor device.
Figure 13B:
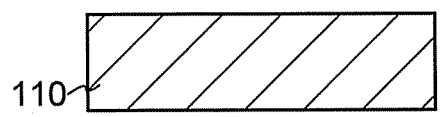
Figure 13C:
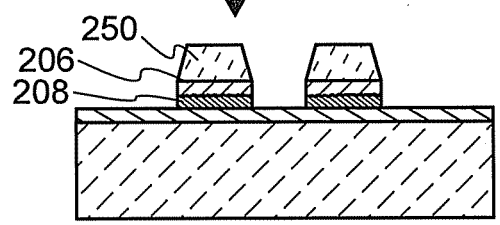
Figure 13F:
Figure 13D:
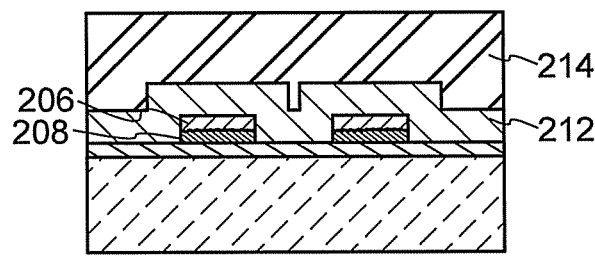

Next, the mask 250 is removed, and then an insulating layer 212 and an insulating layer 214 are formed over the island-shaped light-blocking layers 208 and the insulating layer 206 (see FIG. 13D).

The insulating layer 212 can be formed using, for example, a material such as silicon oxide, silicon nitride, silicon oxynitride, silicon nitride oxide, aluminum nitride, or aluminum oxide. In this embodiment, the insulating layer 212 is formed using a silicon oxide film by a CVD method. Needless to say, an embodiment of the disclosed invention is not limited thereto. A stacked-layer structure with two layers, three layers, or more layers can be employed.

The insulating layer 214 can be formed using, for example, an organic material having flatness such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The following method can be employed as appropriate depending on the material: a method such as a CVD method, a sputtering method, an SOG method, spin coating, dip coating, spray coating, or a droplet discharging method (e.g., ink jetting, screen printing, or offset printing), or with a tool (equipment) such as a doctor knife, a roll coater, a curtain coater, or a knife coater.

Figure 13E:
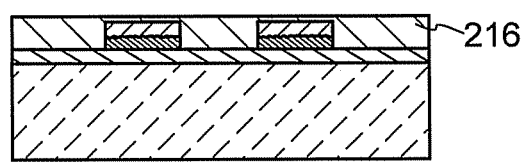

Then, the insulating layer 214 having flatness and the insulating layer 212 which reflects the shape of the island-shaped light-blocking layers 208 and the insulating layer 206 are etched back, so that an insulating layer 216 having flatness is formed (see FIG. 13E). Note that planarization treatment by a CMP method may be performed instead of the etch back. In this embodiment, since the insulating layer 216 having flatness is formed over the island-shaped light-blocking layers 208, the insulating layers 206 is not necessarily provided as long as bonding of the single crystal semiconductor substrate and the base substrate is performed as appropriate.

Figure 13G:
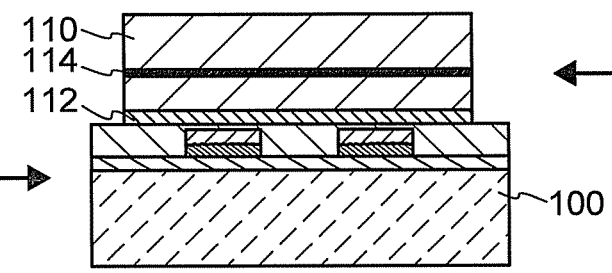

An embrittled region 114 is formed at a predetermined depth from the surface of the single crystal semiconductor substrate 110, and the base substrate 100 and the single crystal semiconductor substrate 110 are bonded together with the insulating layer 202, the insulating layer 216, and the insulating layer 112 therebetween (see FIGS. 13F and 13G).

The insulating layer 112 can be formed with a single layer or a stacked layer of a silicon oxide film, a silicon oxynitride film, and/or the like, for example. The aforementioned embodiment can be referred to for a detailed description thereof.

The embrittled region 114 can be formed by irradiation with ions of hydrogen or the like having kinetic energy to the single crystal semiconductor substrate 110. The aforementioned embodiment can be referred to for a detailed description thereof.

Bonding is performed as follows: the base substrate 100 provided with the island-shaped light-blocking layers 208 and the single crystal semiconductor substrate 110 are disposed in close contact with each other with the insulating layer 202, the insulating layer 216, and the insulating layer 112 therebetween, and then a pressure of from 1 $N/cm^2$ to 500 $N/cm^2$ inclusive is applied to a portion of the base substrate 100 or the single crystal semiconductor substrate 110. Then, the insulating layer 216 and the insulating layer 112 start to be bonded together from the pressure-applied portion, and the bonding spontaneously spreads to the entire area. This bonding is performed under the action of the Van der Waals force or hydrogen bonding and can be performed at room temperature.

Note that before the single crystal semiconductor substrate 110 and the base substrate 100 are bonded together, surfaces to be bonded to each other are preferably subjected to surface treatment. Surface treatment can improve the bonding strength at the bonding interface between the single crystal semiconductor substrate 110 and the base substrate 100. The above embodiment can be referred to for details of the surface treatment.

Note that heat treatment for improving the bonding strength may be performed after the bonding is performed. This heat treatment is performed at a temperature at which separation at the embrittled region 114 does not occur (for example, from room temperature to less than 400° C.). The insulating layer 216 over the base substrate 100 and the insulating layer 112 may be bonded together while being heated at a temperature in this temperature range. The heat treatment can be performed using a diffusion furnace, a heating furnace such as a resistance heating furnace, an RTA apparatus, a microwave heating apparatus, or the like.

Figure 14A:
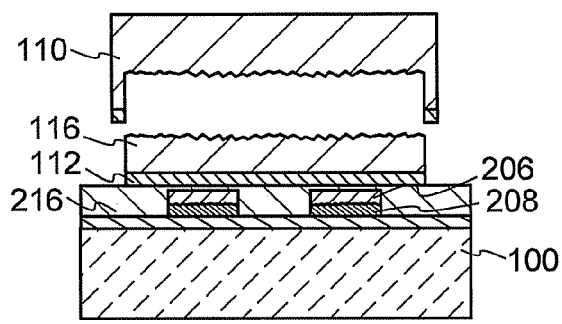
FIGS. 14A to 14F are cross-sectional views illustrating an example of a method for manufacturing an SOI substrate and a semiconductor device.

Next, the single crystal semiconductor substrate 110 is separated at the embrittled region 114 by heat treatment, whereby a single crystal semiconductor layer 116 is formed over the base substrate 100 provided with the light-blocking layers 208 with the insulating layer 112 therebetween (see FIG. 14A). An edge portion of the surface of the single crystal semiconductor substrate 110 is not bonded to the light-transmitting substrate because of its carved surface shape (called edge roll-off) resulting from surface polishing treatment.

When the heat treatment is performed, the element added is separated out, as a molecule, in microvoids which are formed in the embrittled region 114, and the internal pressure of the microvoids is increased. The increased pressure causes a crack in the embrittled region 114, so that the single crystal semiconductor substrate 110 is separated along the embrittled region 114. Because the insulating layer 112 is bonded to the insulating layer 206, the single crystal semiconductor layer 116 which is separated from the single crystal semiconductor substrate 110 remains over the base substrate 100.

Figure 14B:
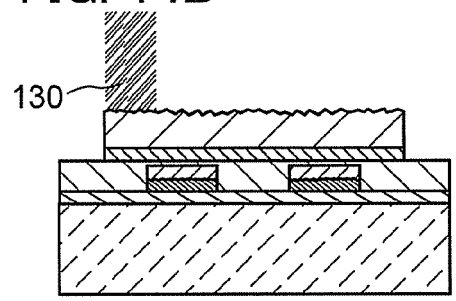
Figure 14C:
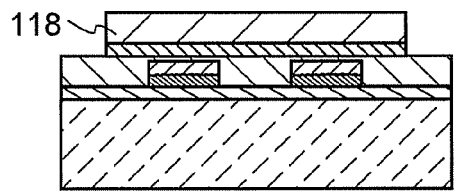

Next, a surface of the single crystal semiconductor layer 116 is irradiated with laser light 130, whereby a single crystal semiconductor layer 118 in which the flatness of the surface is improved and the number of defects is reduced is formed (see FIGS. 14B and 14C). The above embodiment can be referred to for details of the irradiation with the laser beam 130.

Figure 14D:
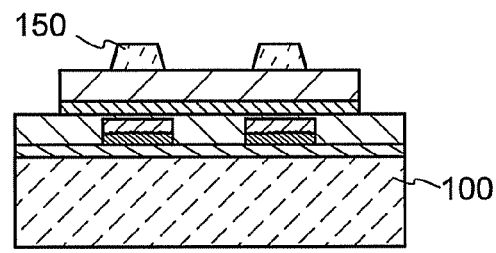
Figure 14E:
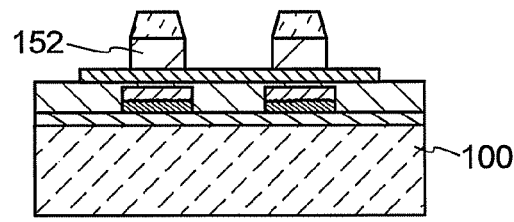
Figure 14F:
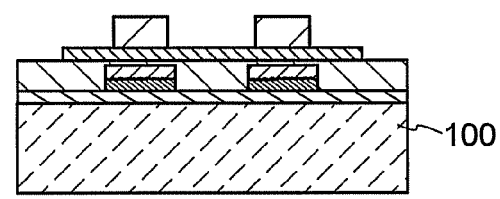

Then, a mask 150 is formed over the single crystal semiconductor layer 118 in a region overlapping with the island-shaped light-blocking layers 208, and the single crystal semiconductor layer 118 is patterned (processed) using the mask 150, so that island-shaped semiconductor layers 152 for the photoelectric conversion element are formed (see FIGS. 14D to 14F). The mask 150 can be formed by photolithography with the use of a resist material or the like. Alternatively, the mask 150 can be formed in such a manner that a resist is formed over the substrate 100, light exposure is performed from a rear surface of the substrate 100 using the light-blocking layers 208 as masks, and then development is performed. As the etching treatment in the patterning, either wet etching or dry etching can be employed. Here, the single crystal semiconductor layer 118 is patterned to form the island-shaped semiconductor layers 152 by dry etching using a mixed gas of $BCl_3$, $CF_4$, and $O_2$ as a reactive gas. It is preferable that the island-shaped semiconductor layers 152 have almost the same shape as the island-shaped light-blocking layers 208 or have a smaller size than the island-shaped light-blocking layers 208. When the island-shaped light-blocking layers 208 are observed from the base substrate 100 side, the island-shaped light-blocking layers 208 are preferably hidden by the island-shaped light-blocking layers 208 completely.

Next, the mask 150 is removed (see FIG. 14F). In this manner, the island-shaped semiconductor layers 152 overlapping with the island-shaped light-blocking layers 208 can be obtained. Next, as described in another embodiment, the photoelectric conversion element is formed using the island-shaped semiconductor layer 152.

In the semiconductor device formed in accordance with the above method, since the island-shaped light-blocking layer 208 is selectively formed over a region overlapping with the island-shaped semiconductor layer 152, direct irradiation of the photoelectric conversion element 180 with light which is transmitted through the light-transmitting substrate can be prevented. Note that a transistor can be formed with the use of the island-shaped semiconductor layer 152 at the same time as formation of the photoelectric conversion element, using some manufacturing steps in common with those of the photoelectric conversion element. Also in this case, by providing the light-blocking layer so as to overlap with an active layer of a transistor, generation of channel leakage current due to light can be suppressed.

In this embodiment, the light-blocking layer is selectively formed on the light-transmitting base substrate side in advance. Therefore, the number of etchings for forming the island-shaped oxide semiconductor layer can be reduced. In addition, since etch back treatment is performed, the surface of the light-transmitting substrate has favorable flatness, and impurities and the like existing on the surface can be removed. As a result, generation of defects in the single crystal semiconductor layer can be suppressed when the single crystal semiconductor layer is formed over the base substrate.

The structure described in this embodiment can be used in appropriate combination with any of the structures described in the other embodiments.

Embodiment 4

In this embodiment, manufacturing steps in a manufacturing method of a semiconductor device provided with a photoelectric conversion element overlapping with a light-blocking layer will be described with reference to FIGS. 15A to 15G, FIGS. 16A to 16H, and FIGS. 17A to 17H. The manufacturing steps are different from those of the above embodiment. In particular, a manufacturing method of a photoelectric conversion element in which a light-blocking layer is formed on a bonding substrate side will be described. Note that the drawings are schematic views. Therefore, needless to say, a scale in the drawings is different from an actual scale in some cases.

Figure 15A:
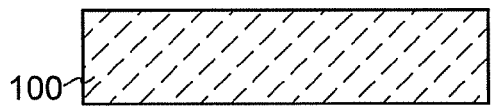
FIGS. 15A to 15G are cross-sectional views illustrating an example of a method for manufacturing an SOI substrate used for a semiconductor device.
Figure 15B:
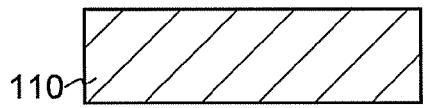

First, a light-transmitting base substrate 100 and a single crystal semiconductor substrate 110 serving as a bonding substrate are prepared (see FIGS. 15A and 15B). The details of the base substrate 100 and the single crystal semiconductor substrate 110, for which the above embodiment can be referred to, are omitted here.

In this embodiment, by subjecting the single crystal semiconductor 110 to thermal oxidation treatment, an insulating layer 112 (here, a silicon oxide film) is formed.

The thermal oxidation treatment is preferably performed in an oxidation atmosphere to which a halogen is added. For example, the single crystal semiconductor layer 110 is subjected to the thermal oxidation treatment in an oxidation atmosphere to which chlorine (Cl) is added, whereby the insulating layer 112 is formed through chlorine oxidation. In this case, the insulating layer 112 is an insulating layer containing chlorine atoms. Note that the insulating layer 112 may include fluorine atoms.

Figure 15C:
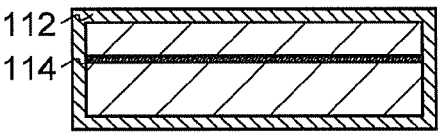

Next, ions accelerated by an electrical field are added to the single crystal semiconductor substrate 110, whereby an embrittled region 114 in which a crystal structure is damaged is formed at a predetermined depth in the single crystal semiconductor substrate 110 (see FIG. 15C). Note that a surface of the single crystal semiconductor substrate 110 and a surface of the insulating layer 112 are preferably cleaned before the treatment for addition of ions. The aforementioned embodiment may be referred to for a detailed description of the addition of ions.

Figure 15D:
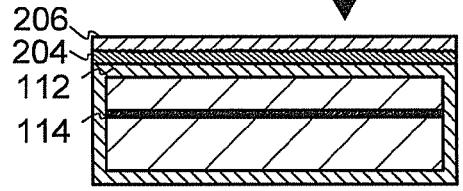

Next, a light-blocking layer 204 and an insulating layer 206 are stacked in this order over the insulating layer 112 (see FIG. 15D).

The light-blocking layer 204 is preferably formed using a film formed of a metal having heat resistance, such as tungsten, molybdenum, tantalum, titanium, niobium, nickel, cobalt, zirconium, or zinc. In particular, molybdenum or tungsten is preferably used. Alternatively, an organic resin containing black colorant such as carbon black or titanium lower oxide can be used. Alternatively, a film using chromium can be used as the light-blocking layer 204. Further, it is preferable that a material which has oxidation resistance in addition to heat resistance be used as the light-blocking layer 204. The light-blocking layer 204 can be formed using a sputtering method, an evaporation method, or the like.

The insulating layer 206 can be formed with a single layer or a stacked layer using, for example, a silicon oxide film, a silicon nitride film, a silicon nitride oxide film, a silicon oxynitride film, an aluminum nitride film, an aluminum oxide film, and/or the like. In particular, aluminum oxide is preferably used for the insulating layer 206. This is because aluminum oxide has favorable adhesion with the light-blocking layer 204. Further, aluminum oxide has favorable flatness and can moderate unevenness of a surface of the light-blocking layer 204. Therefore, the use of aluminum oxide enables favorable bonding between the base substrate 100 and the single crystal semiconductor substrate 110. A thermal oxidation method, a CVD method, a sputtering method, or the like can be employed to manufacture the insulating layer 206.

Figure 15E:
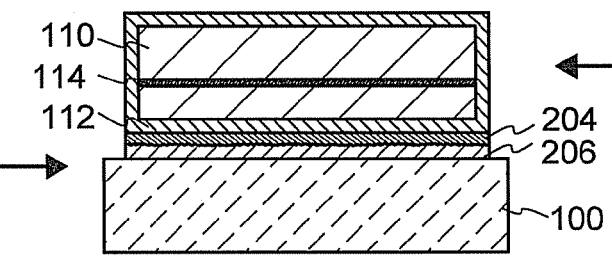

Next, the single crystal semiconductor substrate 110 over which the light-blocking layer 204 and the insulating layer 206 are formed and the base substrate 100 are bonded together (see FIG. 15E).

Bonding is performed as follows: the base substrate 100 and the single crystal semiconductor substrate 110 are disposed in close contact with each other with the insulating layer 112, the light-blocking layer 204, and the insulating layer 206 therebetween, and then a pressure of from 1 N/cm$^2$ to 500 N/cm$^2$ inclusive is applied to a portion of the base substrate 100 or the single crystal semiconductor substrate 110. Then, the base substrate 100 and the insulating layer 206 start to be bonded together from the pressure-applied portion, and the bonding spontaneously spreads to the entire area. This bonding is performed under the action of the Van der Waals force or hydrogen bonding and can be performed at room temperature. Note that an insulating layer containing nitrogen (for example, an insulating layer containing silicon nitride ($SiN_x$), silicon nitride oxide ($SiN_xO_y$)($x>y$)) may be formed over the surface of the base substrate 100. When the insulating layer containing nitrogen is formed, an impurity element such as sodium (Na) contained in the base substrate can be prevented from diffusing into the semiconductor.

Note that before the single crystal semiconductor substrate 110 and the base substrate 100 are bonded together, surfaces to be bonded to each other are preferably subjected to surface treatment. Surface treatment can improve the bonding strength at the bonding interface between the single crystal semiconductor substrate 110 and the base substrate 100. The above embodiment can be referred to for details of the surface treatment.

Note that heat treatment for improving the bonding strength may be performed after the bonding is performed. The above embodiment can be referred to for the details of the heat treatment for improving the bonding strength.

Figure 15F:
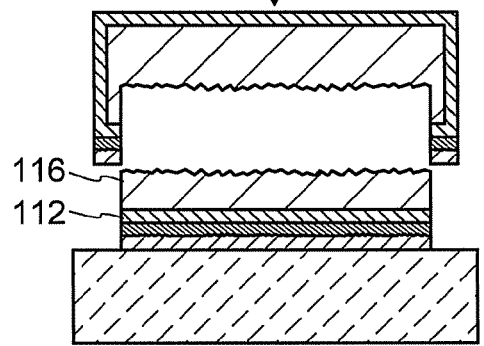
Figure 15G:
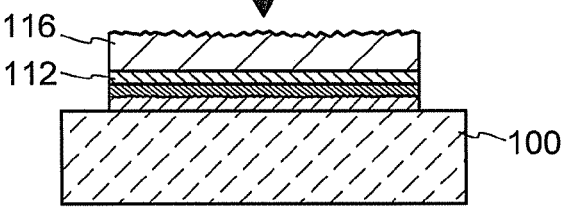

Next, the single crystal semiconductor substrate 110 is separated at the embrittled region 114 by heat treatment, whereby a single crystal semiconductor layer 116 is formed over the base substrate 100 (see FIGS. 15F and 15G).

When the heat treatment is performed, the element added is separated out, as a molecule, in microvoids which are formed in the embrittled region 114, and the internal pressure of the microvoids is increased. The increased pressure causes a crack in the embrittled region 114, so that the single crystal semiconductor substrate 110 is separated along the embrittled region 114. Because the insulating layer 206 is bonded to the base substrate 100, the single crystal semiconductor layer 116 which is separated from the single crystal semiconductor substrate 110 remains over the base substrate 100.

Figure 16A:
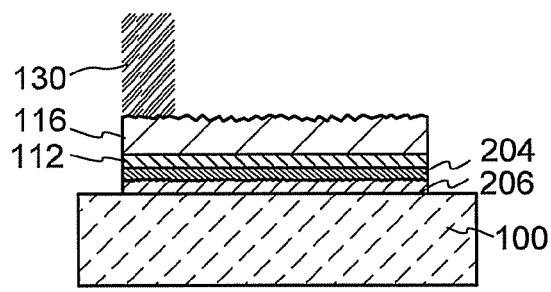
FIGS. 16A to 16H are cross-sectional views illustrating an example of a method for manufacturing an SOI substrate and a semiconductor device.
Figure 16E:
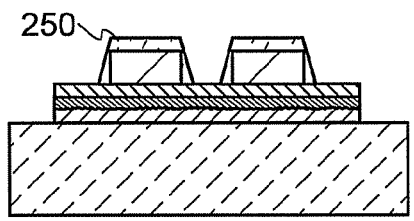
Figure 16B:
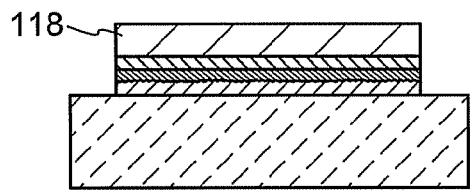

Next, a surface of the single crystal semiconductor layer 116 is irradiated with laser light 130, whereby a single crystal semiconductor layer 118 where the flatness of the surface is improved and the number of defects is reduced is formed (see FIGS. 16A and 16B). The above embodiment can be referred to for details of the irradiation with the laser light 130.

Although the irradiation treatment with the laser beam 130 is performed after the heat treatment for separation of the single crystal semiconductor layer 116 in this embodiment, an embodiment of the disclosed invention is not construed as being limited to this. After the heat treatment for separation of the single crystal semiconductor layer 116, etching treatment may be performed to remove a region including many defects at the surface of the single crystal semiconductor layer 116. Then, the irradiation treatment with the laser light 130 may be performed. Alternatively, after the flatness of the surface of the single crystal semiconductor layer 116 is improved, the irradiation treatment with the laser light 130 may be performed. Note that the etching treatment may be either wet etching or dry etching.

After the irradiation with the laser light 130 is performed as described above, a step of selectively thinning the single crystal semiconductor layer 118 in a region used for an active layer of a transistor may be performed. In order to thin the single crystal semiconductor layer 118, one or a combination of dry etching and wet etching may be employed.

Figure 16F:
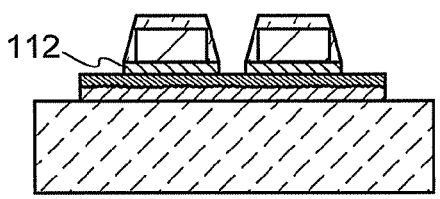
Figure 16C:
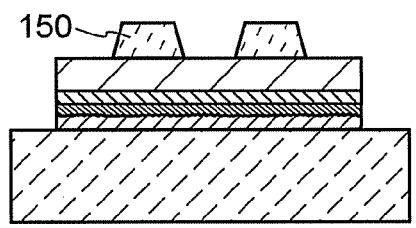
Figure 16G:
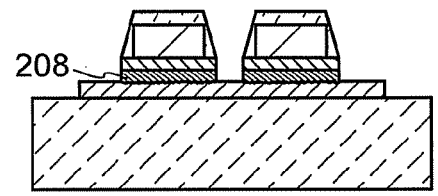
Figure 16D:
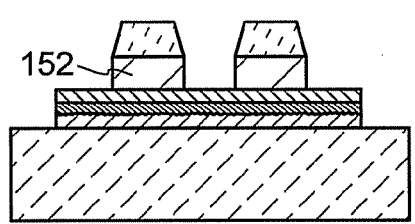
Figure 16H:
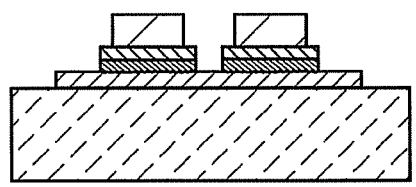

Then, a mask 150 is formed over the single crystal semiconductor layer 118, and the single crystal semiconductor layer 118 is patterned (processed) using the mask 150, so that island-shaped semiconductor layers 152 for the photoelectric conversion element are formed (see FIGS. 16C and 16D). The mask 150 can be formed by photolithography with the use of a resist material or the like. In addition, as the etching treatment in the patterning, either wet etching or dry etching can be employed. Here, the single crystal semiconductor layer 118 is patterned, so that the island-shaped semiconductor layers 152 is formed by dry etching using a mixed gas of $BCl_3$, $CF_4$, and $O_2$ as a reactive gas.

The mask 150 is removed and then a mask 250 is formed so as to cover each of the island-shaped semiconductor layers 152 (see FIG. 16E). The mask 250 can be formed by photolithography with the use of a resist material or the like.

Then, the insulating layer 112 is etched using the mask 250 (see FIG. 16F). As the etching treatment, either wet etching or dry etching can be employed. Here, although dry etching using a mixed gas of $CHF_3$ and He as a reactive gas is employed, this embodiment is not limited thereto.

Next, the light-blocking layer 204 is patterned using the mask 250, so that island-shaped light-blocking layers 208 are formed (see FIG. 16G). As the etching treatment in the patterning, either wet etching or dry etching can be employed. Here, the light-blocking layer 204 is patterned by dry etching using a mixed gas of Cl2, CF4, and O2 as a reactive gas to form the island-shaped light-blocking layers 208; however, this embodiment is not limited thereto. Then, the mask 250 is removed (see FIG. 16H). Thus, the island-shaped semiconductor layers 152 which overlap with the island-shaped light-blocking layers 208 and each have a smaller width than the respective island-shaped light-blocking layers 208 can be obtained. Next, as described in other embodiments, the photoelectric conversion element is formed using the island-shaped semiconductor layers 152

In the semiconductor device formed in accordance with the above method, since the island-shaped light-blocking layers 208 which overlap with the island-shaped semiconductor layers 152 and each have a larger width than the respective island-shaped semiconductor layers 152 are selectively formed, direct irradiation of the photoelectric conversion element 180 with light which is transmitted through the light-transmitting substrate can be prevented. Note that a transistor can be formed with the use of the island-shaped semiconductor layer 152 at the same time as formation of the photoelectric conversion element, using some manufacturing steps in common with those of the photoelectric conversion element. Also in this case, by providing the light-blocking layer so as to overlap with the active layer of the transistor, generation of channel leakage current due to light can be suppressed.

Note that the steps by which the island-shaped semiconductor layer 152 having a smaller width than the island-shaped light-blocking layer 208 is obtained are described here. However, alternatively, after the step of FIG. 16D, the light-blocking layer 204 may be patterned using the mask 150 so that the island-shaped light-blocking layer 208 having almost the same shape as the island-shaped semiconductor layer 152 may be formed as long as a sufficient light blocking effect can be obtained.

Next, a manufacturing method in which arrangement of the light-blocking layer is different from that of FIGS. 16A to 16H will be described with reference to drawings. In particular, a manufacturing method of a semiconductor device in which only part of the light-blocking layer in a region serving as a display portion of a touch panel is removed so that an opening portion is formed will be described with reference to FIGS. 17A to 17H.

Figure 17A:
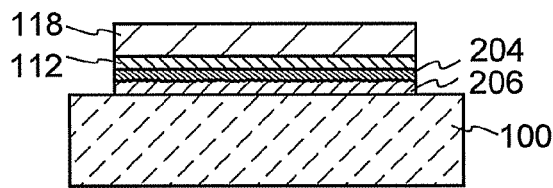
FIGS. 17A to 17H are cross-sectional views illustrating an example of a method for manufacturing a semiconductor device.
Figure 17B:
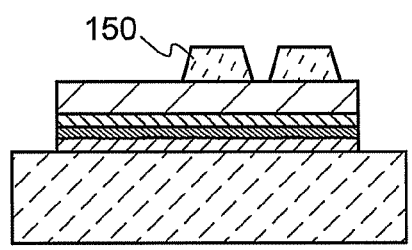
Figure 17C:
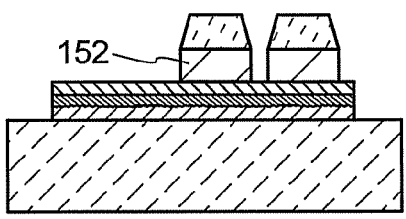
Figure 17D:
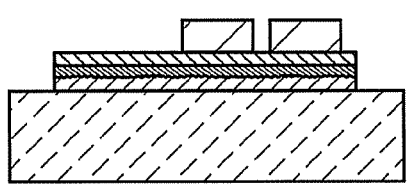
Figure 17E:
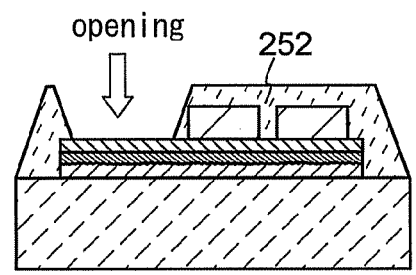
Figure 17F:
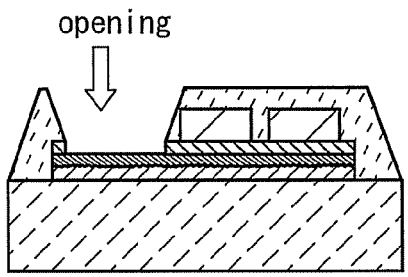

FIG. 17A corresponds to FIG. 16B. FIGS. 15A to 15G, FIGS. 16A to 16D, and the description thereof can be referred to for steps from formation of the single crystal semiconductor layer 118 over the light-blocking layer 204 up to formation of the island-shaped semiconductor layers 152 with the use of the mask 150. Accordingly, the island-shaped semiconductor layers 152 are formed over the base substrate 100 provided with the light-blocking layer 204 (see FIG. 17D).

Next, a mask 252 is formed in a region (the opening portion) other than the region serving as the display portion of the touch panel so as to cover the island-shaped oxide semiconductor layers 152. Etching is performed using the mask 252 to remove the insulating layer 112 in the opening portion (see FIGS. 17E and 17F). As the etching treatment, either wet etching or dry etching can be employed. Here, although dry etching using a mixed gas of CHF$_3$ and He as a reactive gas is employed, this embodiment is not limited thereto.

Figure 17G:
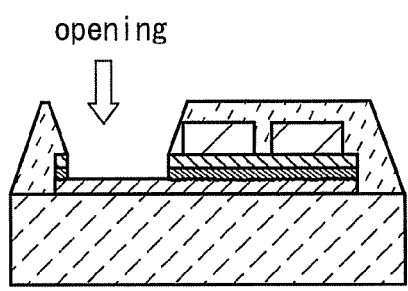
Figure 17H:
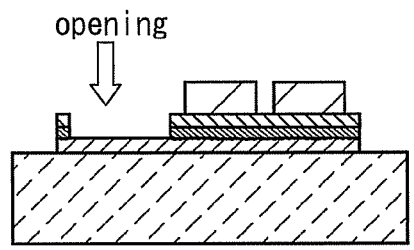

Next, the light-blocking layer 204 is etched using the mask 250 (see FIG. 17G). As etching treatment in the patterning, either wet etching or dry etching can be employed. Here, dry etching is performed using a mixed gas of Cl$_2$, CF$_4$, and O$_2$ as a reactive gas. Then, the mask 252 is removed (see FIG. 17H). Thus, the light-blocking layer in only the region serving as the display portion is removed, whereby the semiconductor device in which the light-blocking layer is provided in a region overlapping with the island-shaped semiconductor layer 152 can be obtained.

In this embodiment, the light-blocking layer is formed on the single crystal semiconductor substrate side, and the insulating layer over the light-blocking layer and the light-transmitting base substrate are bonded together. Therefore, since favorable bonding can be performed without formation of an insulating layer over the base substrate, the number of insulating layers can be reduced by one as compared to the case where a light-blocking layer is formed on the base substrate side and thus, the number of the manufacturing steps can be reduced.

The structure described in this embodiment can be used in appropriate combination with any of the structures described in the other embodiments.

Embodiment 5

In this embodiment, one example of a semiconductor device and a manufacturing method thereof will be described with reference to drawings. In particular, a semiconductor device provided with a photoelectric conversion element and a transistor and a manufacturing method of the semiconductor device will be described. Note that the size of each element can be determined in accordance with characteristics required.

[Structure]

Figure 18A:
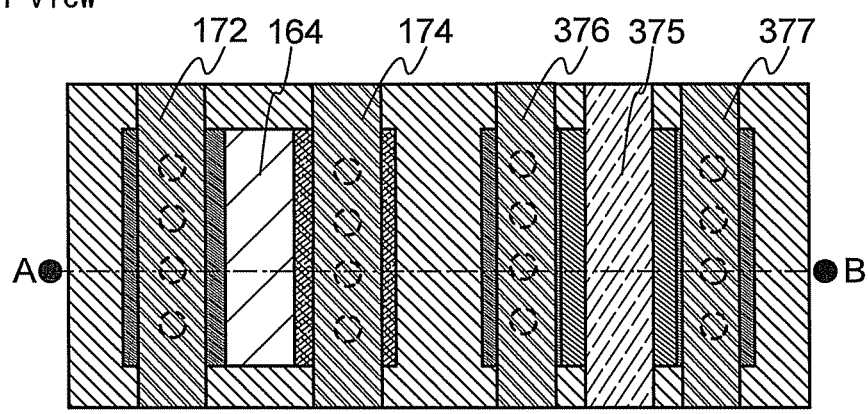
FIG. 18A is a plan view and FIG. 18B is a cross-sectional view illustrating an example a semiconductor device.
Figure 18B:
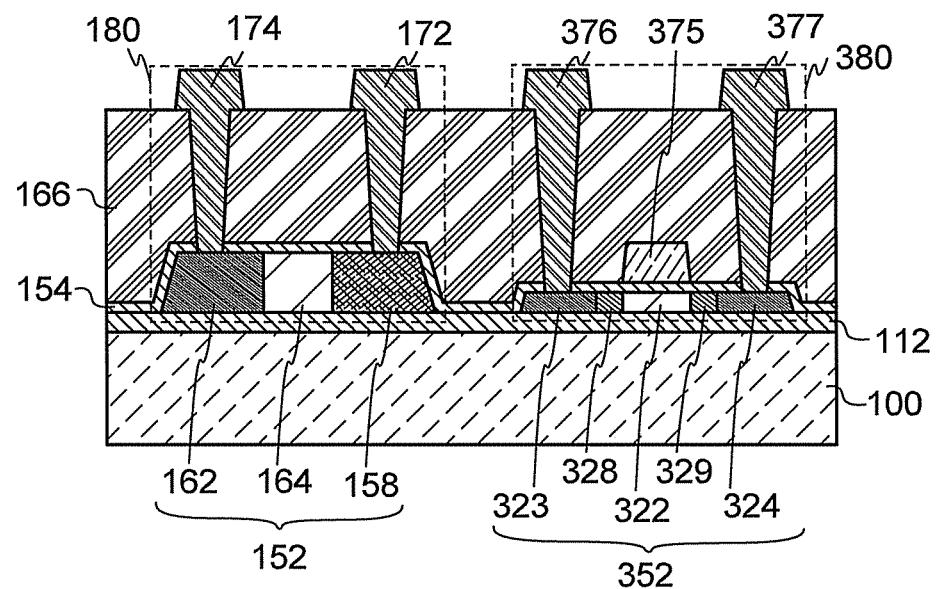

A photoelectric conversion element 180 and a transistor 380 which relate to an embodiment of the disclosed invention are provided over a light-transmitting base substrate 100 (see FIGS. 18A and 18B). Here, FIG. 18B corresponds to a cross section along A-B in FIG. 18A.

The photoelectric conversion element 180 includes a first island-shaped single crystal semiconductor layer 152 including a semiconductor region 164 having an effect of photoelectric conversion, a semiconductor region 158 having a first conductivity type (p-type conductivity, here), and a semiconductor region 162 having a second conductivity type (n-type conductivity, here); an insulating layer 154 and an insulating layer 166 which are formed so as to cover the first island-shaped single crystal semiconductor layer 152; a first electrode 172 electrically connected to the semiconductor region 158 having the first conductivity type; and a second electrode 174 electrically connected to the semiconductor region 162 having the second conductivity type. Here, the semiconductor region 158 having the first conductivity type and the semiconductor region 162 having the second conductivity type are adjacent to the semiconductor region 164 having an effect of photoelectric conversion and separated by the semiconductor region 164 having an effect of photoelectric conversion. Needless to say, the first conductivity type and the second conductivity type can be interchanged with each other.

The transistor 380 includes a second island-shaped single crystal semiconductor layer 352 including a channel formation region 322, a source region 323, a drain region 324, an LDD region 328, and an LDD region 329; the insulating layer 154 functioning as a gate insulating film over the second single crystal semiconductor layer 352; a gate electrode 375 over the insulating layer 154; the insulating layer 166 covering the gate electrode 375; an electrode 376 electrically connected to the source region 323; and an electrode 377 electrically connected to the drain region 324. Note that the transistor 380 including the LDD region 328 and the LDD region 329 is described as an example in this embodiment; however, an embodiment of the disclosed invention is not limited thereto. The LDD regions are not necessarily provided. In addition, although an example in which the LDD regions do not overlap with the gate electrode when seen from the above is described in this embodiment, a structure in which the LDD regions overlap with the gate electrode may be employed alternatively.

Here, the thickness of the first single crystal semiconductor layer 152 included in the photoelectric conversion element 180 is larger than that of the second single crystal semiconductor layer 352 included in the transistor 380. For example, the thickness of the second single crystal semiconductor layer 352 is 5 nm to 100 nm inclusive, and the thickness of the first single crystal semiconductor layer 152 can be larger than that of the second single crystal semiconductor layer 352. If the thickness of the second single crystal semiconductor layer 352 is larger than 100 nm, leakage current of the transistor in an off state is sometimes largely increased when the transistor is irradiated with light. Therefore, it is preferable that the thickness of the second single crystal semiconductor layer 352, which is used for the transistor, be small. The thickness of the first single crystal semiconductor layer 152 can be, for example, 100 nm to 1000 nm inclusive.

When the thickness of the first single crystal semiconductor layer 152 is large, photoelectric conversion efficiency is improved. Accordingly, sensitivity as an optical sensor is improved. In addition, an optical sensor can be miniaturized. Further, response of an optical sensor is improved, and for example, in the case where the optical sensor is used for a touch panel, response speed of the touch panel is improved and thus operability thereof is improved. Furthermore, when a single crystal semiconductor used, photoelectric conversion efficiency is improved. In addition, when the thickness of the second single crystal semiconductor layer 352 is small, leakage current of the transistor in an off state can be reduced. When the thickness of the second single crystal semiconductor layer 352 is small, short channel effect in a device having a small channel length can be suppressed. In addition, the transistor can operate even when the transistor is a fully depleted type. In addition, drain withstand voltage can be increased. Further, when a single crystal semiconductor is used, electric characteristics of the transistor can be improved.

In this manner, in the semiconductor device provided over the light-transmitting base substrate 100, leakage current of the transistor 380 in an off state can be reduced and the photoelectric conversion efficiency of the photoelectric conversion element 180 can be improved when the thickness of the first single crystal semiconductor layer 152 included in the photoelectric conversion element 180 is larger than the thickness of the second single crystal semiconductor layer 352 included in the transistor 380, as compared to the case where the first single crystal semiconductor layer 152 and the second single crystal semiconductor layer 352 have the same thickness.

An insulating layer 112 is provided between the base substrate 100, and the photoelectric conversion element 180 and the transistor 380. The insulating layer has a function of fixing the photoelectric conversion element 180 and the transistor 380 to the base substrate 100.

The photoelectric conversion element 180 operates as described in Embodiment 1. Current depends on the intensity of light, which can be utilized for an optical sensor. In addition, electric generating system can be obtained by extracting an electromotive force due to light to the outside of the photoelectric conversion element.

Here, the crystallinity of the island-shaped semiconductor layer included in the photoelectric conversion element and the transistor is preferably a single crystal. At least the crystallinity of the semiconductor region 164 having an effect of photoelectric conversion included in the photoelectric conversion element and the crystallinity of the channel formation region 322 included in the transistor are preferably a single crystal. As a semiconductor material of the single crystal, single crystal silicon can be used. When a single crystal semiconductor is used in a photoelectric conversion element, dark current (current when light irradiation is not performed) can be reduced as compared to the case of using an amorphous semiconductor or a polycrystalline semiconductor. Further, with the use of a single crystal semiconductor in a photoelectric conversion element, current when light irradiation is performed can be increased as compared to the case of using a polycrystalline semiconductor. Accordingly, sensitivity as an optical sensor is improved. In addition, an optical sensor can be miniaturized. In addition, with the use of a single crystal semiconductor, photoelectric conversion efficiency is improved. These effects can be obtained since a trap of photogenerated carriers due to defects and the like can be sufficiently suppressed. Thus, a single crystal semiconductor, electric characteristics of the transistor can be improved.

In addition, as described in this embodiment, because of a light-transmitting property of the base substrate, a structure in which light enters from the base substrate side can be employed. In this case, the degree of freedom of element layout is improved as compared to the case where light of the object enters from an electrode (or a wiring) side. In this manner, when the base substrate has a light-transmitting property, there is an advantage that integration can be performed easily as compared to the case of a base substrate which does not have a light-transmitting property.

[Manufacturing Steps of the Photoelectric Conversion Element and the Transistor]

Figure 19A:
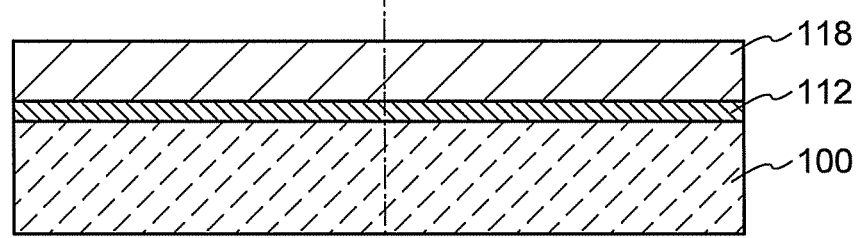
FIGS. 19A to 19D are cross-sectional views illustrating an example of a method for manufacturing a semiconductor device.

Next, the manufacturing steps of the photoelectric conversion element 180 and the transistor 380 will be described. First, an SOI substrate in which the insulating layer 112 and a single crystal semiconductor layer 118 are provided over the base substrate 100 in accordance with the manufacturing steps of an SOI substrate described in Embodiment 1 is prepared (see FIG. 19A).

A small quantity of a p-type impurity element such as boron, aluminum, or gallium, or a small quantity of an n-type impurity element such as phosphorus or arsenic may be added to the single crystal semiconductor layer 118. A region to which the impurity element is added and the kind of the impurity element which is added to the region can be changed as appropriate. In addition, a timing of adding the impurity element can be changed as appropriate. It is preferable that an impurity be added to a semiconductor region for a transistor so that electric characteristics such as a threshold value are controlled. On the other hand, the impurity is not necessarily added to the semiconductor region having an effect of photoelectric conversion.

Figure 19B:
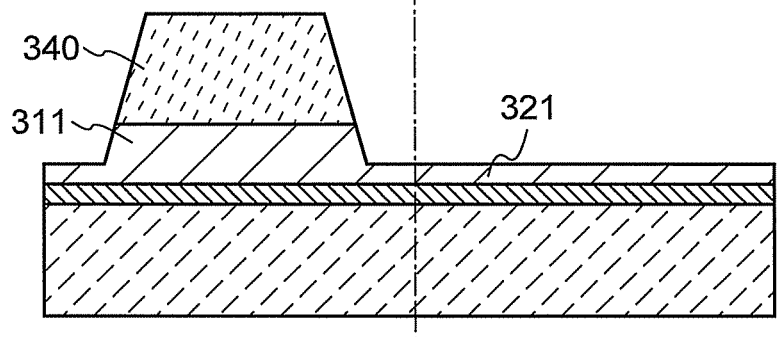

Then, a mask 340 is formed over the single crystal semiconductor layer 118. By etching with the use of the mask 340, the thickness of the single crystal semiconductor layer is partly reduced, so that a first single crystal semiconductor region 311 covered with the mask 340 and a second single crystal semiconductor region 321 having a smaller thickness than the first single crystal semiconductor region 311 are formed (see FIG. 19B). In the step of thinning the film, the mask 340 can be formed by photolithography using a resist material or the like. Further, as the etching treatment, either wet etching or dry etching can be employed.

Note that the step of adding an impurity for controlling a threshold value may be performed after the step of thinning the film. A region whose thickness is reduced and a region to which an impurity for controlling a threshold value is added are transistor formation regions. Therefore, these steps can be performed using one mask. For example, the impurity for controlling a threshold value can be added with the use of the mask 340 for the step of thinning the film.

Figure 19C:
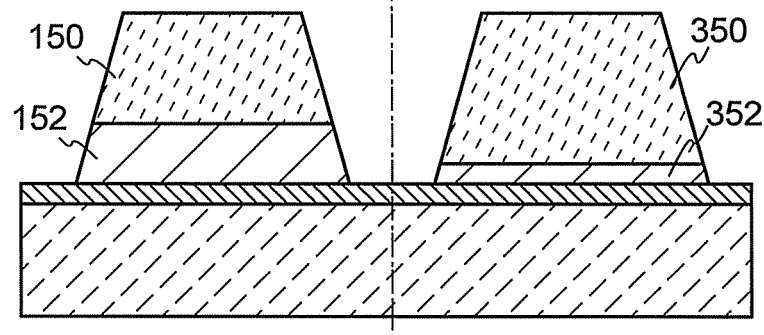

After that, a mask 150 and a mask 350 are formed over the first single crystal semiconductor region 311 and the second single crystal semiconductor region 321, and the first single crystal semiconductor region 311 and second single crystal semiconductor region 321 are patterned using the mask 150 and the mask 350. In this manner, the first island-shaped semiconductor layer 152 used for the photoelectric conversion element and the second island-shaped semiconductor layer 352 used for the transistor are formed (see FIG. 19C). The mask 150 and the mask 350 are formed in a manner similar to that of the mask 340 or the like.

Note that the step of thinning the film may be performed after formation of the island-shaped semiconductor layers. Alternatively, the first and second island-shaped semiconductor layers can be formed as follows so that the second island-shaped semiconductor layer has smaller thickness than the first island-shaped semiconductor layer: a first mask and a second mask having a smaller thickness than the first mask are formed as masks for forming the island-shaped semiconductor layers by using a half-tone mask; the first island-shaped semiconductor layer and the second island-shaped semiconductor layer are formed using the first mask and the second mask, and the island-shaped semiconductor layers are etched while ashing of the first mask and the second mask is performed.

Figure 19D:
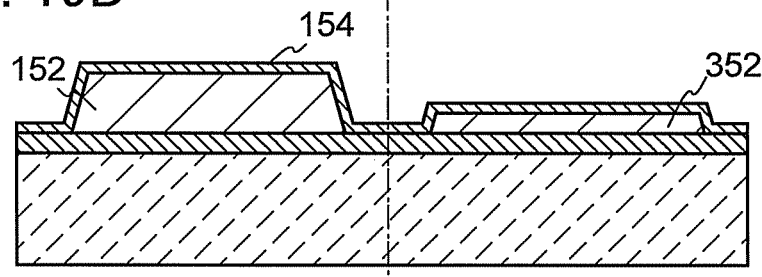

Next, the insulating layer 154 is formed so as to cover the semiconductor layer 152 and the semiconductor layer 352 (see FIG. 19D). The insulating layer 154 over the semiconductor layer 352 functions as the gate insulating film. The insulating layer 154 is not necessarily formed over the semiconductor layer 152. However, in the case where the insulating layer 154 is formed over the semiconductor layer 152, damage to the semiconductor layer 152 in the step of addition of the impurity performed later can be suppressed. Note that a single-layer silicon oxide film is formed by a plasma CVD method in this embodiment. Alternatively, a film containing silicon oxynitride, silicon nitride oxide, silicon nitride, hafnium oxide, aluminum oxide, tantalum oxide, or the like may be formed with a single-layer structure or a stacked-layer structure.

Figure 20A:
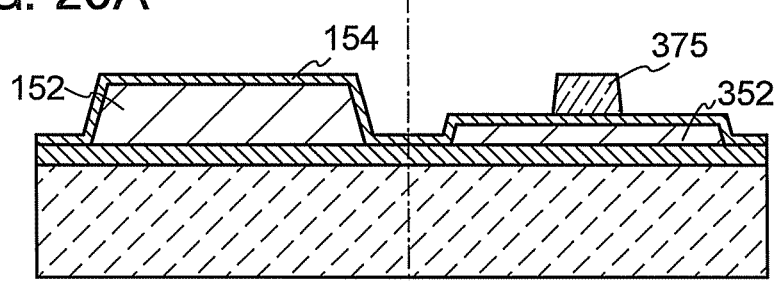
FIGS. 20A to 20D are cross-sectional views illustrating an example of a method for manufacturing a semiconductor device.

Then, a conductive film is formed over the insulating layer 154 and processed (patterned) to a predetermined shape, so that the electrode 375 functioning as a gate electrode of the transistor is formed above the semiconductor layer 352 (see FIG. 20A). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Still alternatively, a semiconductor material, such as polycrystalline silicon which is obtained by doping a semiconductor with an impurity element that imparts a conductivity type, may be used.

The electrode 375 may be formed using a single-layer conductive film or a stacked-layer conductive film of a plurality of films. In this embodiment, the electrode 375 is formed with a two-layer structure in which a titanium nitride film is used as a bottom layer and a tungsten film is used as a top layer. In the case of a two-layer structure, for example, a molybdenum film, a titanium film, a titanium nitride film, or the like may be used as a bottom layer, and an aluminum film, a tungsten film or the like may be used as a top layer. In the case of a three-layer structure, a stacked structure of a molybdenum film, an aluminum film, and a molybdenum film; a stacked-layer structure of a titanium film, an aluminum film, and a titanium film; or the like may be used. As the etching treatment, dry etching can be employed, for example; however, an embodiment of the disclosed invention is not limited thereto.

Note that a mask used for forming the electrode 375 may be formed using a material such as silicon oxide or silicon nitride oxide. In this case, a step of forming a mask by patterning a silicon oxide film, a silicon nitride oxide film, or the like is additionally needed. Reduction in film thickness of the mask in etching is smaller than that in the case of using a resist material; thus, the electrode 375 with a more precise shape can be formed. Alternatively, the electrode 375 may be formed to have an appropriate pattern by a droplet discharge method without using a mask. Here, a droplet discharge method refers to a method in which droplets containing a predetermined composition are discharged or ejected to form a predetermined pattern, and includes an ink-jet method and the like in its category.

Alternatively, the electrode 375 can be formed by etching the conductive film to have a desired tapered shape with an inductively coupled plasma (ICP) etching method with appropriate adjustment of etching conditions (e.g., the amount of electric power applied to a coiled electrode, the amount of electric power applied to a substrate-side electrode, the temperature of the substrate-side electrode, and the like). The tapered shape can be adjusted according to the shape of the mask. Note that as an etching gas, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 23A:
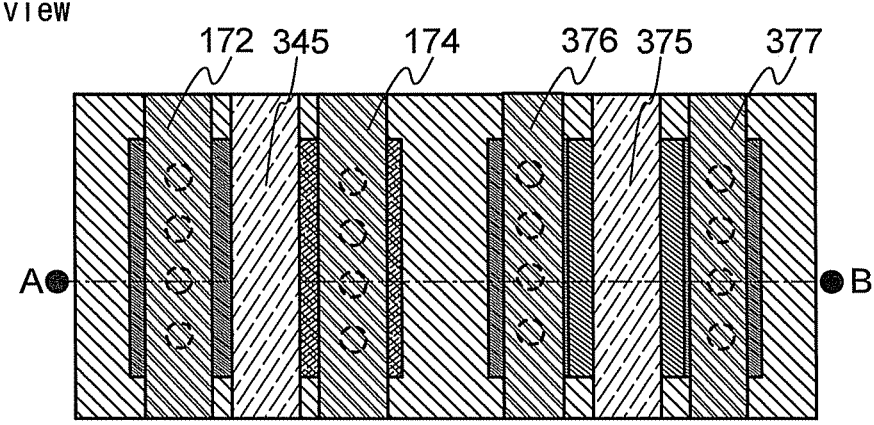
FIG. 23A is a plan view and FIG. 23B is a cross-sectional view illustrating an example a semiconductor device.
Figure 23B:
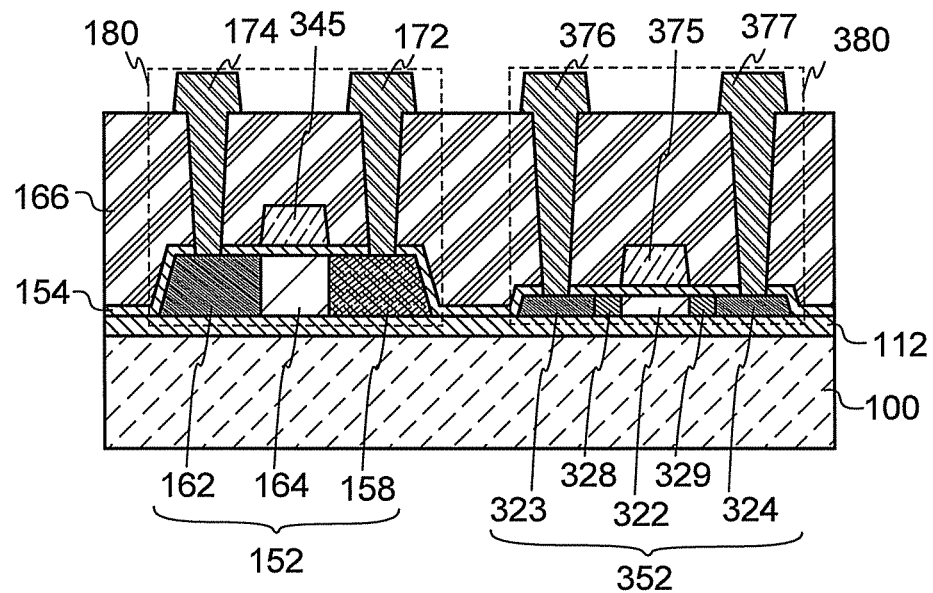

Note that an electrode 345 may be formed above the semiconductor layer 152 in the same step as formation of the electrode 375 functioning as the gate electrode of the transistor over the semiconductor layer 352 (see FIGS. 23A and 23B). Here, FIG. 23B corresponds to a cross section taken along line A-B of FIG. 23A. When the electrode 345 is provided to be over and overlap with the semiconductor layer 152 included in the photoelectric conversion element, light which enters the photoelectric conversion element from the above can be prevented from directly striking the semiconductor region 164 having an effect of photoelectric conversion. When the semiconductor region 158 having the first conductivity type and the semiconductor region 162 having the second conductivity type are formed in the semiconductor layer 152, the electrode 345 can be used as part of a mask for addition of an impurity element. In addition, by controlling the potential of the electrode 345, characteristics of the photoelectric conversion element can be controlled. In particular, the potential is preferably applied so that the photoelectric conversion element is depleted.

Then, a mask 356 is formed over the insulating layer 154 to cover the semiconductor layer 152, and an impurity element imparting the second conductivity type is added to part of the semiconductor layer 352 using the mask 356 and the electrode 375 as masks. The mask 356 may be formed in a manner similar to that of the mask 340 or the like.

Specifically, as the addition of the impurity element, for example, phosphorus may be added using $PH_3$ as a source gas at an accelerating voltage of 40 kV with a dosage of $1.0 \times 10^{13}$ cm$^{-2}$. The conditions of the addition of the impurity element can be changed as appropriate depending on required characteristics. After formation of an impurity region 358, the mask 356 is removed.

Figure 20B:
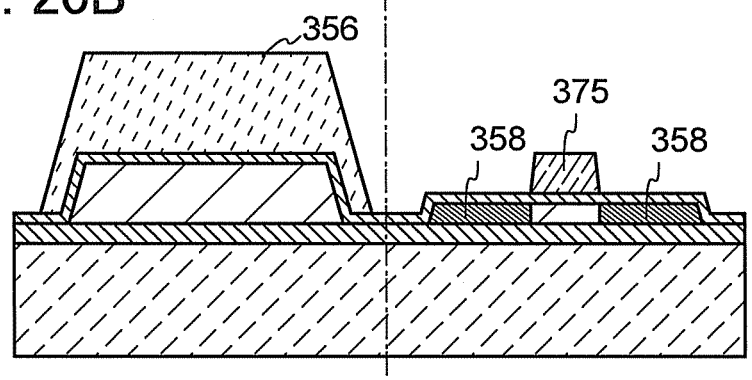

Thus, the impurity region 358 having the second conductivity type is formed (see FIG. 20B). Part of the impurity region 358 functions as LDD regions. In this embodiment, phosphorus is used as the impurity element imparting the second conductivity type and thus, the second conductivity type is n-type; however, an embodiment of the disclosed invention is not limited thereto.

Note that although the LDD regions are included in this example, an embodiment of the disclosed invention is not limited thereto. The LDD regions are not necessarily provided. In this case, the step of forming the impurity region 358 is not needed. Here, an example in which the impurity region 358 serving as the LDD regions is formed using the gate electrode 375 as the mask is described here; however, an embodiment of the disclosed invention is not limited thereto.

The gate electrode may be formed after the impurity region 358 serving as the LDD regions. In this case, a structure in which the LDD region overlaps with the gate electrode can be employed.

Figure 20C:
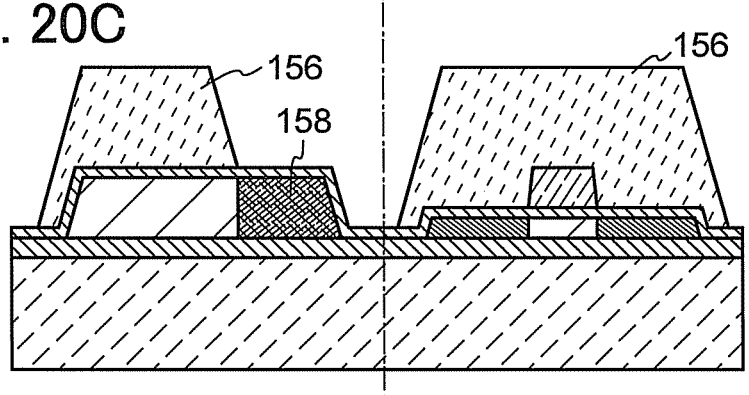

Next, a mask 156 is formed over the insulating layer 154 to cover the semiconductor layer 352 and partly cover the semiconductor layer 152, and then an impurity element imparting the first conductivity type is added to part of the semiconductor layer 152. Accordingly, the semiconductor region 158 having the first conductivity type is formed (see FIG. 20C). Here, boron is added as the impurity element imparting the first conductivity type and thus, the first conductivity is p-type; however, an embodiment of the disclosed invention is not limited thereto. Aluminum or the like may be used as the impurity element imparting the first conductivity type. Alternatively, in the case where the first conductivity type is n-type, phosphorus, arsenic, or the like can be used. The mask 156 may be formed in a manner similar to that of the mask 340 or the like.

Specifically, for example, boron may be added using $B_2H_6$ as a source gas at an accelerating voltage of 40 kV with a dosage of $1.0 \times 10^{16}$ cm$^{-2}$. The conditions of the addition of the impurity element can be changed as appropriate depending on required characteristics. Dart current tends to be reduced when a dosage is reduced in a photoelectric conversion element. This is because damage is small when an impurity element is added with a low-dosage condition, so that current due to defects is not generated while damage of the semiconductor layer 152 is large when an impurity element is added with a high dosage so that a carrier trap due to defects is generated. On the other hand, it is preferable that a dosage be large so that resistance may be small in the transistor. Therefore, the impurity addition step of the photoelectric conversion and that of the transistor may be performed separately depending on required characteristics. Note that after the semiconductor region 158 having the first conductivity type is formed, the mask 156 is removed.

Note that in the case where a p-channel transistor is formed as the transistor, an impurity region of the p-channel transistor can be formed at the same timing as formation of the semiconductor region 158 having the first conductivity type.

Figure 20D:
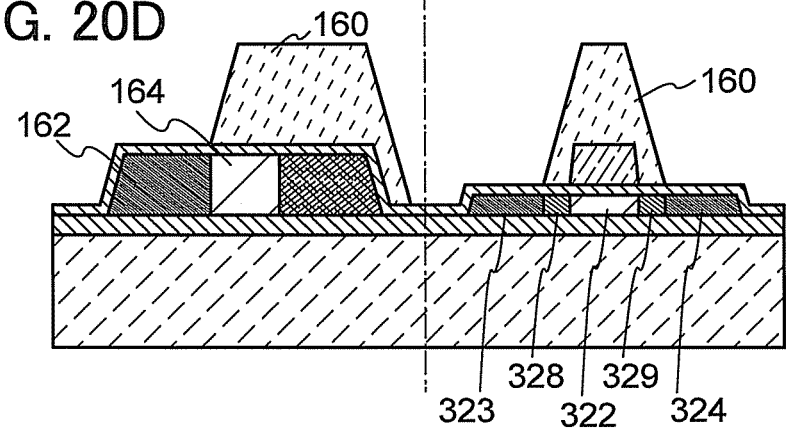

After that, a mask 160 is formed over the insulating layer 154 to partly cover the semiconductor layer 152 and the semiconductor layer 352, and then an impurity element imparting the second conductivity type is added to part of the semiconductor layer 152 and part of the semiconductor layer 352. Note that the impurity element imparting the same conductivity type as the impurity element which is added in the previous step is added to the semiconductor layer 352 at a higher concentration. Thus, the semiconductor region 162 having the second conductivity type is formed in the semiconductor layer 152 used for the photoelectric conversion element, and at the same time, the semiconductor region 164 having an effect of photoelectric conversion, to which an impurity element having the first conductivity type and an impurity element having the second conductivity type are not added, is formed. In addition, in the semiconductor layer 352 used for the transistor, the source region 323 and the drain region 324 which have the second conductivity type are formed, the LDD region 328 and the LDD region 329 are formed in the impurity region 358 which is covered with the mask 160, and the channel formation region 322 is formed between the LDD region 328 and the LDD region 329 (see FIG. 20D). The second conductivity type is different from the first conductivity type. In other words, when the first conductivity type is p-type, the second conductivity type is n-type; whereas when the first conductivity type is n-type, the second conductivity type is p-type. Here, phosphorus is used as an impurity element imparting the second conductivity type and thus, the second conductivity type is n-type. As the impurity element imparting n-type conductivity, arsenic can be used in addition to phosphorus. The mask 160 may be formed in a manner similar to that of the mask 340 or the like.

Specifically, for example, phosphorus may be added using $PH_3$ as a source gas at an accelerating voltage of 40 kV with a dosage of $5.0 \times 10^{15}$ cm$^{-2}$. The conditions of the addition of the impurity element can be changed as appropriate depending on required characteristics. In a manner similar to the case of addition of the impurity element imparting the first conductivity type, dark current in the photoelectric conversion element can be suppressed when the dosage is reduced. After the semiconductor region 162 having the second conductivity type is formed, the mask 160 is removed.

Note that addition of the impurity element imparting the first conductivity type and addition of the impurity element imparting the second conductivity type, which are described above, are performed so that a width of the semiconductor region 164 having an effect of photoelectric conversion is 0.1 μm to 20 μm, preferably 3 μm to 10 μm. Needless to say, if processing accuracy of the mask 156 and the mask 160 permits, the width of the semiconductor region 164 can be 0.1 μm or smaller.

Figure 21A:
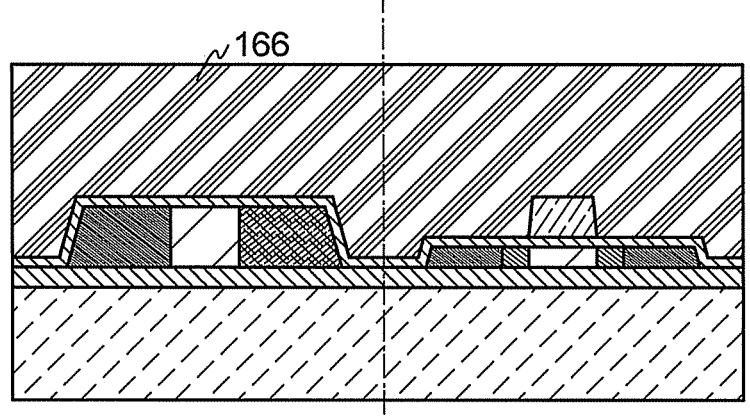
FIGS. 21A to 21C are cross-sectional views illustrating an example of a method for manufacturing an SOI substrate and a semiconductor device.

Next, the insulating layer 166 is formed so as to cover the semiconductor layer 152, the semiconductor layer 352, the electrode 375, and the insulating layer 154 (see FIG. 21A). Although the insulating layer 166 is not necessarily provided over the semiconductor layer 152 used for the photoelectric conversion element, when the insulating layer 166 is formed, an impurity such as an alkali metal or an alkaline earth metal can be prevented from entering the semiconductor layer 152. In addition, a surface of the photoelectric conversion element to be formed can be planarized. Further, when one insulating layer is formed over the semiconductor layer 152 used for the photoelectric conversion element and the semiconductor layer 352 used for the transistor, conditions in forming contact holes can be uniform.

Figure 21B:
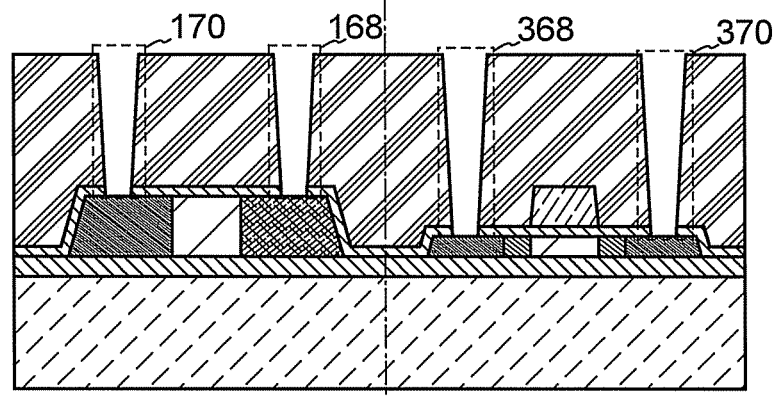

Next, a contact hole 168, a contact hole 170, a contact hole 368, and a contact hole 370 are formed in the insulating layer 154 and the insulating layer 166 so that the semiconductor layer 152 and the semiconductor layer 352 are partly exposed (see FIG. 21B). Here, specifically, the contact hole 168 and the contact hole 170 are formed so that the semiconductor region 158 having the first conductivity type and the semiconductor region 162 having the second conductivity type are partly exposed. In addition, the contact hole 368 and the contact hole 370 are formed so that the source region 323 and the drain region 324 are exposed. The contact hole 168, the contact hole 170, the contact hole 368, and the contact hole 370 can be formed by etching treatment or the like after selective formation of the mask. As the etching treatment, dry etching using a mixed gas of $CHF_3$ and He as an etching gas can be employed, for example; however, an embodiment of the disclosed invention is not limited thereto.

Figure 21C:
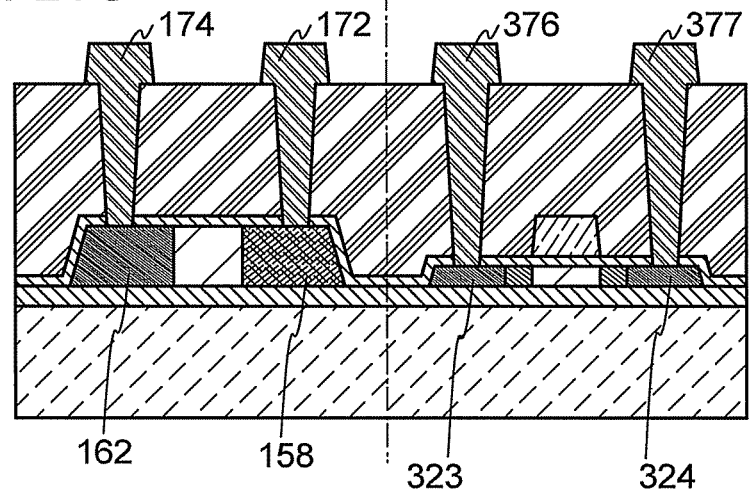

A conductive layer which is in contact with the semiconductor layer 152 and the semiconductor layer 352 through the contact holes is formed and then patterned, so that the first electrode 172, the second electrode 174, the electrode 376, and the electrode 377 are formed (see FIG. 21C). The conductive layer from which the first electrode 172, the second electrode 174, the electrode 376, and the electrode 377 are formed can be formed by a CVD method, a sputtering method, an evaporation method, or the like. Specifically, as a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Note that the conductive layer may have a single-layer structure or a stacked-layer structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the first electrode 172, the second electrode 174, the electrode 376, and the electrode 377. In particular, aluminum silicon is preferable because a hillock can be prevented from generating due to resist baking at the time of patterning. Further, a material in which Cu is mixed into aluminum at approximately 0.5% may be used instead of silicon.

In the case where the conductive layer is formed with a stacked-layer structure so that each of the first electrode 172, the second electrode 174, the electrode 376, and the electrode 377 has a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming the conductive films such that an aluminum silicon film is interposed between barrier films, generation of hillocks of aluminum or aluminum silicon can be further prevented. When a barrier film is formed using titanium, which is an element having a high reducing property, even if a thin oxide film is formed over the semiconductor region 158 having the first conductivity type, the semiconductor region 162 having the second conductivity type, the source region 323, and the drain region 324, the oxide film is reduced by titanium contained in the barrier film, so that favorable contacts between the semiconductor region 158 having the first conductivity type and the first electrode 172, between the semiconductor region 162 having the second conductivity type and the second electrode 174, between the source region 323 and the electrode 376, and between the drain region 324 and the electrode 377 can be obtained. Alternatively, it is also possible to stack a plurality of barrier films. In that case, for example, a five-layer structure of titanium, titanium nitride, aluminum silicon, titanium, and titanium nitride which are stacked from the bottom, or a stacked-layer structure of more than five layers can be employed.

As the conductive layer, tungsten silicide formed by a chemical vapor deposition method using a $WF_6$ gas and a $SiH_4$ gas may be used. Alternatively, tungsten formed by hydrogen reduction of $WF_6$ may be used for the conductive layer.

In this manner, the photoelectric conversion element 180 and the transistor 380 are formed over the light-transmitting base substrate 100.

[Characteristics of the Photoelectric Conversion Element]

Figure 22:
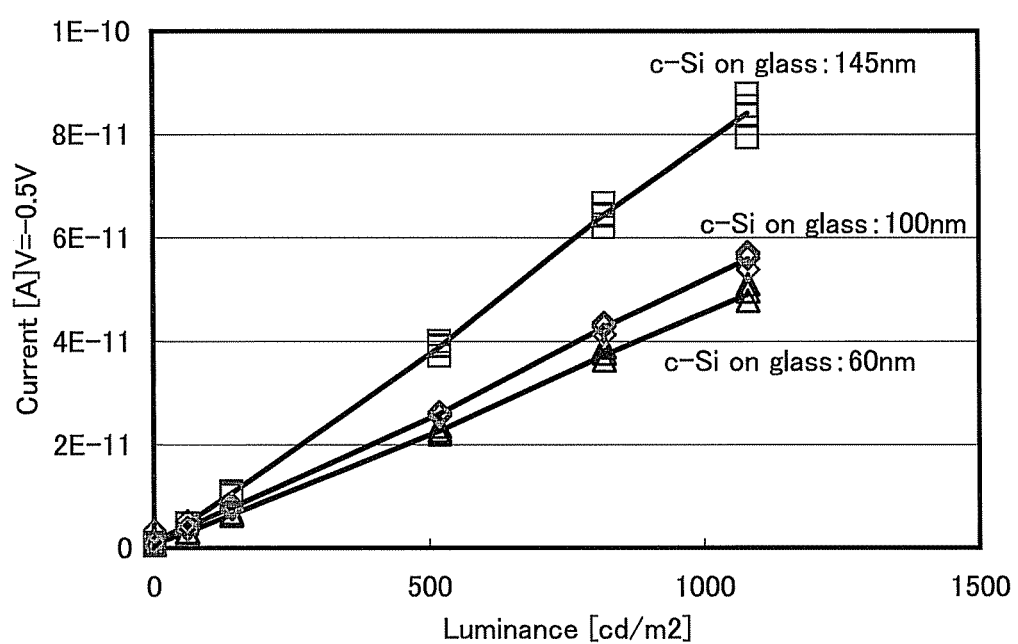
FIG. 22 is a graph showing luminance-current characteristics of a photoelectric conversion element.

Next, an example of the characteristics (luminance-current characteristics) of the photoelectric conversion element obtained in accordance with the above method will be described (see FIG. 22). In FIG. 22, the vertical axis represents current (A) and the horizontal axis represents luminance ($cd/m^2$) of light with which the element is irradiated.

Here, three kinds of photoelectric conversion elements including semiconductor layers having different film thicknesses, which are manufactured in accordance with the method described in this embodiment (in particular, the photoelectric conversion elements in which a glass substrate is used as a base substrate: c-Si on glass) are investigation objects. The thicknesses of the semiconductor layers are different from each other: 60 nm (c-Si on glass), 100 nm (c-Si on glass), and 145 nm (c-Si on glass). The conditions other than the thickness are the same. Further, measurement is performed while a reverse bias voltage of 0.5 V is applied.

From FIG. 22, in the case where the respective photoelectric conversion elements formed in accordance with the method described in this embodiment are irradiated with light having the same intensity, it is found that as the thickness of the semiconductor layer is larger, current flowing in the photoelectric conversion element is increased. It is found that current flowing in the photoelectric conversion element with a semiconductor layer with a thickness of 145 nm (c-Si on glass) is approximately 1.7 times larger than that flowing in the photoelectric conversion element having a semiconductor layer with a thickness of 60 nm (c-Si on glass).

In this manner, when a photoelectric conversion element is formed using a single crystal semiconductor layer which has a large thickness and is formed over a light-transmitting base substrate, photoelectric conversion efficiency and element characteristics can be improved. Accordingly, sensitivity as an optical sensor can be improved. In addition, an optical sensor can be miniaturized.

In this embodiment, the photoelectric conversion element 180 and the transistor 380 are formed over the light-transmitting base substrate 100, using the common steps. Accordingly, the number of masks can be reduced and thus throughput can be improved.

The photoelectric conversion element 180 and the transistor 380 described in this embodiment can be used for a display device in which pixels each having an optical sensor are arranged in matrix, for example. The display device includes a pixel having an optical sensor and a display element. For example, the transistor 380 can be used as a pixel transistor which is electrically connected to a pixel electrode included in the display element and controls driving of the display element, and the photoelectric conversion element 180 can be used as the optical sensor.

In this embodiment, when the photoelectric conversion element 180 and the transistor 380 are manufactured, an SOI substrate in which the insulating layer 112 and the single crystal semiconductor layer 118 are provided over the base substrate 100 in accordance with the manufacturing steps of an SOI substrate described in Embodiment 1 is used. By performing a step of partly thinning the single crystal semiconductor layer provided in accordance with the manufacturing steps of an SOI substrate, the photoelectric conversion element can be formed while making the most of the thickness of the single crystal semiconductor layer provided in accordance with the manufacturing steps of an SOI substrate. Further, the transistor can be formed using the part of the single crystal semiconductor layer whose thickness is reduced. Accordingly, the single crystal semiconductor layer provided in accordance with the manufacturing steps of an SOI substrate is effectively utilized, so that leakage current of the transistor in an off state can be reduced and the photoelectric conversion efficiency of the photoelectric conversion element can be improved. In the case where the transistor is used as a pixel transistor, leakage current of the pixel transistor in an off state is reduced and thus pixel capacity can be made smaller. As a result, an aperture ratio of a pixel can be improved.

Note that the structure described in this embodiment can be implemented by being combined as appropriate with any other structure described in the other embodiments.

Embodiment 6

In this embodiment, another manufacturing method of a semiconductor device provided with a photoelectric conversion element and a transistor is described. In the manufacturing method, the thickness of a single crystal semiconductor layer is partly changed (increased or reduced). First, an SOI substrate in which an insulating layer 112 and a single crystal semiconductor layer 118 are provided over a base substrate 100 in accordance with manufacturing steps of an SOI substrate is prepared.

Here, a step of thinning the whole single crystal semiconductor layer 118 may be performed. In order to thin the single crystal semiconductor layer 118, one of dry etching and wet etching or a combination of the etchings may be employed. By thinning the single crystal semiconductor layer 118, the single crystal semiconductor layer 118 can have a thickness suitable for the transistor. For example, the thickness of the single crystal semiconductor layer 118 can be 5 nm to 100 nm inclusive.

Figure 24A:
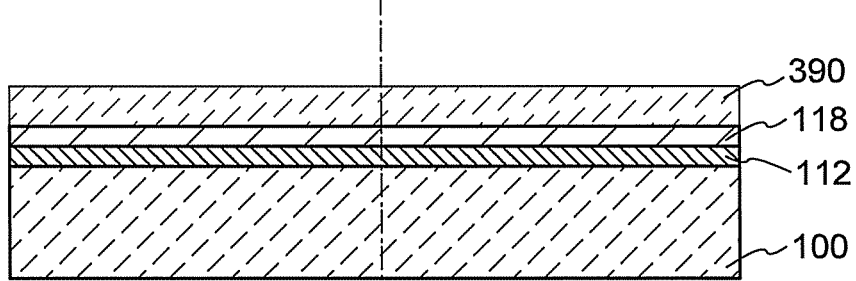
FIGS. 24A to 24C are cross-sectional views illustrating an example of a method for manufacturing a semiconductor device.

Next, an amorphous semiconductor layer 390 is formed over the single crystal semiconductor layer 118 (see FIG. 24A). Note that, before the amorphous semiconductor layer 390 is formed, an oxide layer such as a native oxide layer formed on a surface of the single crystal semiconductor layer 118 is removed. This is because, if the oxide layer is formed, the oxide layer is located between the single crystal semiconductor layer 118 and the amorphous semiconductor layer 390 to interrupt solid phase growth in heat treatment which is performed later. The oxide layer can be removed using a solution including fluorinated acid. In particular, the process may be performed using fluorinated acid until the surface of the single crystal semiconductor layer 118 exhibits a water repellent property. The removal of the oxide layer from the surface of the single crystal semiconductor layer 118 can be confirmed by the water repellent property. Moreover, before the amorphous semiconductor layer 390 is formed, the oxide layer on the surface of the single crystal semiconductor layer 118 may be removed by etching the surface using a mixed gas of $NF_3$ and $N_2$, a mixed gas of $NF_3$ and $O_2$, or the like.

The amorphous semiconductor layer 390 may be formed using a semiconductor material that forms the single crystal semiconductor layer 118, and for example, an amorphous silicon layer, an amorphous germanium layer, or the like is formed by a plasma CVD method. The total thickness of the single crystal semiconductor layer 118 and the amorphous silicon layer 390 is 145 nm or more, preferably, 200 nm or more. When cycle time and productivity such as film formation time and a film formation cost are considered, it is preferable that the total thickness be 200 nm to 1000 nm inclusive.

Figure 24B:
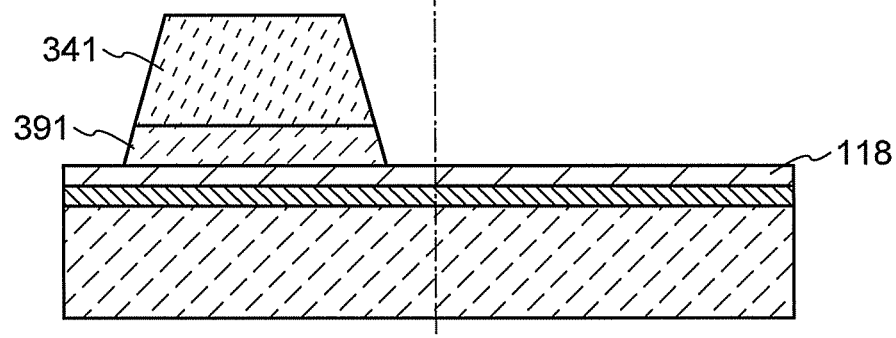

Next, a mask 341 is formed over the amorphous semiconductor layer 390. The amorphous semiconductor layer 390 is patterned using the mask 341 to form an island-shaped amorphous semiconductor layer 391 (see FIG. 24B). The mask 341 can be formed by photolithography with the use of a resist material or the like. Further, as the etching treatment, either wet etching or dry etching can be employed. Note that the step of thinning the single crystal semiconductor layer 118 can be performed after patterning of the amorphous semiconductor layer 390, using the mask 341 which is used for the patterning of the amorphous semiconductor layer 390.

Further, in the step of patterning the amorphous semiconductor layer 390, all the part of the amorphous semiconductor layer which is not covered with the mask 341 is not necessarily removed. In this case, a first amorphous semiconductor layer covered with the mask 341 and a second single crystal semiconductor layer having a smaller thickness than the first amorphous semiconductor layer are formed.

Figure 24C:
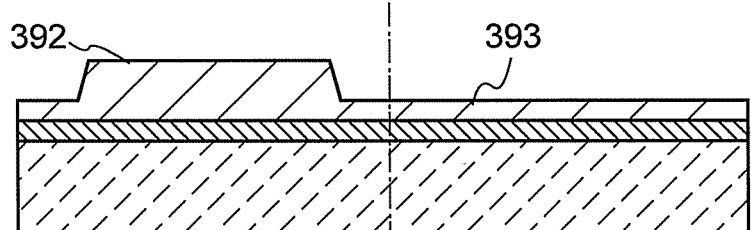

Then, the island-shaped amorphous semiconductor layer 391 is subjected to heat treatment to perform solid phase growth of the island-shaped amorphous semiconductor layer 391, whereby a first single crystal semiconductor region 392 is formed in a region where the amorphous semiconductor layer 391 is formed and a second single crystal semiconductor region 393 having a smaller thickness than the first single crystal semiconductor region 392 is formed (see FIG. 24C).

By this heat treatment, solid phase growth of the amorphous semiconductor layer 391 is performed, so that single crystallization of the amorphous semiconductor layer 391 is achieved. In the solid phase growth of the amorphous semiconductor layer 391, the single crystal semiconductor layer 118 functions as a seed crystal, and the single crystallization of the amorphous semiconductor layer 391, which is provided over the single crystal semiconductor layer 118, can be performed.

The heat treatment for the solid phase growth can be performed using a heat treatment apparatus such as a rapid thermal anneal (RTA), a furnace, a millimeter wave heating device, or the like. In addition, the heat treatment can be performed by laser beam irradiation or thermal plasma jet irradiation. As a heating method of the heat treatment apparatus, a resistance heating method, a lamp heating method, a gas heating method, a radio wave heating method, and the like can be given. Note that RTA is a kind of a rapid thermal processing (RTP) apparatus.

In general, a furnace is an external heating method, and the inside of a chamber and a product are heated in a thermal equilibrium state. On the other hand, an RTA is used for instantaneous heating (flash heating) and directly gives energy to the product to heat the chamber and the product in a thermal nonequilibrium state. As an RTA apparatus, a lamp rapid thermal anneal (LRTA) apparatus employing a lamp heating method, a gas rapid thermal anneal (GRTA) apparatus employing a gas heating method using a heated gas, an RTA apparatus employing both a lamp heating method and a gas heating method, and the like can be given. An LRTA apparatus is an apparatus that heats the product by radiation of light emitted from a lamp such as a halogen lamp, a metal halide lamp, a xenon arc lamp, a carbon arc lamp, a high pressure sodium lamp, a high pressure mercury lamp, or the like. A GRTA apparatus is an apparatus that heats a gas by heat radiation due to light emitted from the above-described lamp and light emitted from the lamp to heat the product by heat conduction from the heated gas. For the gas, an inert gas which does not react to the product by heat treatment, like a noble gas such as nitrogen, argon, or the like is used. In addition, the LRTA apparatus and the GRTA apparatus may be provided with a device that heats the product by heat conduction or heat radiation from not only a lamp but also a heater such as a resistance heater. The millimeter wave heating device is a device that heats the product by radiation of millimeter wave. The millimeter wave heating device may be provided with a device that heats the product by thermal conduction or heat radiation from a heater such as a resistance heater or the like.

When the RTA apparatus is used, it is preferable that the process temperature be 500° C. to 750° C. inclusive and the process time be 0.5 minutes to 3 minutes inclusive. When a furnace is used, it is preferable that the process temperature be 500° C. to 600° C. inclusive and the process time be 1 hour to 4 hours inclusive.

For example, a single crystal silicon layer is applied as the single crystal semiconductor layer 118, and an amorphous silicon layer is formed as the amorphous semiconductor layer 390. The RTA apparatus is used and heat treatment is performed under conditions that the process temperature is 750° C. and the process time is 3 minutes, whereby solid phase growth of the amorphous silicon layer is performed and a single crystal silicon layer can be obtained.

In this manner, the amorphous semiconductor layer is formed over part of the single crystal semiconductor layer, and the solid phase growth of the amorphous semiconductor layer is performed, whereby the single crystal semiconductor layer can be partly thickened. A photoelectric conversion element can be formed using the thickened single crystal semiconductor region 392, and a transistor can be formed using the single crystal semiconductor region 393 having a smaller thickness than the single crystal semiconductor region 392. The subsequent manufacturing steps of the photoelectric conversion element and the transistor can be performed in a manner similar to those described in the other embodiments. In such a case where the single crystal semiconductor layer is used for a photoelectric conversion layer, the photoelectric conversion efficiency can be improved by the increase in the film thickness.

In this embodiment, when a photoelectric conversion element and a transistor are manufactured, an SOI substrate in which the insulating layer 112 and the single crystal semiconductor layer 118 are provided over the base substrate 100 in accordance with the manufacturing steps of an SOI substrate described in Embodiment 1 is used. By performing the step of partly thickening the single crystal semiconductor layer provided in accordance with the manufacturing steps of an SOI substrate, the range of choice for the thickness of the photoelectric conversion element expands and sensitivity as an optical sensor can be improved in the semiconductor device including the photoelectric conversion element and the transistor. In addition, an optical sensor can be miniaturized and a function of scanning is improved. Further, response of an optical sensor is improved, and for example, in the case where the optical sensor is used for a touch panel, response speed of the touch panel is improved and thus operability thereof is improved. The single crystal semiconductor layer included in the transistor can be formed having a thickness suitable for the transistor. Accordingly, the single crystal semiconductor layer provided in accordance with the manufacturing steps of an SOI substrate is effectively utilized, so that leakage current of the transistor in an off state can be reduced and the photoelectric conversion efficiency of the photoelectric conversion element can be improved. In the case where the transistor is used as a pixel transistor, leakage current of the pixel transistor in an off state is reduced and thus pixel capacity can be made smaller. As a result, an aperture ratio of a pixel can be improved.

Note that the structure described in this embodiment can be implemented by being combined as appropriate with any other structure described in the other embodiments.

Embodiment 7

In this embodiment, an example of a semiconductor device and a manufacturing method thereof will be described with reference to drawings. In particular, a semiconductor device provided with a photoelectric conversion element and transistors and a manufacturing method thereof, in which an n-channel transistor and a p-channel transistor are manufactured as the transistors.

[Structure]

Figure 25A:
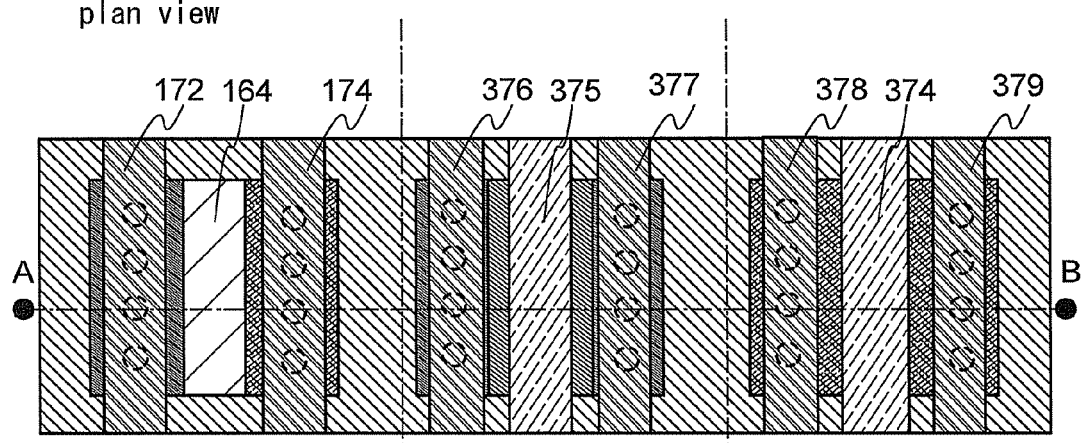
FIG. 25A is a plan view and FIG. 25B is a cross-sectional view illustrating an example of a semiconductor device.
Figure 25B:
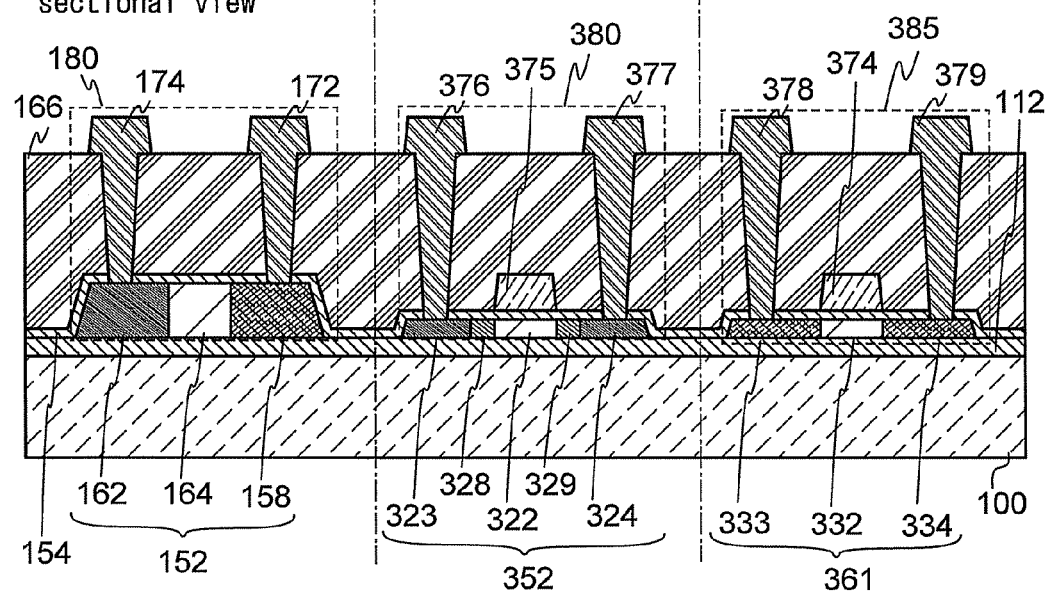

A photoelectric conversion element 180, an n-channel transistor 380, and a p-channel transistor 385 which relate to an embodiment of the disclosed invention are provided over a light-transmitting base substrate 100 (see FIGS. 25A and 25B). Here, FIG. 25B corresponds to a cross section taken along line A-B of FIG. 25A.

The photoelectric conversion element 180 includes a first island-shaped single crystal semiconductor layer 152 including a semiconductor region 164 having an effect of photoelectric conversion, a semiconductor region 158 having a first conductivity type (p-type conductivity, here), and a semiconductor region 162 having a second conductivity type (n-type conductivity, here); an insulating layer 154 and an insulating layer 166 which are formed so as to cover the first island-shaped single crystal semiconductor layer 152; a first electrode 172 electrically connected to the semiconductor region 158 having the first conductivity type; and a second electrode 174 electrically connected to the semiconductor region 162 having the second conductivity type.

The n-channel transistor 380 includes a second island-shaped single crystal semiconductor layer 352 including a channel formation region 322, a source region 323, a drain region 324, an LDD region 328, and an LDD region 329; the insulating layer 154 functioning as a gate insulating film over the second single crystal semiconductor layer 352; a gate electrode 375 over the insulating layer 154; the insulating layer 166 covering the gate electrode 375; an electrode 376 electrically connected to the source region 323; and an electrode 377 electrically connected to the drain region 324. Note that the n-channel transistor 380 including the LDD region 328, and the LDD region 329 in this embodiment is described as an example in this embodiment; however, an embodiment of the disclosed invention is not limited thereto. The LDD regions are not necessarily provided. In addition, although an example in which the LDD regions do not overlap with the gate electrode when seen from the above is described in this embodiment, a structure in which the LDD regions overlap with the gate electrode may be employed alternatively The p-channel transistor 385 includes an island-shaped third single crystal semiconductor layer 361 including a channel formation region 332, a source region 333, and a drain region 334; the insulating layer 154 functioning as a gate insulating film over the third single crystal semiconductor layer 361; a gate electrode 374 over the insulating layer 154; the insulating layer 166 covering the gate electrode 374; an electrode 378 electrically connected to the source region 333; and an electrode 379 electrically connected to the drain region 334. Note that the p-channel transistor 385 does not include an LDD region in this embodiment; however, an embodiment of the disclosed invention is not limited thereto. An LDD region may be provided.

Here, the thickness of the first single crystal semiconductor layer 152 included in the photoelectric conversion element 180 is larger than the thickness of the second single crystal semiconductor layer 352 included in the n-channel transistor 380 and the thickness of the third single crystal semiconductor layer 361 included in the p-channel transistor 385.

An insulating layer 112 is provided between the base substrate 100 and the photoelectric conversion element 180, the transistor 380, and the transistor 385. The insulating layer has a function of fixing the photoelectric conversion element 180, the transistor 380, and the transistor 385 to the base substrate 100.

[Manufacturing Steps of the Photoelectric Conversion Element and the Transistors]

Figure 26A:
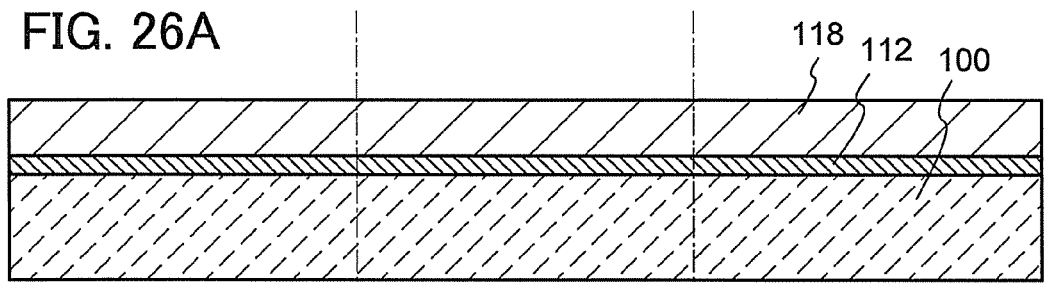
FIGS. 26A to 26D are cross-sectional views illustrating an example of a method for manufacturing a semiconductor device.

Next, the manufacturing steps of the photoelectric conversion element 180, the n-channel transistor 380, and the p-channel transistor 385 will be described. First, an SOI substrate in which the insulating layer 112 and a single crystal semiconductor layer 118 are provided over the base substrate 100 in accordance with the manufacturing steps of an SOI substrate described in Embodiment 1 is prepared (see FIG. 26A).

Figure 26B:
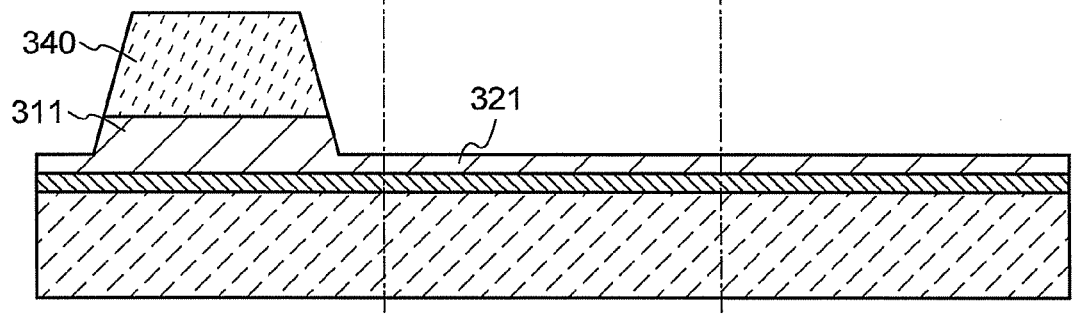

Then, a mask 340 is formed over the single crystal semiconductor layer 118. By etching with the use of the mask 340, the thickness of the single crystal semiconductor layer is partly reduced, so that a first single crystal semiconductor region 311 covered with the mask 340 and a second single crystal semiconductor region 321 having a smaller thickness than the first single crystal semiconductor region 311 are formed (see FIG. 26B).

Figure 26C:
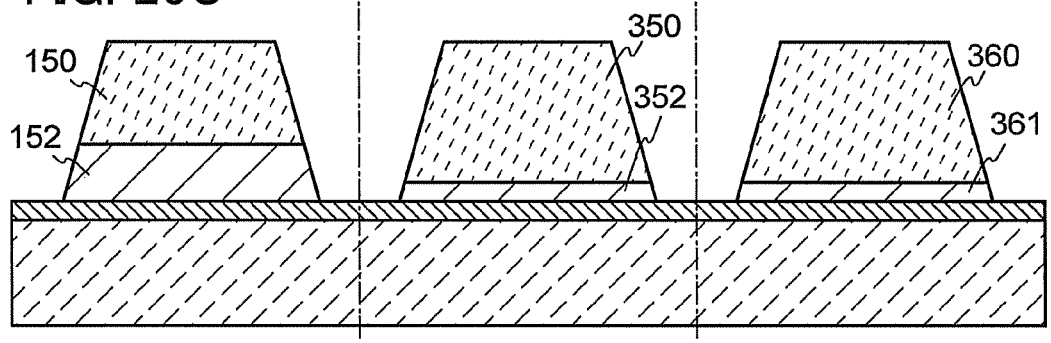

After that, a mask 150, a mask 350, and a mask 360 are formed over the first single crystal semiconductor region 311 and the second single crystal semiconductor region 321, and the first single crystal semiconductor region 311 and second single crystal semiconductor region 321 are patterned using the mask 150, the mask 350, and the mask 360. In this manner, the first island-shaped semiconductor layer 152 used for the photoelectric conversion element, the second island-shaped semiconductor layer 352 used for the n-channel transistor, and the island-shaped third single crystal semiconductor layer 361 used for the p-channel transistor are formed (see FIG. 26C).

Figure 26D:
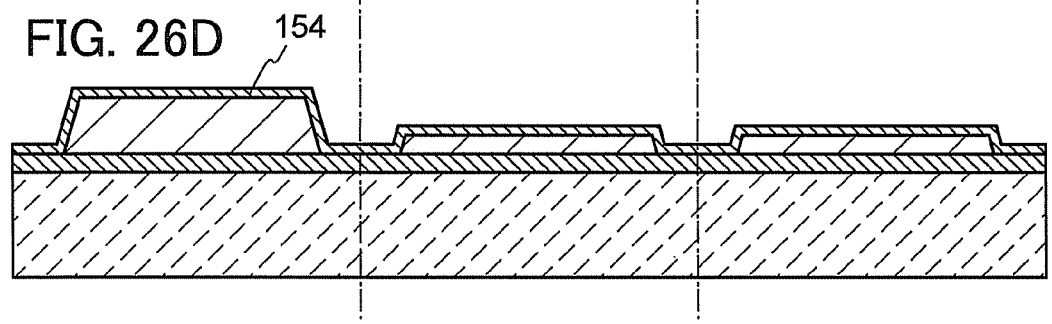

Next, the insulating layer 154 is formed so as to cover the semiconductor layer 152, the semiconductor layer 352, and the semiconductor layer 361 (see FIG. 26D).

Figure 27A:
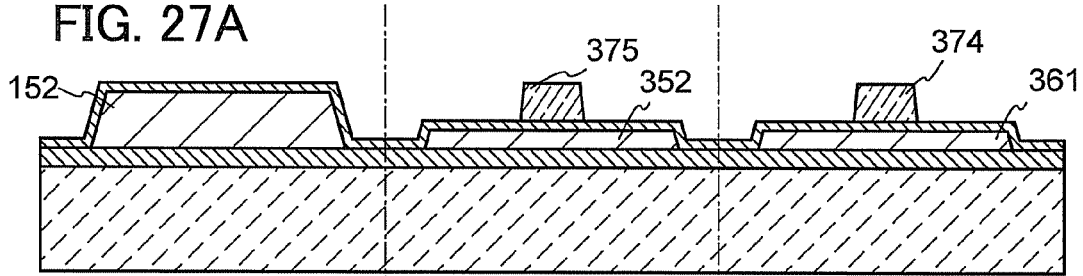
FIGS. 27A to 27D are cross-sectional views illustrating an example of a method for manufacturing a semiconductor device.

Then, a conductive film is formed over the insulating layer 154 and processed (patterned) to a predetermined shape, so that the electrode 375 and the electrode 374 which function as gate electrodes of the transistors are formed over the semiconductor layer 352 and the semiconductor layer 361, respectively (see FIG. 27A). Note that an electrode may be formed over the semiconductor layer 152 at the same time as formation of the electrode 375 and the electrode 374, which function as the gate electrodes of the transistors, over the semiconductor layer 352 and the semiconductor layer 361.

Then, a mask 356 is conned over the insulating layer 154 to cover the semiconductor layer 152 and the semiconductor layer 361, and an impurity element imparting the second conductivity type is added to part of the semiconductor layer 352 using the mask 356 and the electrode 375 as masks. The mask 356 may be formed in a manner similar to that of the mask 340 or the like.

Specifically, as the addition of the impurity element, for example, phosphorus may be added using $PH_3$ as a source gas at an accelerating voltage of 40 kV with a dosage of $1.0 \times 10^{13}$ $cm^{-2}$. The conditions of the addition of the impurity element can be changed as appropriate depending on required characteristics. After formation for an impurity region 358, the mask 356 is removed.

Figure 27B:
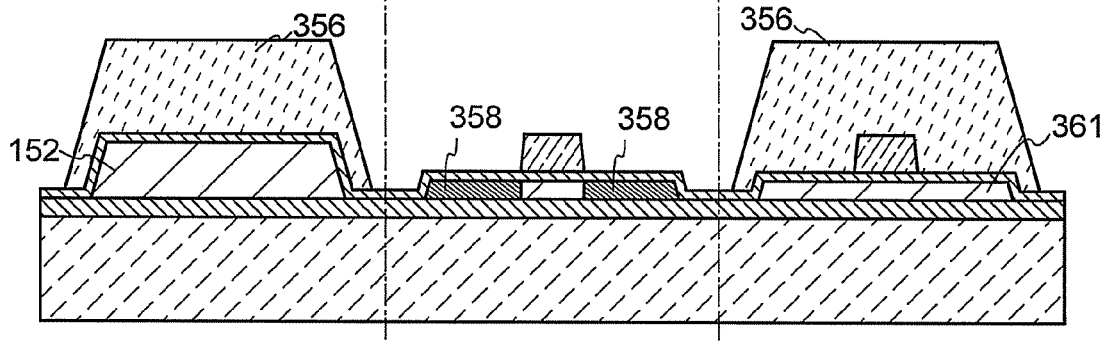

Thus, the impurity region 358 having the second conductivity type is formed (see FIG. 27B). Part of the impurity region 358 functions as LDD regions. In this embodiment, phosphorus is used as the impurity element imparting the second conductivity type and the second conductivity type is n-type; however, this embodiment of the disclosed invention is not limited thereto.

Figure 27C:
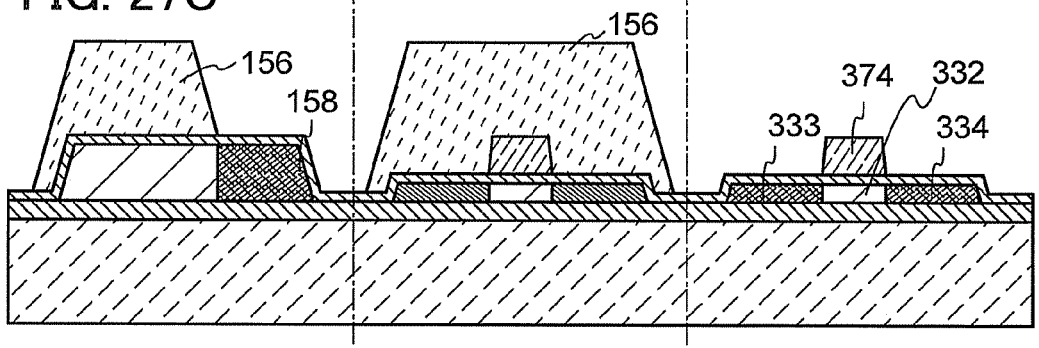

Next, a mask 156 is formed over the insulating layer 154 so as to cover the semiconductor layer 352 and partly cover the semiconductor layer 152. Then, an impurity element imparting the first conductivity type is added to part of the semiconductor layer 152 and part of the semiconductor layer 361 with the use of the mask 156 and the electrode 374 as masks. Thus, the semiconductor region 158 having the first conductivity type is formed. In addition, the source region 333 and the drain region 334 which have the first conductivity type are formed in the semiconductor layer 361 used for the p-channel transistor, and a channel formation region 332 is formed between the source region 333 and the drain region 334 (see FIG. 27C). In this embodiment, boron is added as the impurity element imparting the first conductivity type and thus the first conductivity is p-type; however, an embodiment of the disclosed invention is not limited thereto.

Specifically, for example, boron may be added using $B_2H_6$ as a source gas at an accelerating voltage of 40 kV with a dosage of approximately $1.0 \times 10^{16}$ $cm^{-2}$. The conditions of the addition of the impurity element can be changed as appropriate depending on required characteristics. Dart current tends to be reduced when a dosage is reduced in a photoelectric conversion element. This is because damage is small when an impurity element is added with a low-dosage condition, so that current due to defects is not generated while damage to the semiconductor layer 152 is large when an impurity element is added with a high dosage so that a carrier trap due to defects is generated. On the other hands, it is preferable that a dosage be large and resistance be reduced in the transistor. Therefore, the impurity addition step of the photoelectric conversion and that of the transistor may be performed separately depending on characteristics required. Note that the mask 156 is removed after formation of the semiconductor region 158 having the first conductivity type, the source region 333, and the drain region 334.

Figure 27D:
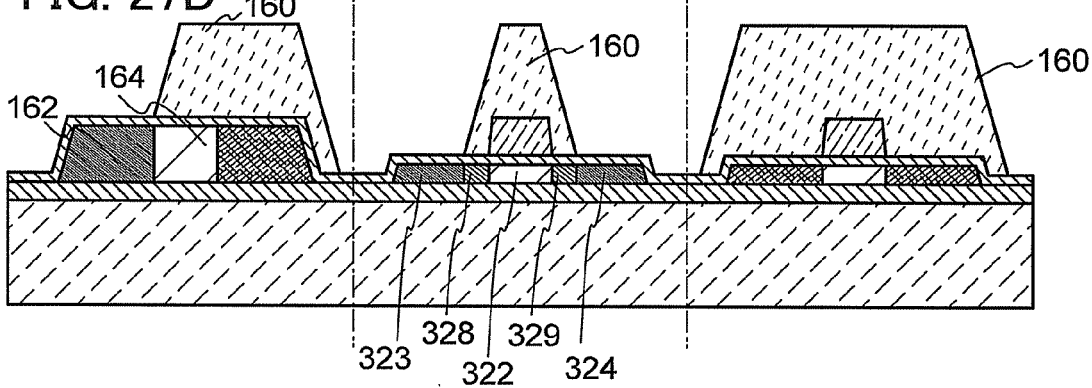

After that, a mask 160 is formed over the insulating layer 154 to partly cover the semiconductor layer 152 and the semiconductor layer 352, and cover the semiconductor layer 361, and then an impurity element imparting the second conductivity type is added to part of the semiconductor layer 152 and part of the semiconductor layer 352. Note that the impurity element imparting the same conductivity type as the impurity element which is added in the previous step is added to the semiconductor layer 352 at a higher concentration. Thus, the semiconductor region 162 having the second conductivity type and the semiconductor region 164 having an effect of photoelectric conversion, to which an impurity element having the first conductivity type and an impurity element having the second conductivity type are not added, are formed in the semiconductor layer 152 used for the photoelectric conversion element. In addition, the source region 323 and the drain region 324 which have the second conductivity type are formed in the semiconductor layer 352 used for the n-channel transistor, the LDD region 328 and the LDD region 329 are formed in the impurity region 358 which is covered with the mask 160, and the channel formation region 322 is formed between the LDD region 328 and the LDD region 329 (see FIG. 27D).

Specifically, for example, phosphorus may be added using $PH_3$ as a source gas at an accelerating voltage of 40 kV with a dosage of $5.0 \times 10^{15}$ $cm^{-2}$. The conditions of the addition of the impurity element can be changed as appropriate depending on required characteristics. In a manner similar to the case of addition of the impurity element imparting the first conductivity type, dark current in the photoelectric conversion element can be suppressed when the dosage is reduced. The mask 160 is removed after formation of the semiconductor region 162 having the second conductivity type.

Note that the addition of the impurity element imparting the first conductivity type and the impurity element imparting the second conductivity type are performed so that the width of the semiconductor region 164 having an effect of photoelectric conversion is 0.1 μm to 20 μm, preferably 3 μm to 10 μm. Needless to say, if processing accuracy of the mask 156 and the mask 160 permits, the width of the semiconductor region 164 can be 0.1 μm or smaller.

Figure 28A:
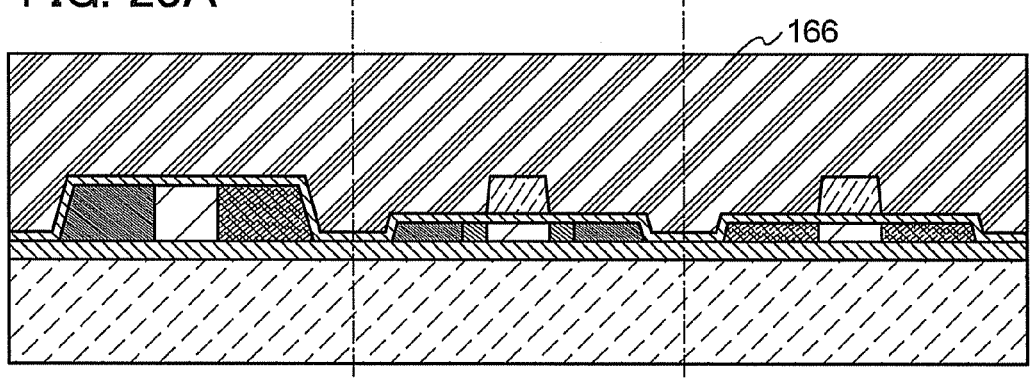
FIGS. 28A to 28C are cross-sectional views illustrating an example of a method for manufacturing a semiconductor device.

Then, the insulating layer 166 is formed so as to cover the semiconductor layer 152, the semiconductor layer 352, the semiconductor layer 361, the electrode 375, the electrode 374, and the insulating layer 154 (see FIG. 28A).

Figure 28B:
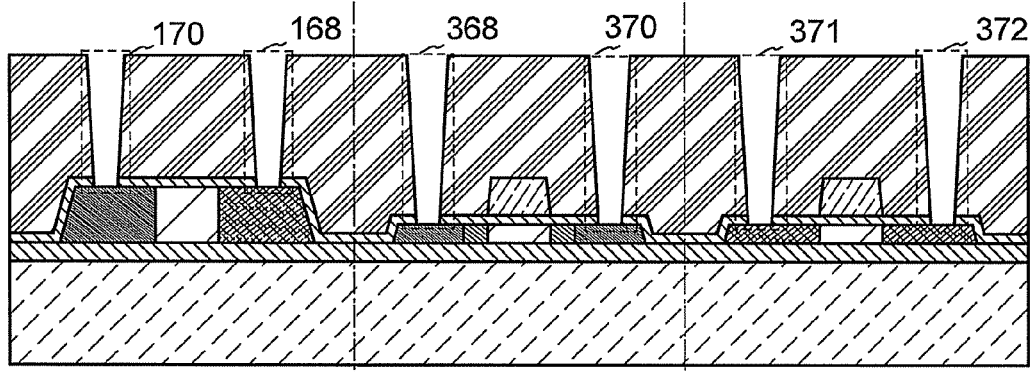

Next, a contact hole 168, a contact hole 170, a contact hole 368, a contact hole 370, a contact hole 371, and a contact hole 372 are formed in the insulating layer 154 and the insulating layer 166 so that the semiconductor layer 152, the semiconductor layer 352, and the semiconductor layer 361 are partly exposed (see FIG. 28B).

Figure 28C:
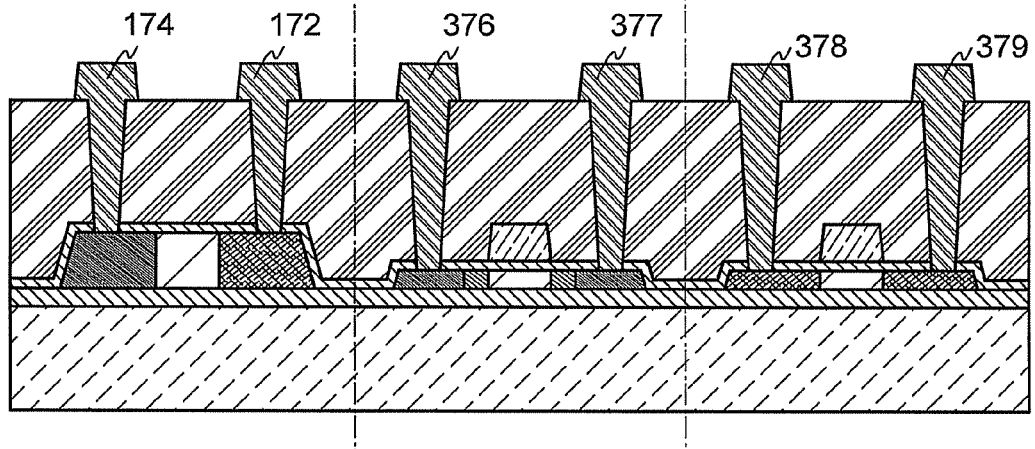

Then, a conductive layer which is in contact with the semiconductor layer 152, the semiconductor layer 352, and the semiconductor layer 361 through the contact holes is formed. The conductive layer is patterned so that the first electrode 172, the second electrode 174, the electrode 376, the electrode 377, the electrode 378, and the electrode 379 are formed (see FIG. 28C).

In this embodiment, the photoelectric conversion element 180, the n-channel transistor 380, and the p-channel transistor 385 are formed over the light-transmitting base substrate 100, using the common steps. Accordingly, the number of masks can be reduced and throughput can be improved as compared to the case where a photoelectric conversion element and transistors are formed separately.

The photoelectric conversion element 180, the n-channel transistor 380, and the p-channel transistor 385 described in this embodiment can be used for a display device in which pixels each having an optical sensor are arranged in matrix, for example. For example, the n-channel transistor 380 and the p-channel transistor 385 can be used for a peripheral driver circuit and a pixel transistor which control driving of the display element, and the photoelectric conversion element 180 can be used as the optical sensor.

In this embodiment, when the photoelectric conversion element 180, the n-channel transistor 380, and the p-channel transistor 385 are manufactured, an SOI substrate in which the insulating layer 112 and the single crystal semiconductor layer 118 are provided over the base substrate 100 in accordance with the manufacturing steps of an SOI substrate described in Embodiment 1 is used. By performing a step of partly thinning the single crystal semiconductor layer provided in accordance with the manufacturing steps of an SOI substrate, the photoelectric conversion element can be formed while making the most of the thickness of the single crystal semiconductor layer provided in accordance with the manufacturing steps of an SOI substrate. Further, the transistor can be formed using the part of the single crystal semiconductor layer whose thickness is reduced. Accordingly, the single crystal semiconductor layer provided in accordance with the manufacturing steps of an SOI substrate is effectively utilized, so that leakage current of the transistor in an off state can be reduced and the photoelectric conversion efficiency of the photoelectric conversion element can be improved. In the case where the transistor is used as a pixel transistor, leakage current of the pixel transistor in an off state is reduced and thus pixel capacity can be made smaller. As a result, an aperture ratio of a pixel can be improved.

Note that the structure described in this embodiment can be implemented by being combined as appropriate with any other structure described in the other embodiments.

This application is based on Japanese Patent Application serial no. 2009-194223 filed with Japan Patent Office on Aug. 25, 2009, the entire contents of which are hereby incorporated by reference.

EXPLANATION OF REFERENCE

100: substrate; 110: single crystal semiconductor substrate; 112: insulating layer; 114: embrittled region; 116: single crystal semiconductor layer; 118: single crystal semiconductor layer; 130: laser light; 150: mask; 152: semiconductor layer; 154: insulating layer; 156: mask; 158: semiconductor region; 160: mask; 162: semiconductor region; 164: semiconductor region; 166: insulating layer; 168: contact hole; 170: contact hole; 172: electrode; 174: electrode; 180: photoelectric conversion element; 190: transistor; 200: substrate; 202: insulating layer; 204: light-blocking layer; 206: insulating layer; 208: light-blocking layer; 210: pixel display region; 212: insulating layer; 214: insulating layer; 216: insulating layer; 240: light-blocking layer; 250: mask; 252: mask; 311: single crystal semiconductor region; 321: single crystal semiconductor region; 322: channel formation region; 323: source region; 324: drain region; 328: LDD region; 329: LDD region; 332: channel formation region; 333: source region; 334: drain region; 340: mask; 341: mask; 345: electrode; 350: mask; 352: semiconductor layer; 356: mask; 358: embrittled region; 360: mask; 361: semiconductor layer; 368: contact hole; 370: contact hole; 371: contact hole; 372: contact hole; 374: electrode; 375: electrode; 376: electrode; 377: electrode; 378: electrode; 379: electrode; 380: transistor; 385: transistor; 390: amorphous semiconductor layer; 391: amorphous semiconductor layer; 392: single crystal semiconductor region; 393: single crystal semiconductor region; 500: insulating layer; 502: color filter; 504: light source; 506: object; 508: light; and 510: reflection light.

The invention claimed is:

1. A method for manufacturing a semiconductor device including a photoelectric conversion element, comprising the steps of:
    irradiating a single crystal semiconductor substrate with an ion to form an embrittled region in the single crystal semiconductor substrate;
    bonding together the single crystal semiconductor substrate and a light-transmitting substrate with an insulating layer therebetween;
    separating the single crystal semiconductor substrate at the embrittled region to form a single crystal semiconductor layer over the light-transmitting substrate;
    processing the single crystal semiconductor layer to form an island-shaped single crystal semiconductor layer;
    selectively adding a first impurity element and a second impurity element to the island-shaped single crystal semiconductor layer to form a semiconductor region having an effect of photoelectric conversion, a semiconductor region having p-type conductivity, and a semiconductor region having n-type conductivity;
    forming a first electrode electrically connected to the semiconductor region having the p-type conductivity; and
    forming a second electrode electrically connected to the semiconductor region having the n-type conductivity.

2. The method for manufacturing a semiconductor device according to claim 1, wherein the insulating layer is a silicon oxide film including organosilane.

3. A method for manufacturing a semiconductor device including a photoelectric conversion element, comprising the steps of:
- irradiating a single crystal semiconductor substrate with an ion to form an embrittled region in the single crystal semiconductor substrate;
- forming a first insulating layer over a light-transmitting substrate and forming a light-blocking layer over the first insulating layer;
- bonding together the single crystal semiconductor substrate and the light-transmitting substrate in which the light-blocking layer is formed with a second insulating layer therebetween;
- separating the single crystal semiconductor substrate at the embrittled region to form a single crystal semiconductor layer over the light-transmitting substrate;
- processing the single crystal semiconductor layer to form an island-shaped single crystal semiconductor layer;
- selectively adding a first impurity element and a second impurity element to the island-shaped single crystal semiconductor layer to form a semiconductor region having an effect of photoelectric conversion, a semiconductor region having p-type conductivity, and a semiconductor region having n-type conductivity;
- forming a first electrode electrically connected to the semiconductor region having the p-type conductivity; and
- forming a second electrode electrically connected to the semiconductor region having the n-type conductivity.

4. The method for manufacturing a semiconductor device according to claim 3, wherein the second insulating layer is a silicon oxide film including organosilane.

5. A method for manufacturing a semiconductor device including a photoelectric conversion element and a transistor, comprising the steps of:
- irradiating a single crystal semiconductor substrate with an ion to form an embrittled region in the single crystal semiconductor substrate;
- forming a first insulating layer over a light-transmitting substrate and forming a light-blocking layer over the first insulating layer;
- bonding together the single crystal semiconductor substrate and the light-transmitting substrate in which the light-blocking layer is formed with a second insulating layer therebetween;
- separating the single crystal semiconductor substrate at the embrittled region to form a single crystal semiconductor layer over the light-transmitting substrate;
- processing the single crystal semiconductor layer to form a first island-shaped single crystal semiconductor layer and a second island-shaped single crystal semiconductor layer;
- selectively adding a first impurity element and a second impurity element to the first island-shaped single crystal semiconductor layer to form a semiconductor region having an effect of photoelectric conversion, a semiconductor region having p-type conductivity, and a semiconductor region having n-type conductivity;
- forming a first electrode electrically connected to the semiconductor region having the p-type conductivity; and
- forming a second electrode electrically connected to the semiconductor region having the n-type conductivity, thereby forming the photoelectric conversion element;
- selectively adding the first impurity element or the second impurity element to the second island-shaped single crystal semiconductor layer to form a channel formation region, a source region, and a drain region;
- forming a gate insulating film over the second island-shaped single crystal semiconductor layer;
- forming a gate electrode over the gate insulating film; and
- forming a source electrode electrically connected to the source region and forming a drain electrode electrically connected to the drain region, thereby forming the transistor.

6. The method for manufacturing a semiconductor device according to claim 5, wherein the second insulating layer is a silicon oxide film including organosilane.

7. A method for manufacturing a semiconductor device including a photoelectric conversion element and a transistor, comprising the steps of:
- irradiating a single crystal semiconductor substrate with an ion to form an embrittled region in the single crystal semiconductor substrate;
- forming a first insulating layer over a light-transmitting substrate and forming a light-blocking layer over the first insulating layer;
- processing the light-blocking layer to form a plurality of island-shaped light-blocking layers including a first island-shaped light-blocking layer and a second island-shaped light-blocking layer;
- forming a second insulating layer having flatness to cover the plurality of island-shaped light-blocking layers;
- bonding together the single crystal semiconductor substrate and the light-transmitting substrate in which the second insulating layer is formed with a third insulating layer therebetween;
- separating the single crystal semiconductor substrate at the embrittled region to form an island-shaped single crystal semiconductor layer which overlap with the plurality of island-shaped light-blocking layers over the light-transmitting substrate;
- selectively adding a first impurity element and a second impurity element to the island-shaped single crystal semiconductor layer overlapping with the first island-shaped light-blocking layer to form a semiconductor region having an effect of photoelectric conversion, a semiconductor region having p-type conductivity, and a semiconductor region having n-type conductivity;
- forming a first electrode electrically connected to the semiconductor region having the p-type conductivity; and
- forming a second electrode electrically connected to the semiconductor region having the n-type conductivity, thereby forming the photoelectric conversion element;
- selectively adding the first impurity element or the second impurity element to the island-shaped single crystal semiconductor layer overlapping with the second island-shaped light-blocking layer to form a channel formation region, a source region, and a drain region;
- forming a gate insulating film over the island-shaped single crystal semiconductor layer overlapping with the second island-shaped light-blocking layer;
- forming a gate electrode over the gate insulating film; and
- forming a source electrode electrically connected to the source region and forming a drain electrode electrically connected to the drain region, thereby forming the transistor.

8. The method for manufacturing a semiconductor device according to claim 7, wherein the second insulating layer is a silicon oxide film including organosilane.

* * * * *